US012635210B2

(12) United States Patent
Lin

(10) Patent No.: US 12,635,210 B2
(45) Date of Patent: May 19, 2026

(54) ISOLATION REGIONS WITH NON-UNIFORM DEPTHS AND METHODS FORMING THE SAME

(71) Applicant: Taiwan Semiconductor Manufacturing Co., Ltd., Hsinchu (TW)

(72) Inventor: Tzu-Ging Lin, Kaohsiung City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 586 days.

(21) Appl. No.: 18/150,841

(22) Filed: Jan. 6, 2023

(65) Prior Publication Data

US 2023/0411493 A1 Dec. 21, 2023

Related U.S. Application Data

(60) Provisional application No. 63/375,336, filed on Sep. 12, 2022, provisional application No. 63/365,137, filed on May 23, 2022.

(51) Int. Cl.
*H10D 64/01* (2025.01)
*B82Y 10/00* (2011.01)
(Continued)

(52) U.S. Cl.
CPC ....... *H10D 64/017* (2025.01); *H10D 30/6735* (2025.01); *H10D 30/6757* (2025.01);
(Continued)

(58) Field of Classification Search
CPC ............. H10D 84/0151; H10D 64/017; H10D 62/115; H10D 30/0243; H10D 30/6735;
(Continued)

(56) References Cited

U.S. PATENT DOCUMENTS

2020/0044070 A1* 2/2020 Wang ..................... H10D 30/62
2020/0098878 A1 3/2020 Guler et al.
(Continued)

FOREIGN PATENT DOCUMENTS

TW 202137557 A 10/2021
TW 202201632 A 1/2022
(Continued)

OTHER PUBLICATIONS

Han, Jia, et al., "Three-dimensional measurements of plasma parameters in an inductively coupled plasma processing chamber," Physics of Plasmas, vol. 26, 103503, Oct. 3, 2019, 19 Pages.
(Continued)

*Primary Examiner* — Sonya McCall-Shepard
(74) *Attorney, Agent, or Firm* — Slater Matsil, LLP

(57) ABSTRACT

A method includes forming a plurality of semiconductor structures over a semiconductor substrate, forming a dummy gate stack on top surfaces and sidewalls of the plurality of semiconductor structures, forming gate spacers on sidewalls of the dummy gate stack, and etching a first portion of the dummy gate stack to form a through-gate trench in the dummy gate stack. The dummy gate stack includes a second portion and a third portion on opposing sides of the first portion. Through the through-gate trench, the plurality of semiconductor structures are etched to form a trench group underlying and connected to the through-gate trench. The trench group includes two outmost trenches, and at least one inner trench between the two outmost trenches. The two outmost trenches are deeper than the at least one inner trench.

20 Claims, 51 Drawing Sheets

(51) Int. Cl.

| | |
|---|---|
| *H10D 30/01* | (2025.01) |
| *H10D 30/43* | (2025.01) |
| *H10D 30/67* | (2025.01) |
| *H10D 30/69* | (2025.01) |
| *H10D 62/10* | (2025.01) |
| *H10D 62/822* | (2025.01) |
| *H10D 84/01* | (2026.01) |
| *H10D 84/03* | (2025.01) |
| *H10D 84/83* | (2025.01) |

(52) U.S. Cl.

CPC ....... *H10D 62/121* (2025.01); *H10D 84/0128* (2025.01); *H10D 84/0147* (2025.01); *H10D 84/0151* (2025.01); *H10D 84/038* (2025.01)

(58) Field of Classification Search

CPC .............. H10D 30/795; H10D 62/113; H10D 30/6215; H10D 30/62; H10D 30/024; H10D 84/0158; H10D 84/834; H10D 86/011; H01L 21/76243; H01L 21/76267

See application file for complete search history.

(56) References Cited

U.S. PATENT DOCUMENTS

| | | | |
|---|---|---|---|
| 2020/0168722 A1* | 5/2020 | Hung | .................. H10D 30/0243 |
| 2021/0134797 A1* | 5/2021 | Lin | ......................... H10D 30/62 |
| 2021/0305430 A1 | 9/2021 | Guler et al. | |
| 2022/0069135 A1 | 3/2022 | Chu et al. | |
| 2022/0130955 A1 | 4/2022 | Cheng et al. | |
| 2022/0367462 A1 | 11/2022 | Chiang et al. | |

FOREIGN PATENT DOCUMENTS

| | | |
|---|---|---|
| TW | 202211327 A | 3/2022 |
| TW | 202217977 A | 5/2022 |

OTHER PUBLICATIONS

Lee, Jae Koo, et al. "Simulation of Capacitively Coupled Single- and Dual-Frequency RF Discharges," IEEE Transactions on Plasma Science, vol. 32, No. 1, Feb. 2004, pp. 47-53.

* cited by examiner

ISOLATION REGIONS WITH NON-UNIFORM DEPTHS AND METHODS FORMING THE SAME

PRIORITY CLAIM AND CROSS-REFERENCE

This application claims the benefit of U.S. Provisional Application No. 63/375,336, filed on Sep. 13, 2022, and entitled "Isolation Regions with Non-Uniform Depths and Methods Forming the Same," and U.S. Provisional Application No. 63/365,137, filed on May 23, 2022, and entitled "Signature of CPODE Etch Depth Distribution Through Plasma Etch Processes," which applications are hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Gate-All-Around (GAA) transistors have been introduced to replace planar transistors. The structures of Gate-All-Around (GAA) transistors and methods of fabricating the GAA transistors are being developed.

The formation of GAA transistors typically includes forming long semiconductor stacks and long gate stacks, and then forming isolation regions to cut the long semiconductor stacks and long gate stacks into shorter portions, so that the shorter portions may act as the channels and the gate stacks of the resulting GAA transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-3, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 12A, 12B, 12C, 13A, 13B, 13C, 14A, 14B, 14C, 15A, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, and 23C illustrate various views of intermediate stages in the formation of a Gate All-Around (GAA) transistor in accordance with some embodiments.

DETAILED DESCRIPTION

Figure 2:
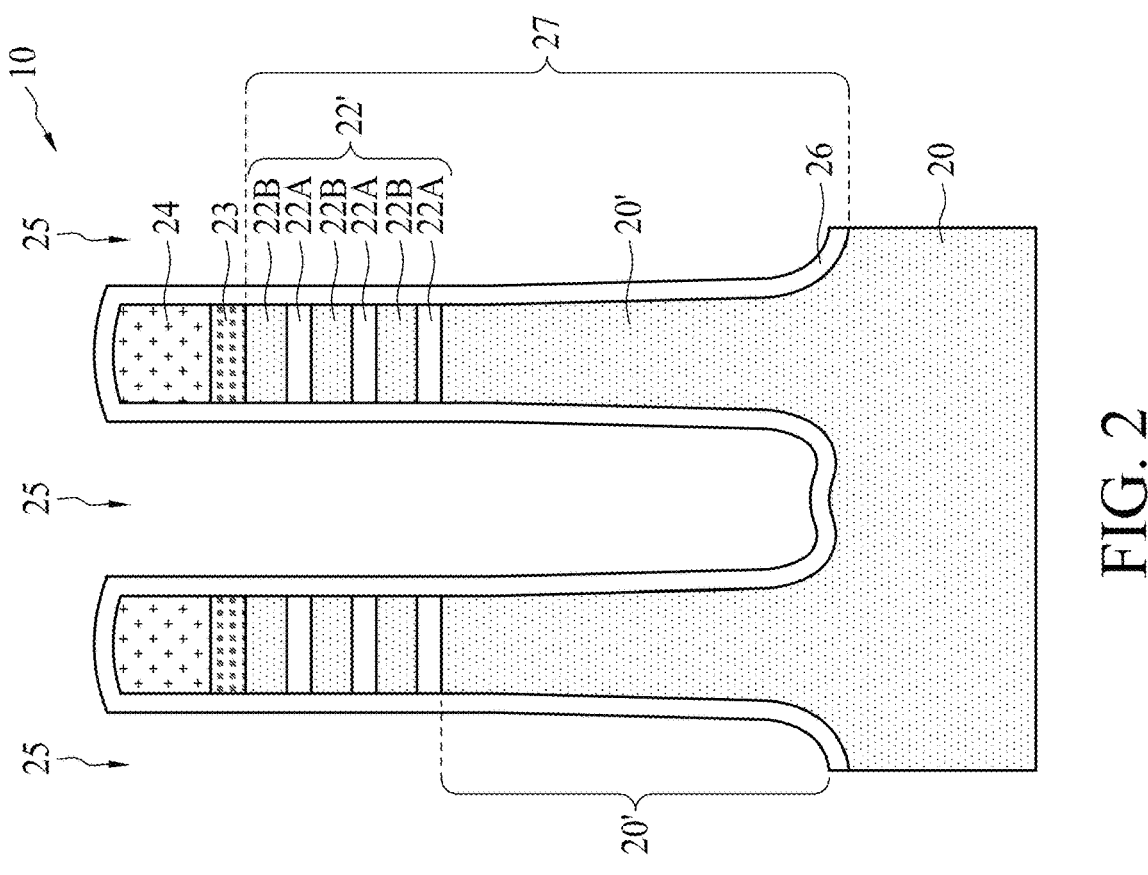

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming isolation regions for isolating transistors are provided. The profiles of the isolation structures are also provided. In accordance with some embodiments, a plurality of gate stacks are etched, and the semiconductor regions underlying the gate stacks are then etched to form a trench group including a plurality of trenches. An isolation region group including a plurality of isolation regions are then formed in the trenches. The outmost isolation regions in the isolation region group are formed deeper than inner isolation regions between the outmost isolation regions. Accordingly, the deeper isolation regions are better barriers for leakage currents. It is appreciated that although Gate-All-Around (GAA) transistors are used as an example to explain the concept of the present application, the embodiments may be applied to the formation of other transistors such as Fin Field-Effect Transistors (FinFETs). Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-3, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 12A, 12B, 12C, 13A, 13B, 13C, 14A, 14B, 14C, 15A, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, and 23C illustrate various views of intermediate stages in the formation of GAA transistors and an isolation region group in accordance with some embodiments of the present disclosure. The corresponding processes are also reflected schematically in the process flow shown in FIG. 29.

Figure 1:
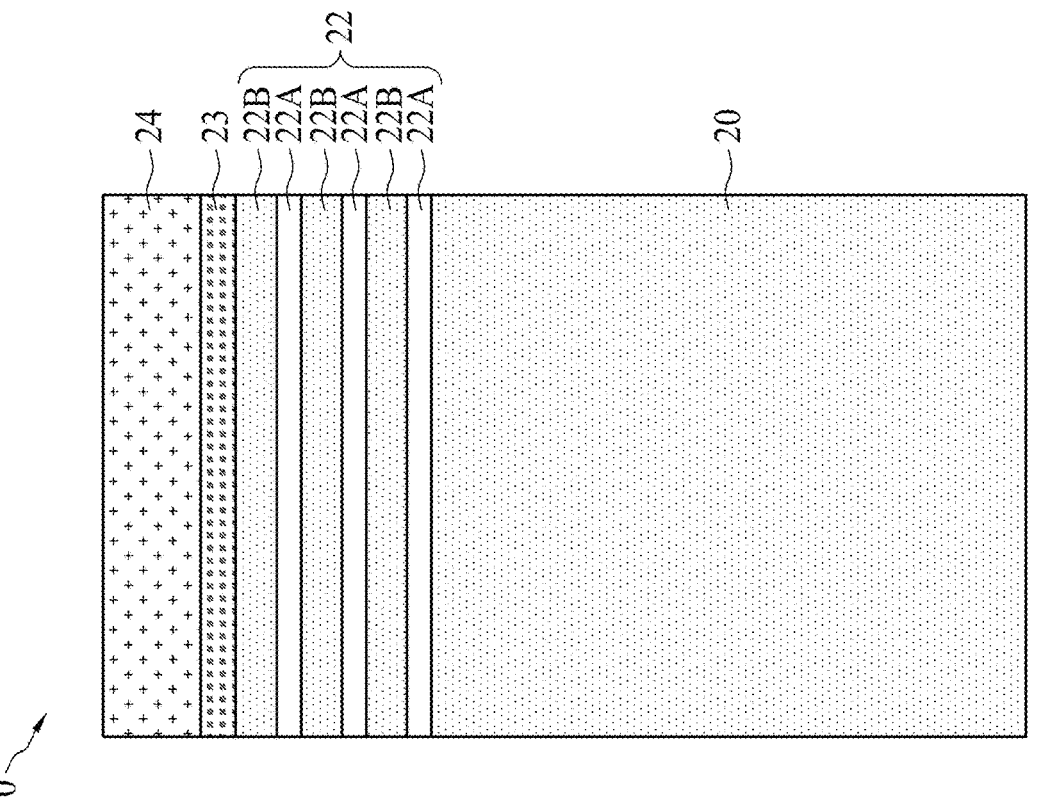

Referring to FIG. 1, a cross-sectional view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used.

Figure 29:
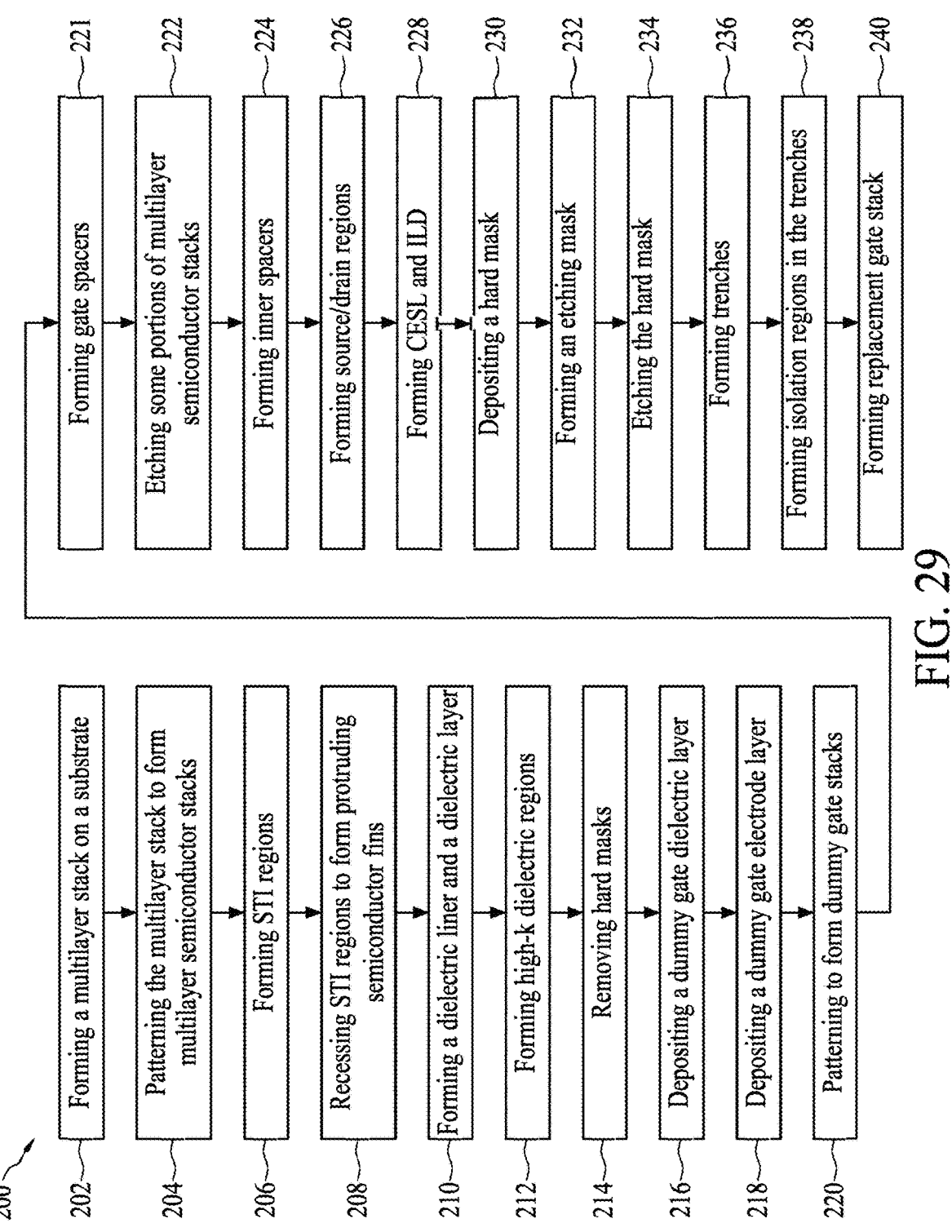
FIG. 29 illustrates a process flow for forming a GAA transistor in accordance with some embodiments.

In accordance with some embodiments, multilayer stack 22 is formed through a series of deposition processes for depositing alternating materials. The respective process is illustrated as process 202 in the process flow 200 as shown in FIG. 29. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B.

In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, pad layer 23 and hard mask 24 are deposited over multilayer stack 22. Pad layer 23 (sometimes referred to as a sacrificial layer) may be formed of a compound comprising silicon and another material(s) selected from carbon, oxide, nitrogen, or combinations thereof. Hard mask 24 may be formed of or comprise silicon nitride.

Referring to FIG. 2, hard mask 24 and pad 23 are patterned. Next, multilayer stack 22 and a portion of the underlying substrate 20 are patterned in an etching process (es), so that trenches 25 are formed. The respective process is illustrated as process 204 in the process flow 200 as shown in FIG. 29. Trenches 25 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and semiconductor layers 22B are alternatively referred to as nanostructures hereinafter. The portions of multilayer stacks 22' and the underlying substrate strips 20' are collectively referred to as semiconductor strips 27.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 2, 3, 4A, 4B, and 4C illustrate the formation of isolation regions 30, which are also referred to as Shallow Trench Isolation (STI) regions throughout the description. The respective process is illustrated as process 206 in the process flow 200 as shown in FIG. 29. Referring to FIG. 2, dielectric liner 26, which may be a conformal dielectric layer, is deposited. Dielectric liner 26 may comprises silicon oxide, silicon nitride, or the like, and may be formed using, for example, ALD, High-Density Plasma Chemical Vapor Deposition (HDPCVD), CVD, or the like.

Figure 3:
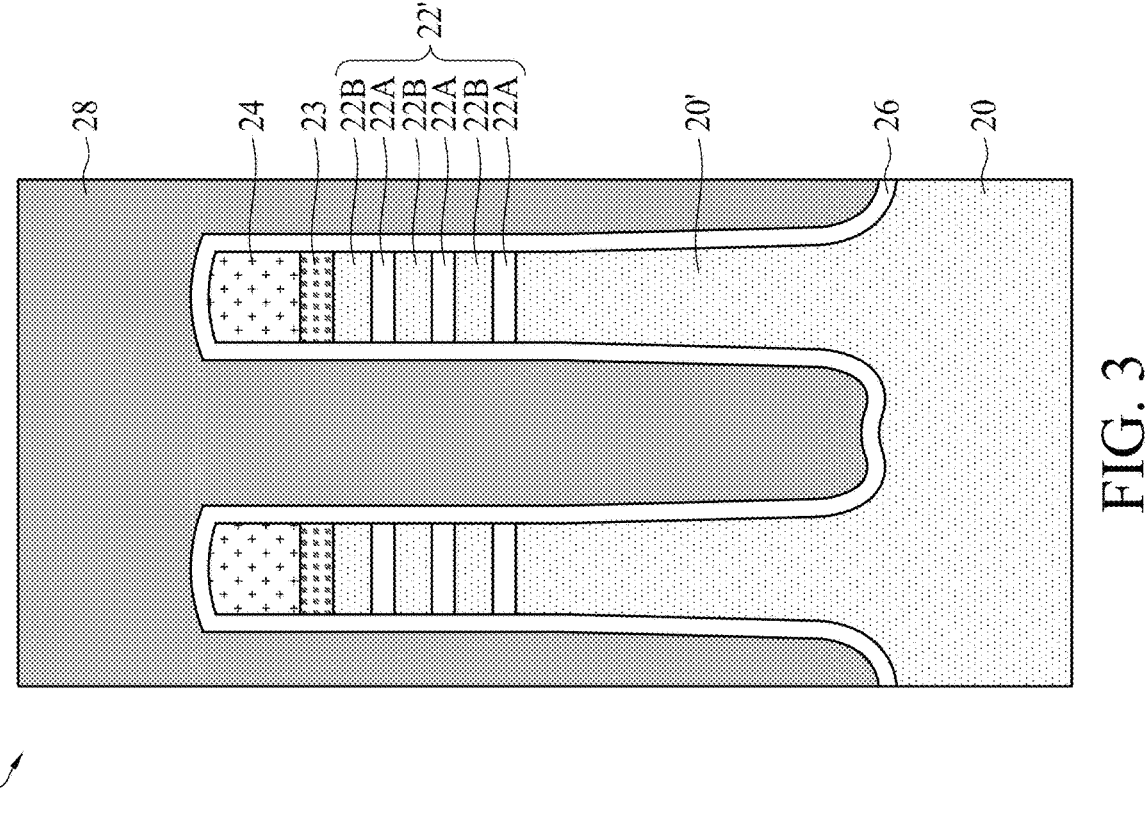

Next, referring to FIG. 3, dielectric material 28 is deposited over dielectric liner 26. Dielectric material 28 may comprise silicon oxide or other dielectric material comprising carbon, nitrogen, or the like, and may be formed using Flowable Chemical Vapor Deposition (FCVD), spin-on coating, HDPCVD, ALD, CVD, or the like.

The subsequent figure numbers in FIGS. 4A, 4B, and 4C through FIGS. 23A, 23B, and 23C may have the corresponding numbers followed by letter A, B, or C. The Figures whose reference numbers include letter A show perspective views. The Figures whose reference numbers include letter B illustrate the cross-sectional views obtained from the vertical plane X-X (FIG. 4A) in the corresponding perspective view. The Figures whose reference numbers include letter C illustrate the cross-sectional views obtained from the vertical plane Y-Y (FIG. 4A) in the corresponding perspective view.

Figure 4A:
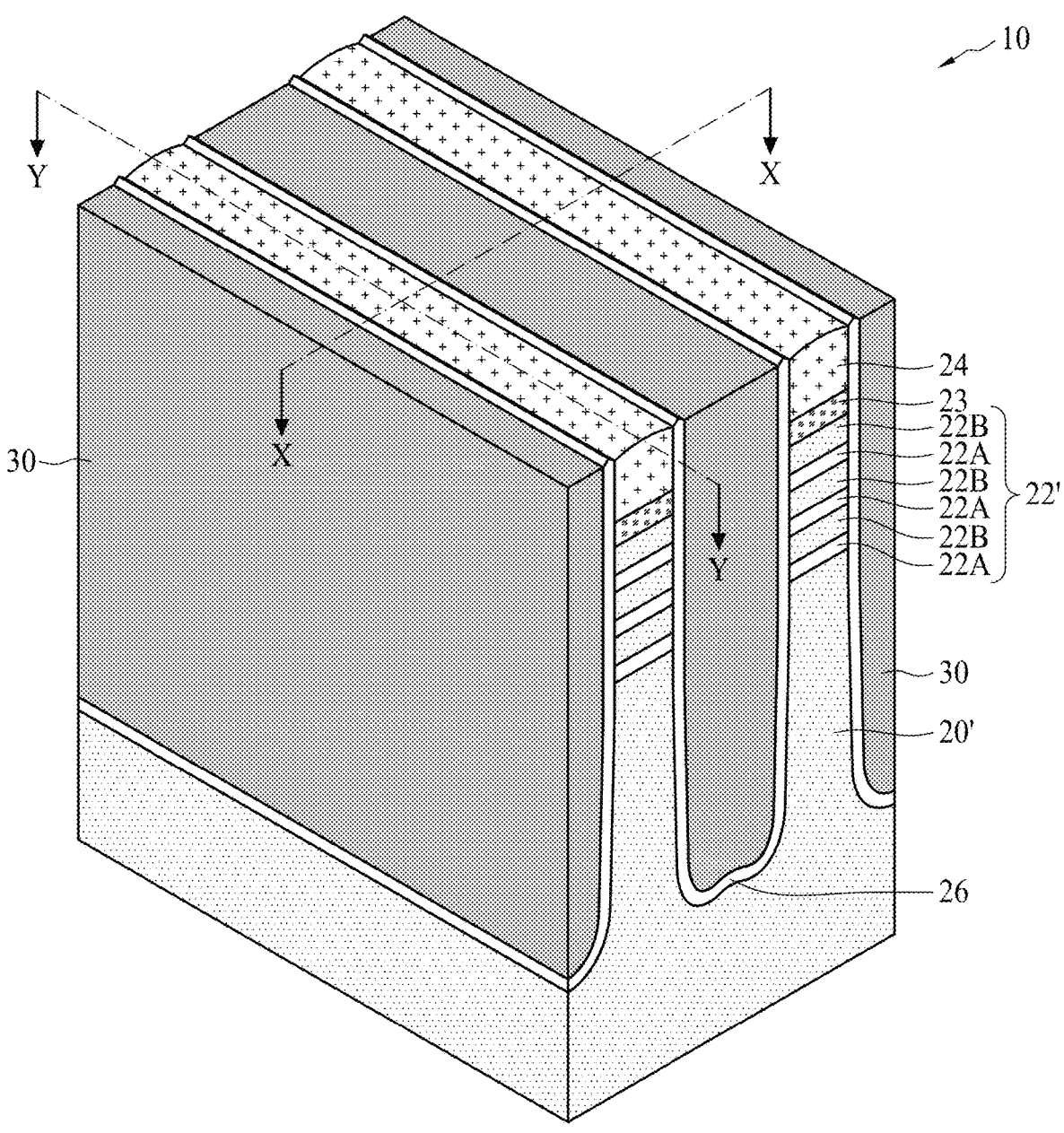
Figures 4B, 4C:
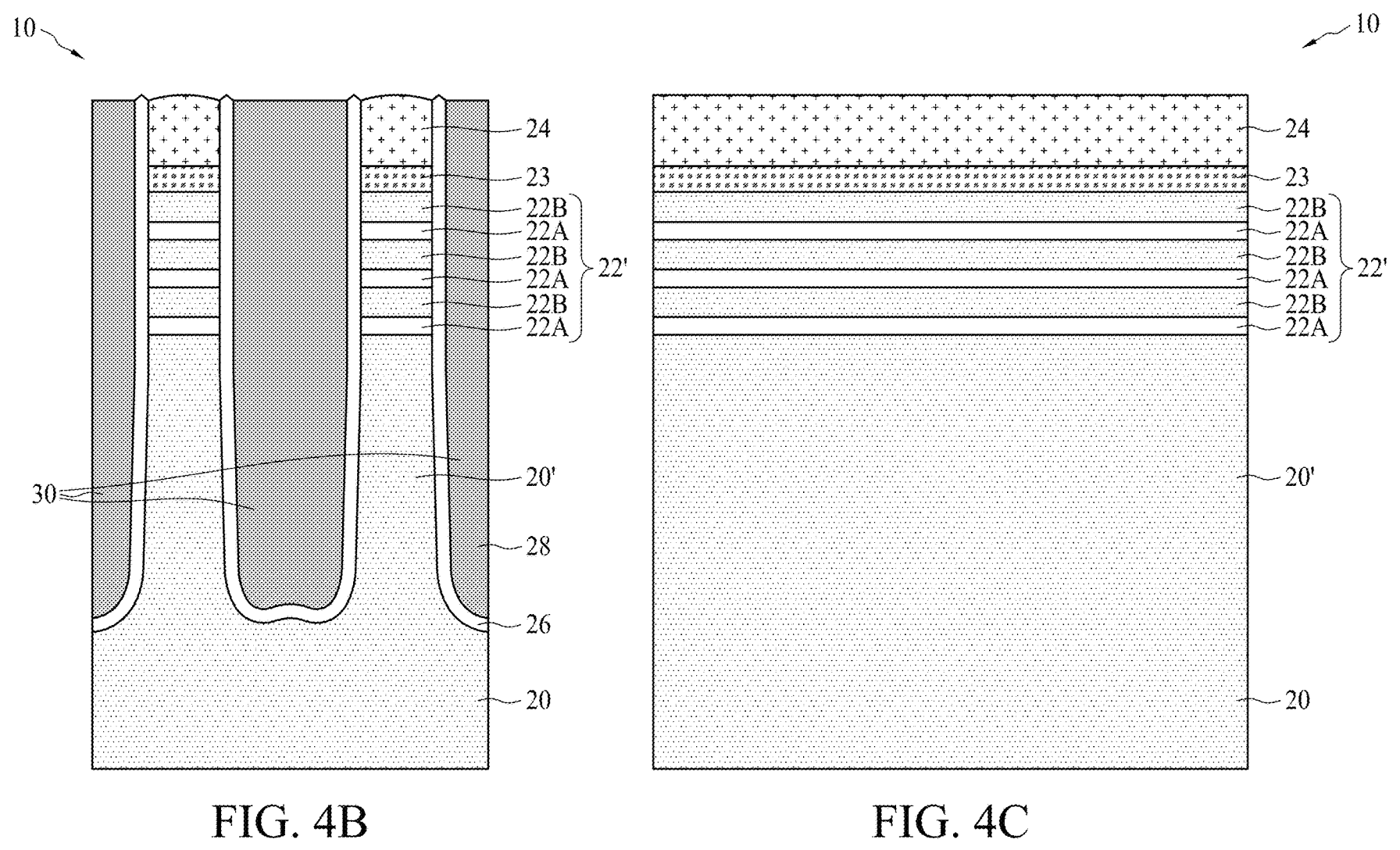

Referring to FIGS. 4A, 4B, and 4C, a planarization process such as a Chemical Mechanical Polish (CMP) process or a mechanical grinding process is performed to polish and level the top surface of the dielectric material 28 and dielectric liner 26, and the remaining portions of dielectric material 28 and dielectric liner 26 are STI regions 30. In the planarization process, either hard mask 24 or pad layer 23 may be used as a polish stop layer.

Figure 5A:
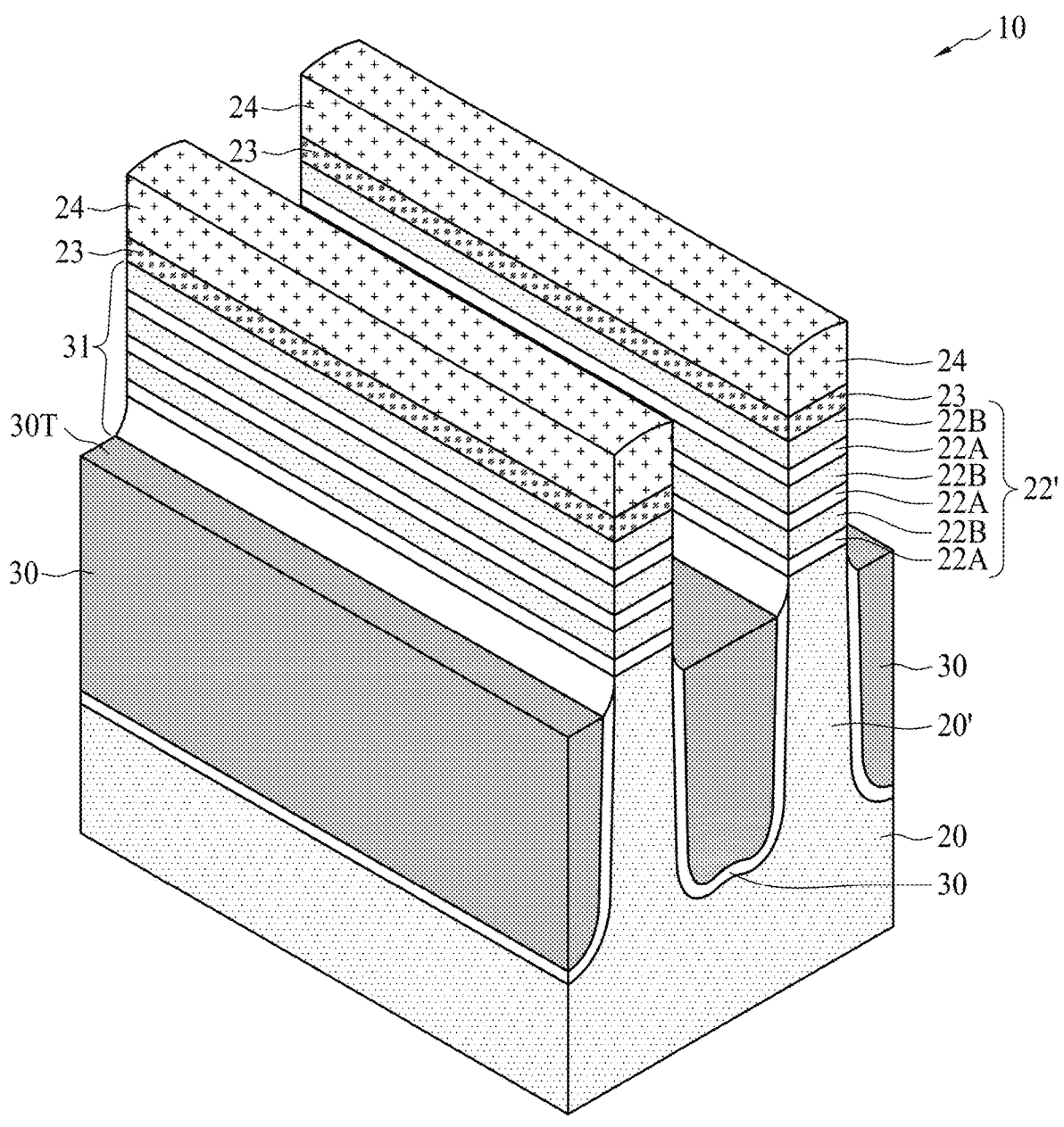
Figures 5B, 5C:
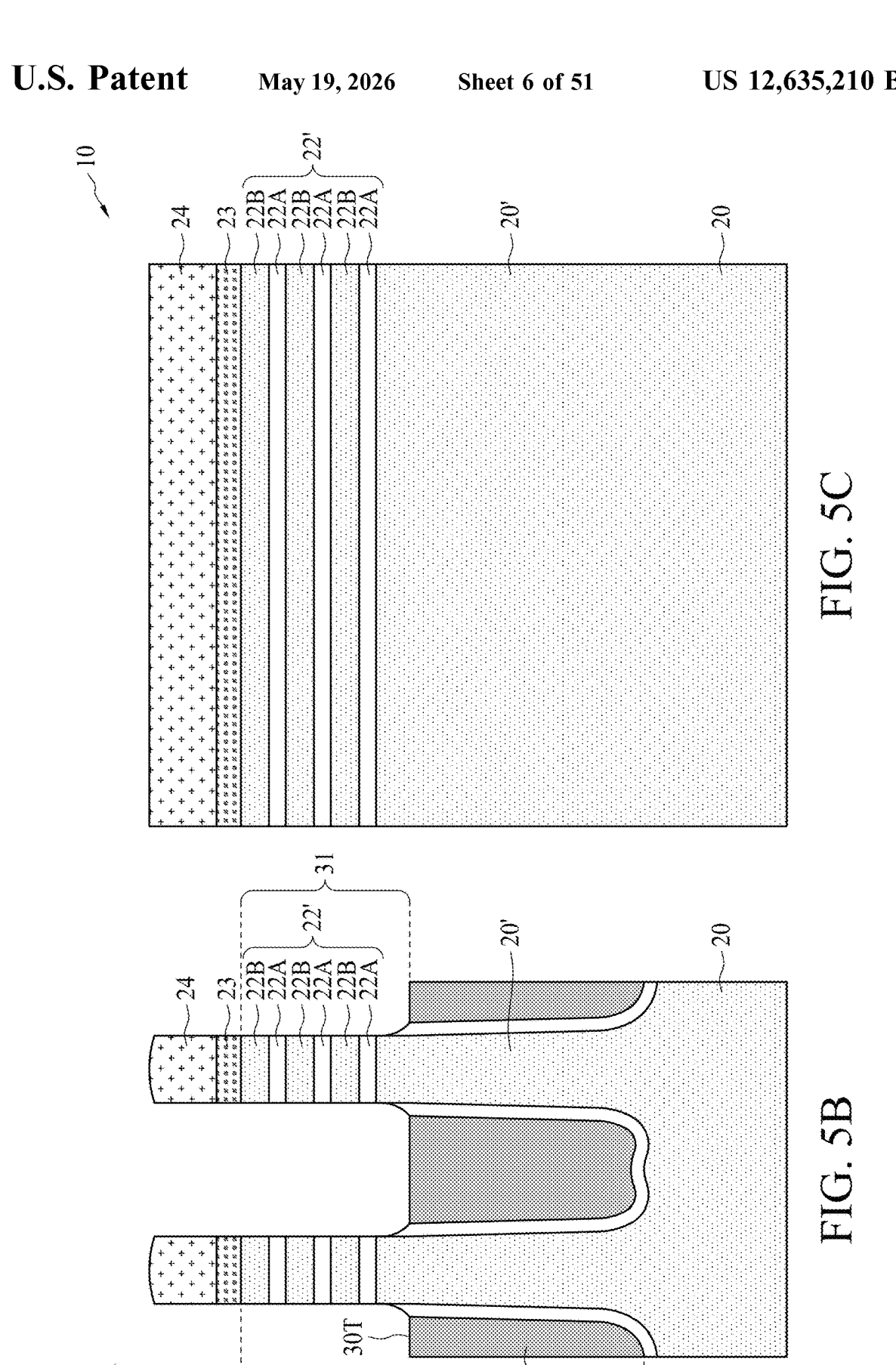

Referring to FIGS. 5A, 5B, and 5C, STI regions 30 are recessed, so that the top portions of semiconductor strips 27 (FIG. 5B) protrude higher than the top surfaces 30T of the remaining portions of STI regions 30 to form protruding fins 31. The respective process is illustrated as process 208 in the process flow 200 as shown in FIG. 29. Protruding fins 31 include multilayer stacks 22' and the top portions of substrate strips 20'. The recessing of STI regions 30 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 30 is performed through a wet etching process. The etching chemical may include HF, for example.

Figure 6A:
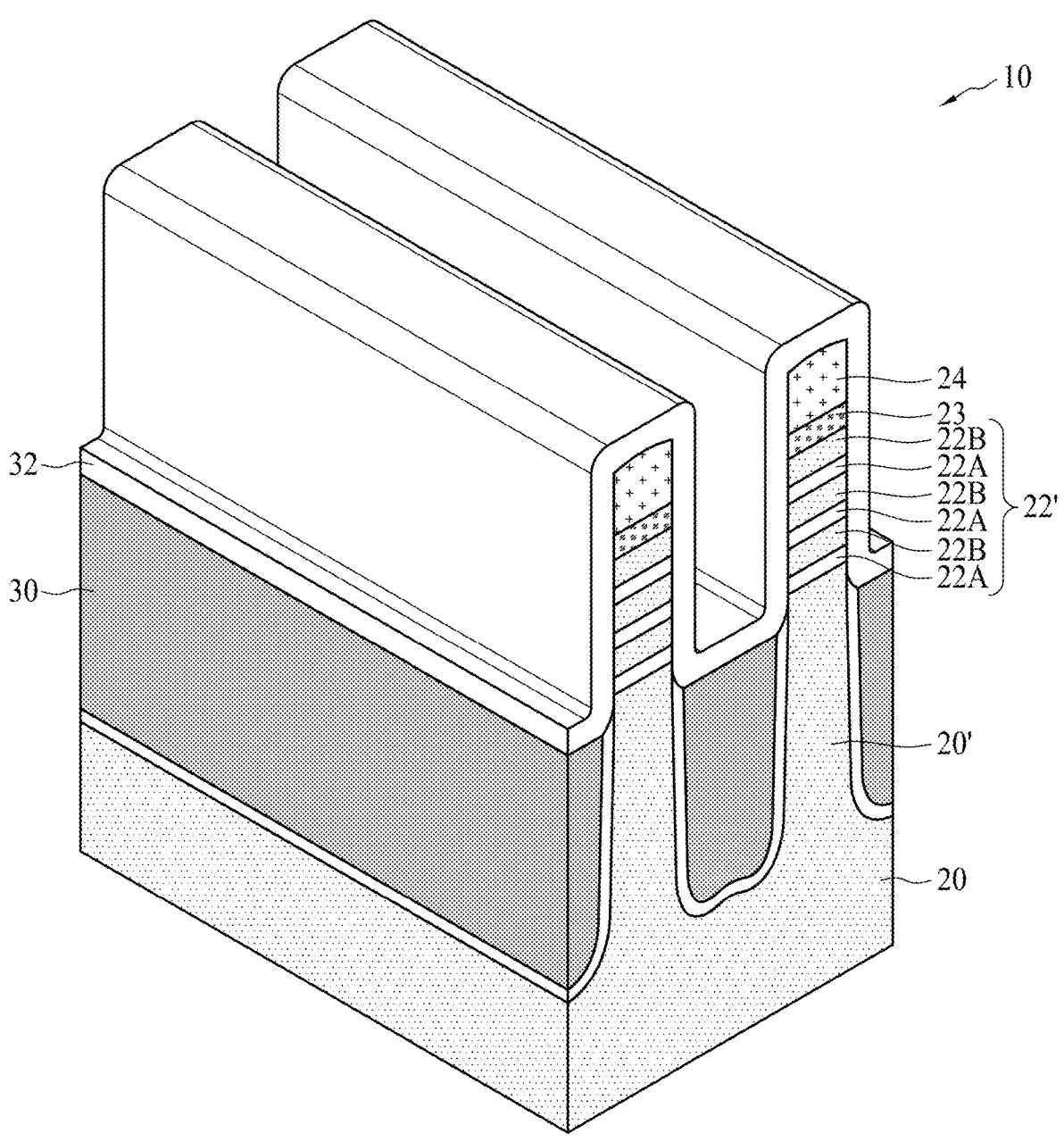
Figures 6B, 6C:
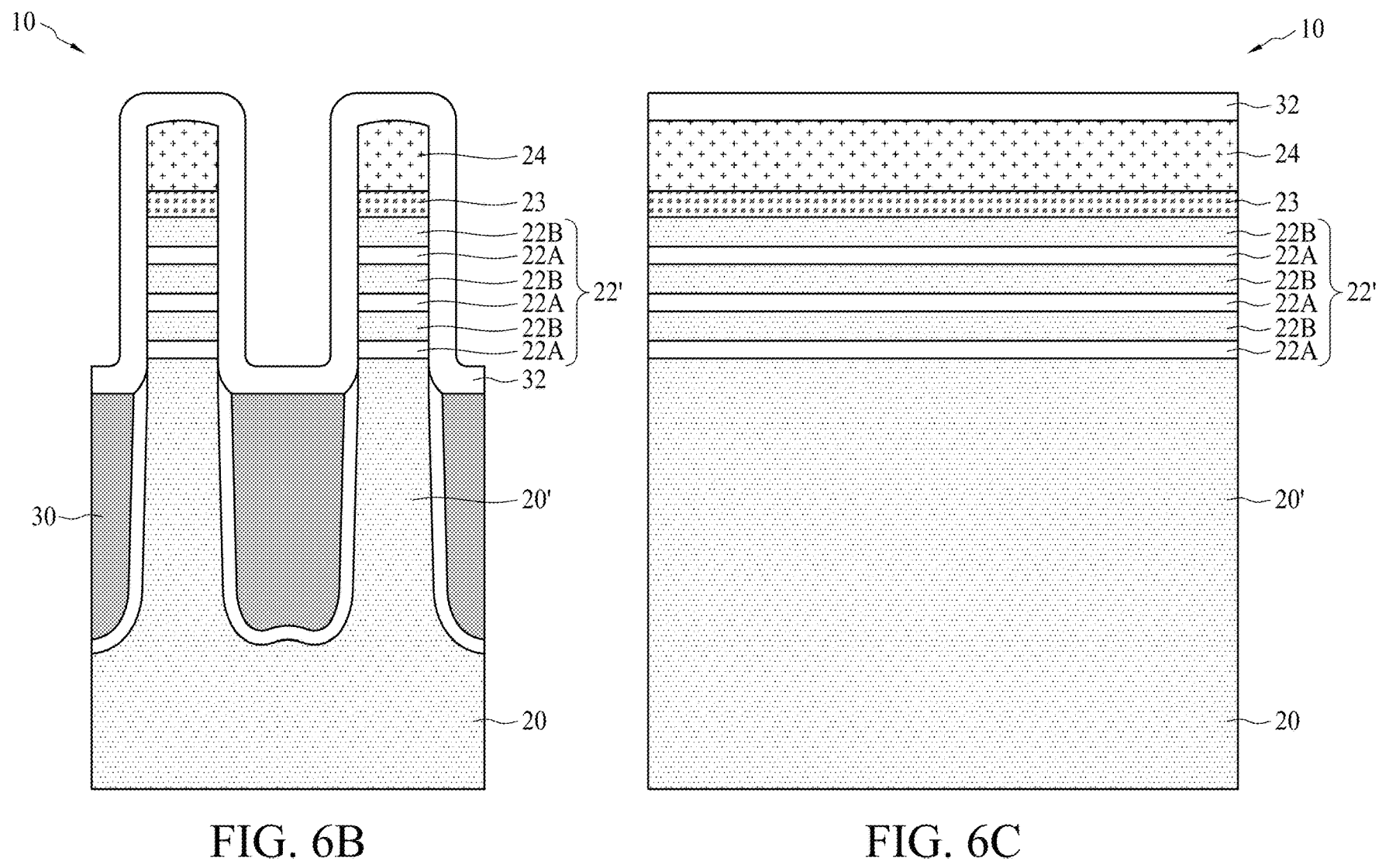

Referring to FIGS. 6A, 6B, and 6C, cladding SiGe layer 32 is deposited. Cladding SiGe layer 32 may be formed through a conformal deposition process such as ALD, CVD, or the like. In accordance with alternative embodiments, cladding SiGe layer 32 is not formed. An anisotropic etching process may then be performed to remove horizontal portions of cladding SiGe layer 32, leaving the vertical portions of cladding SiGe layer 32.

Figure 7A:
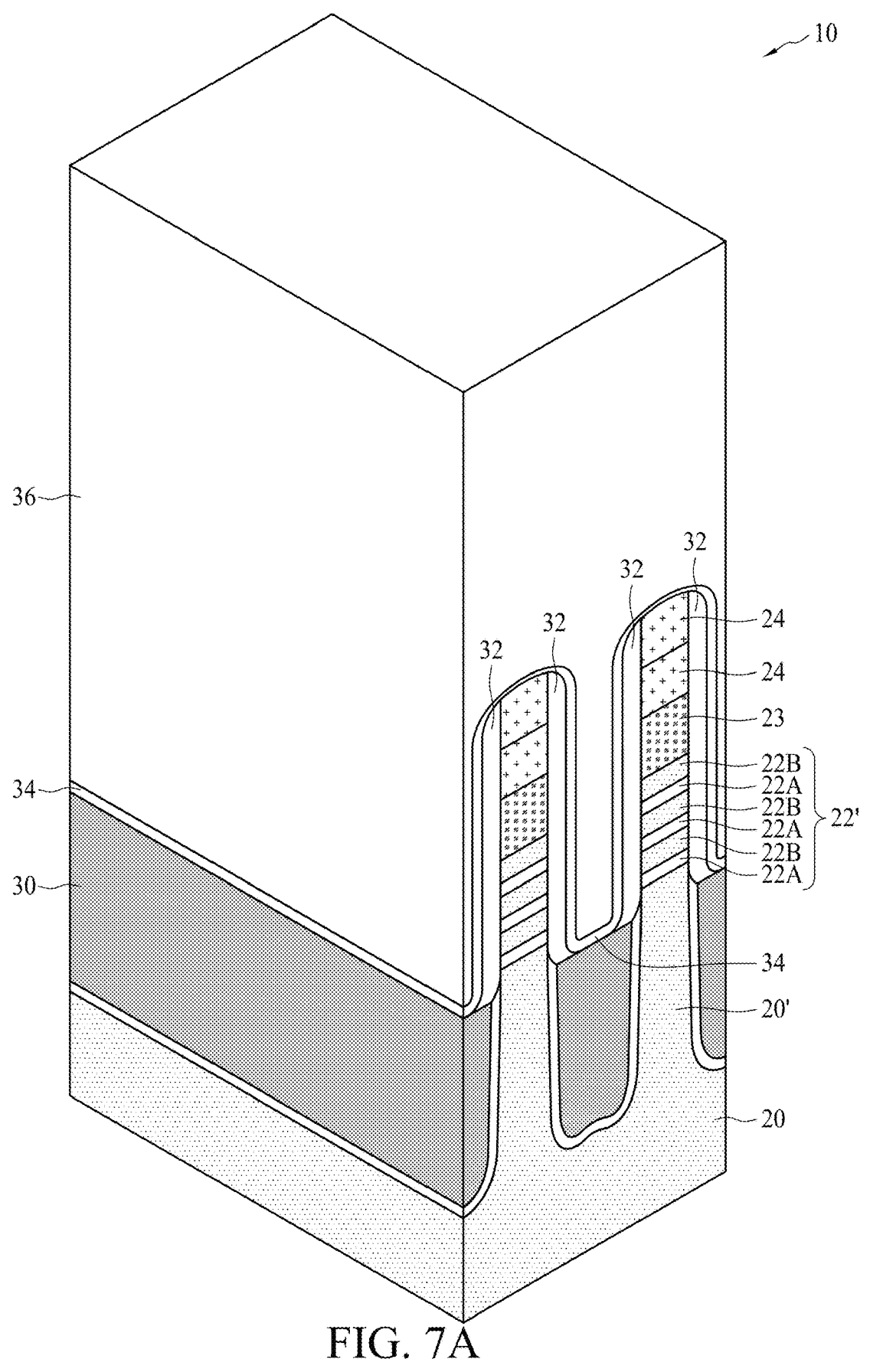
Figure 7B:
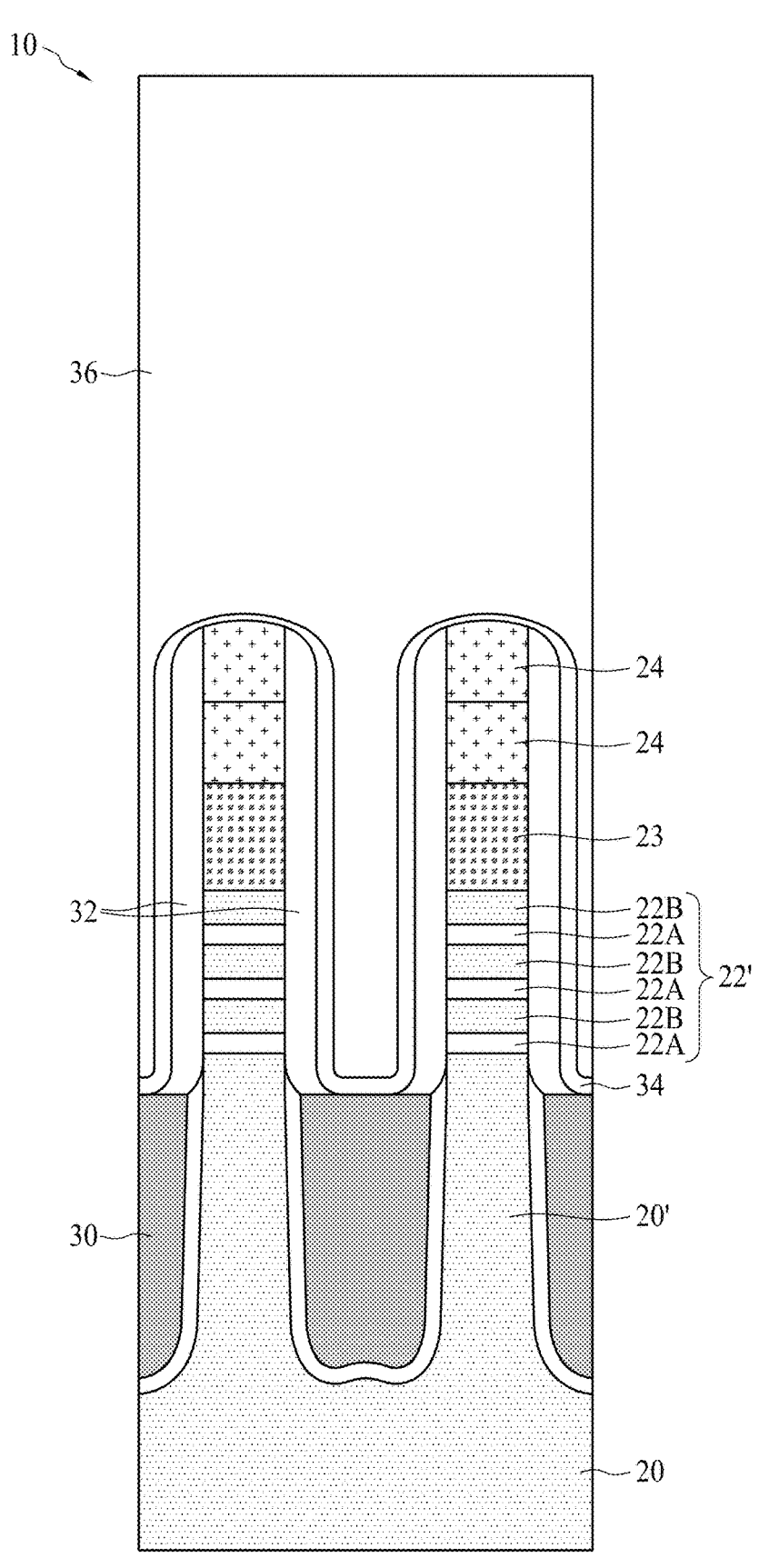
Figure 7C:
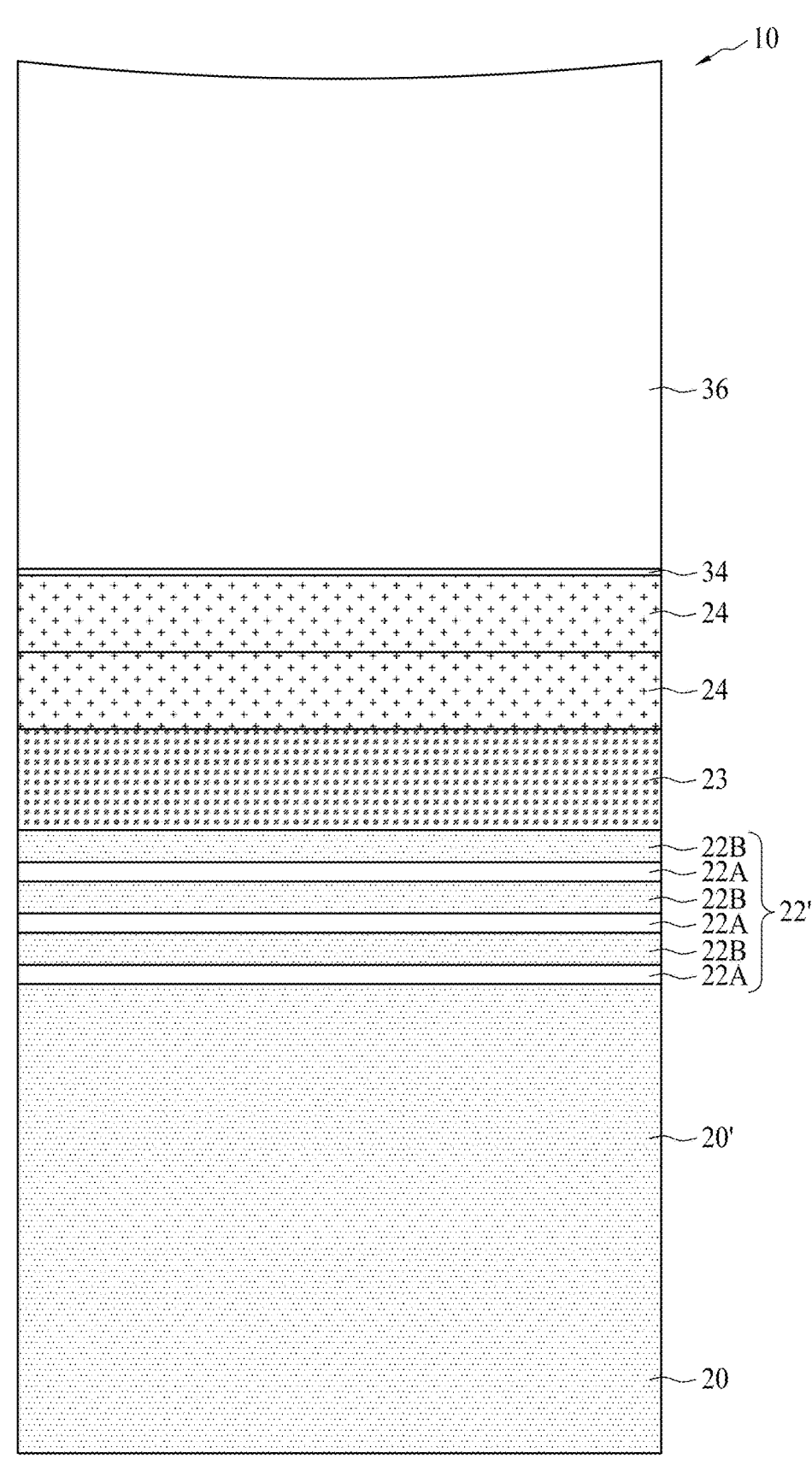

In FIGS. 7A, 7B, and 7C, dielectric liner 34 is formed, followed by the deposition of dielectric layer 36. Dielectric liner 34 may be formed of or comprise, for example, silicon carbo-nitride, silicon oxycarbide, silicon nitride, or the like, and may be formed through a conformal deposition process such as ALD, CVD, or the like. Dielectric layer 36 may be formed of or comprise silicon oxide, and may be formed through a deposition process, spin-on coating, or the like. The respective process is illustrated as process 210 in the process flow 200 as shown in FIG. 29.

Figure 8A:
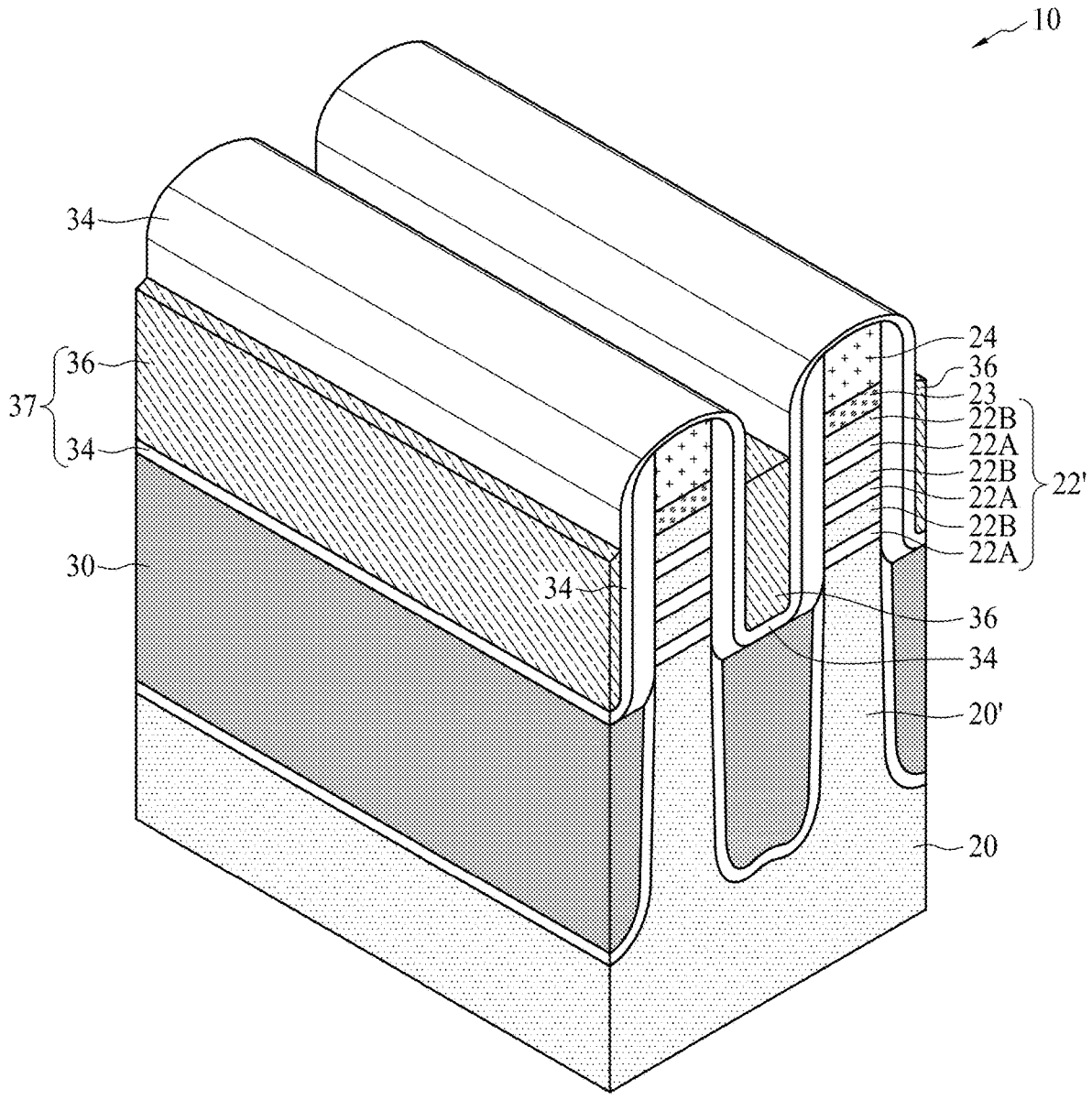
Figures 8B, 8C:
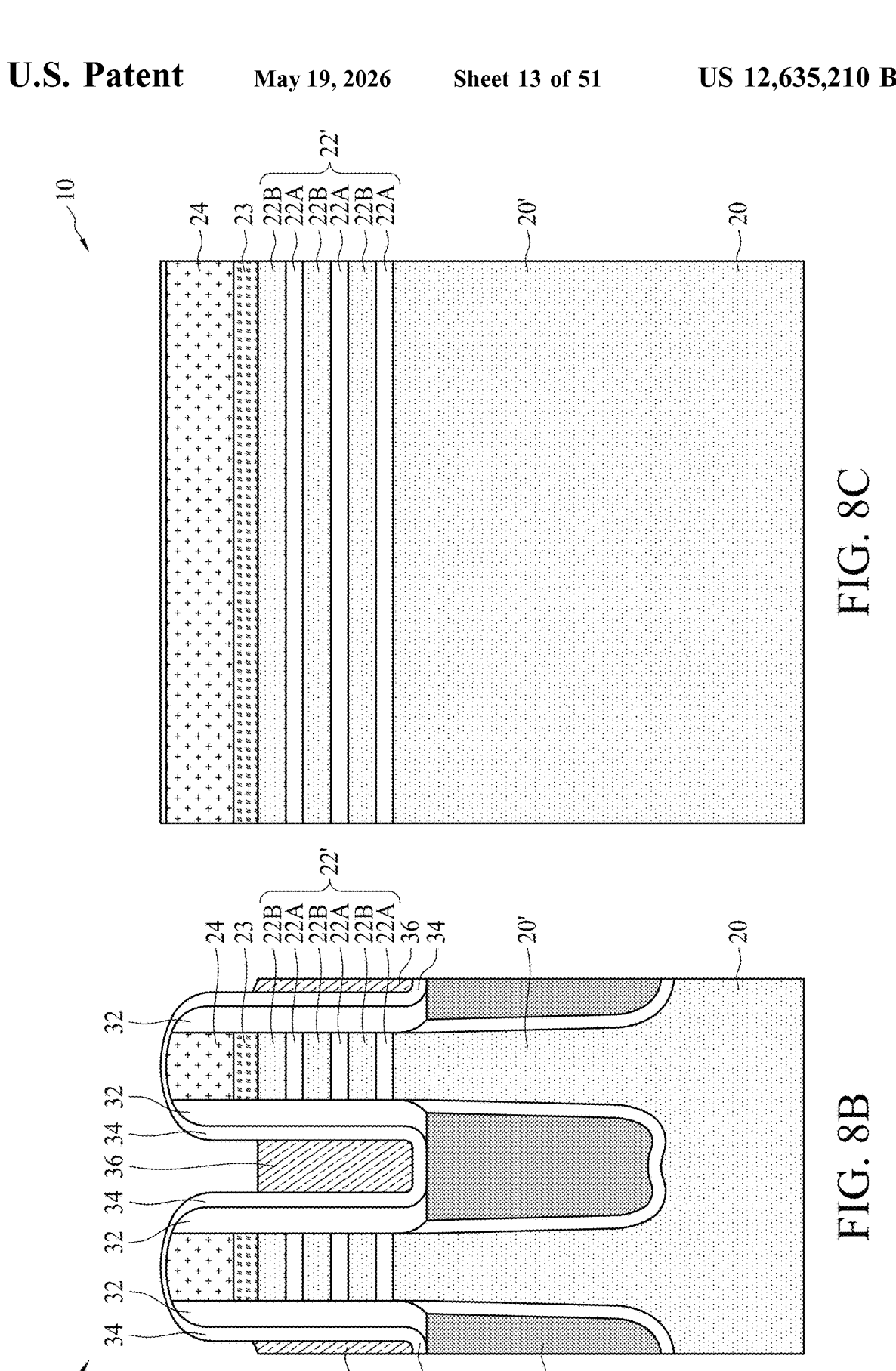

FIGS. 8A, 8B, and 8C illustrate the etch-back of dielectric layer 36 and dielectric layer 34. The remaining dielectric liner 34 and dielectric layer 36 are in the gaps between neighboring multilayer stacks 22', and are collectively referred to as dielectric regions 37. In accordance with some embodiments, the top surface of dielectric layer 36 is level with or lower than the top ends of multilayer stacks 22'. By controlling etching processes, the top ends of dielectric liner 34 may be higher than the top surface of dielectric layer 36 in accordance with some embodiments.

Figure 9A:
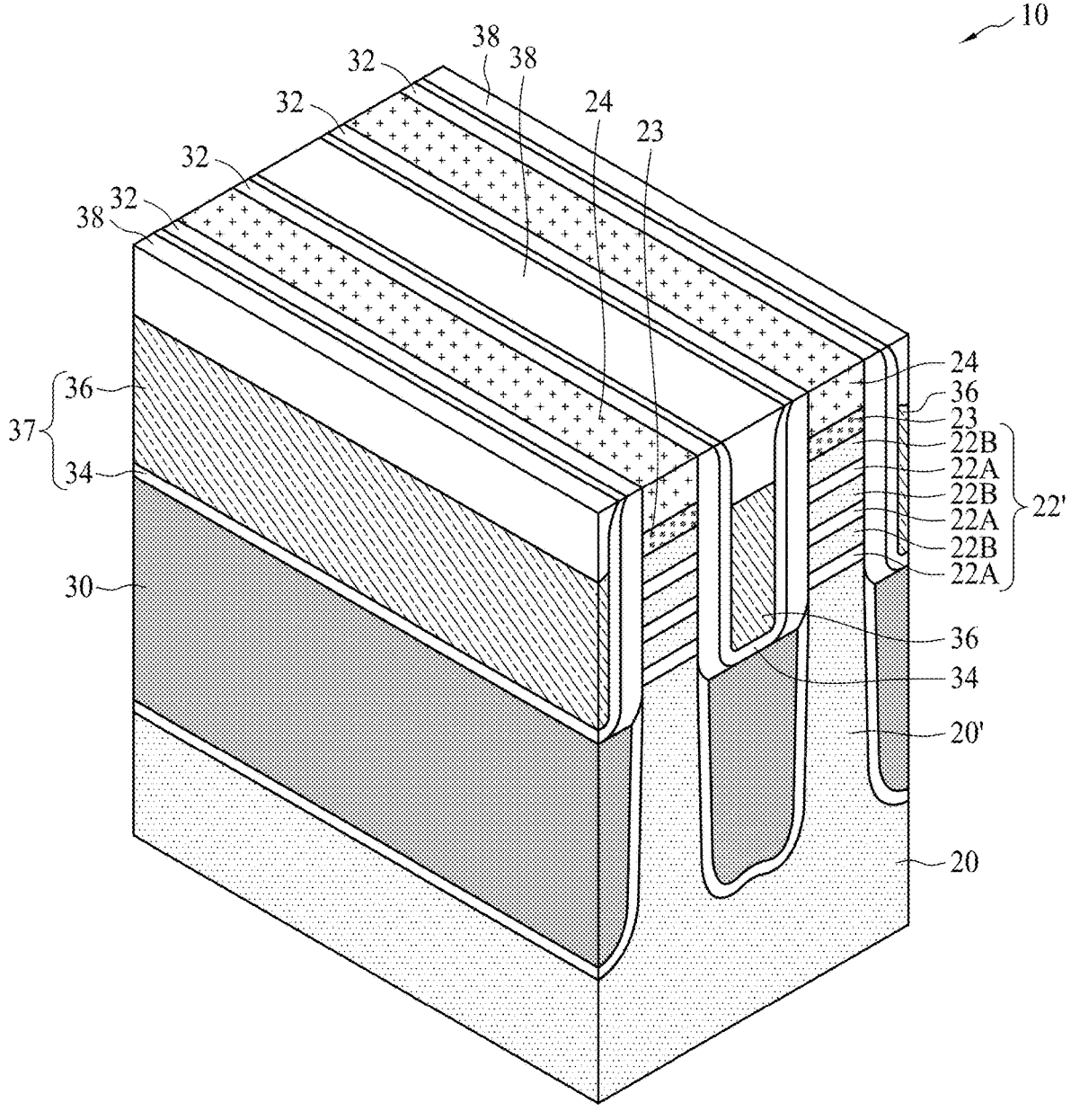
Figures 9B, 9C:
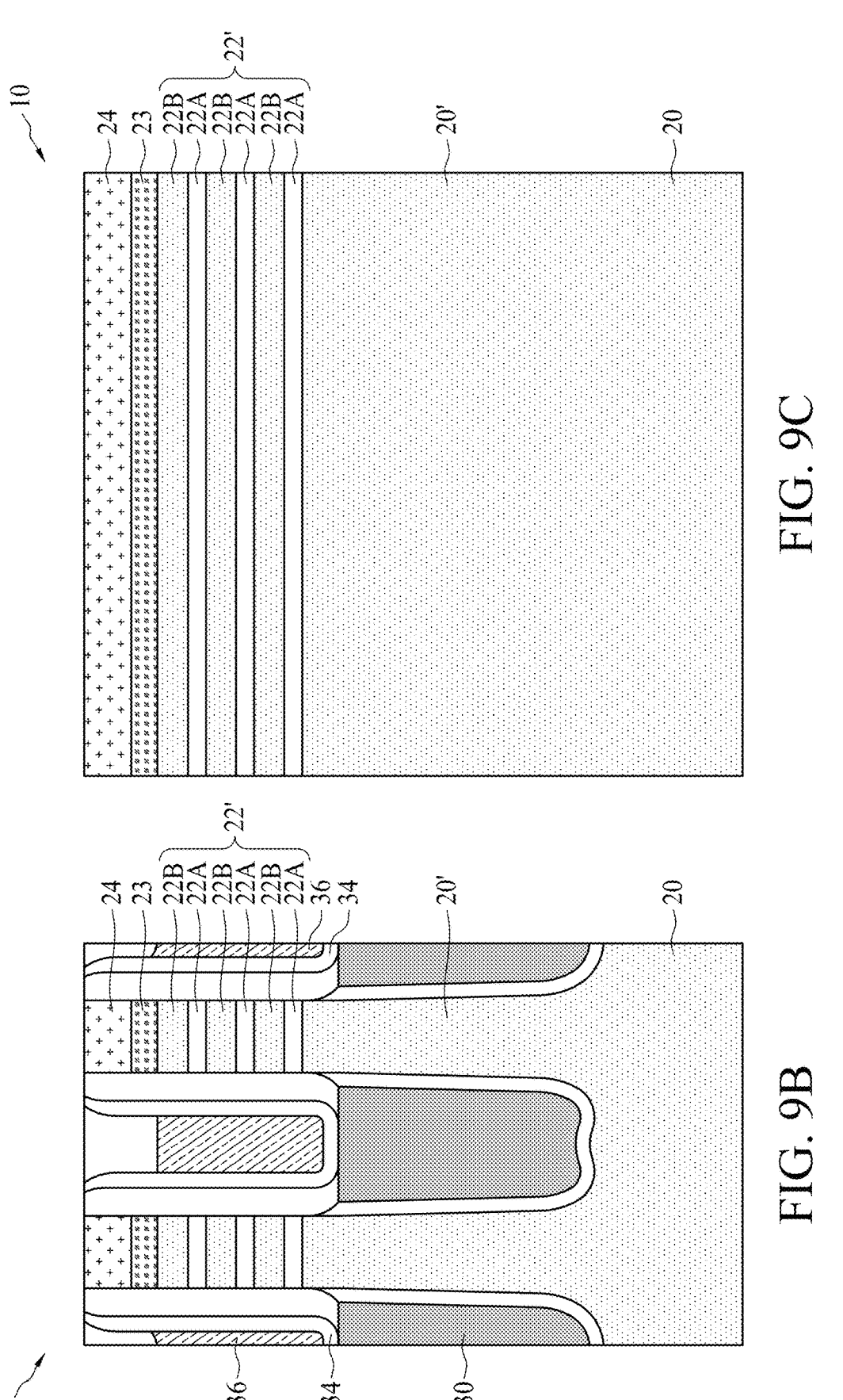

FIGS. 9A, 9B, and 9C illustrate the formation of high-k dielectric regions 38. The respective process is illustrated as process 212 in the process flow 200 as shown in FIG. 29. In accordance with some embodiments, dielectric region 38 is deposited through High-density Plasma Chemical Vapor Deposition (HDPCVD), PECVD, ALD, CVD, or the like. The material of dielectric region 38 may be selected from hafnium oxide, zirconium oxide, aluminum oxide, aluminum nitride, titanium nitride, silicon oxide, silicon nitride, silicon oxynitride, silicon oxy-carbo-nitride, or the like. A planarization process is then performed to level the top surfaces of dielectric regions 38 with hard masks 24 in accordance with some embodiments.

Figure 10A:
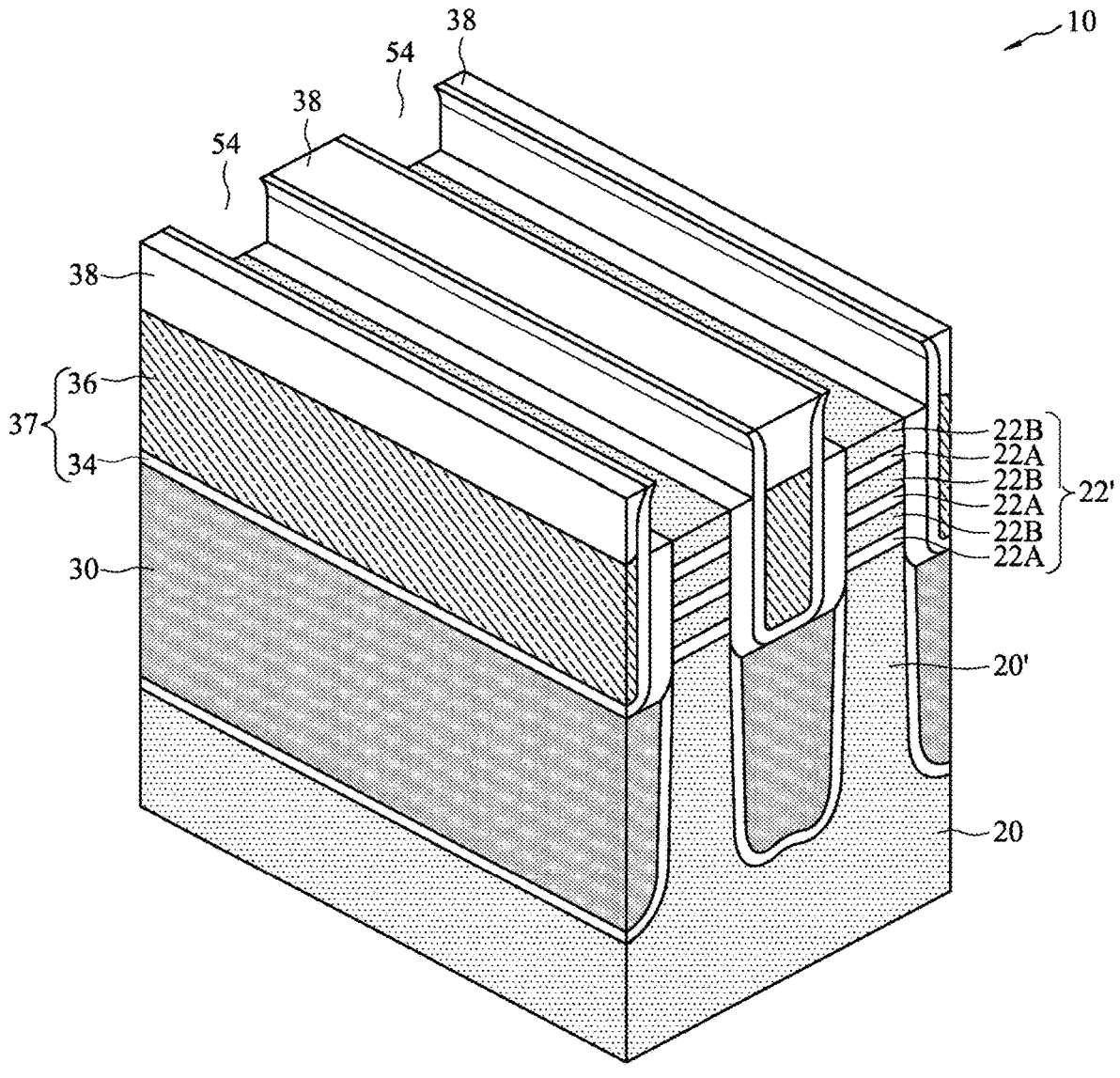
Figures 10B, 10C:
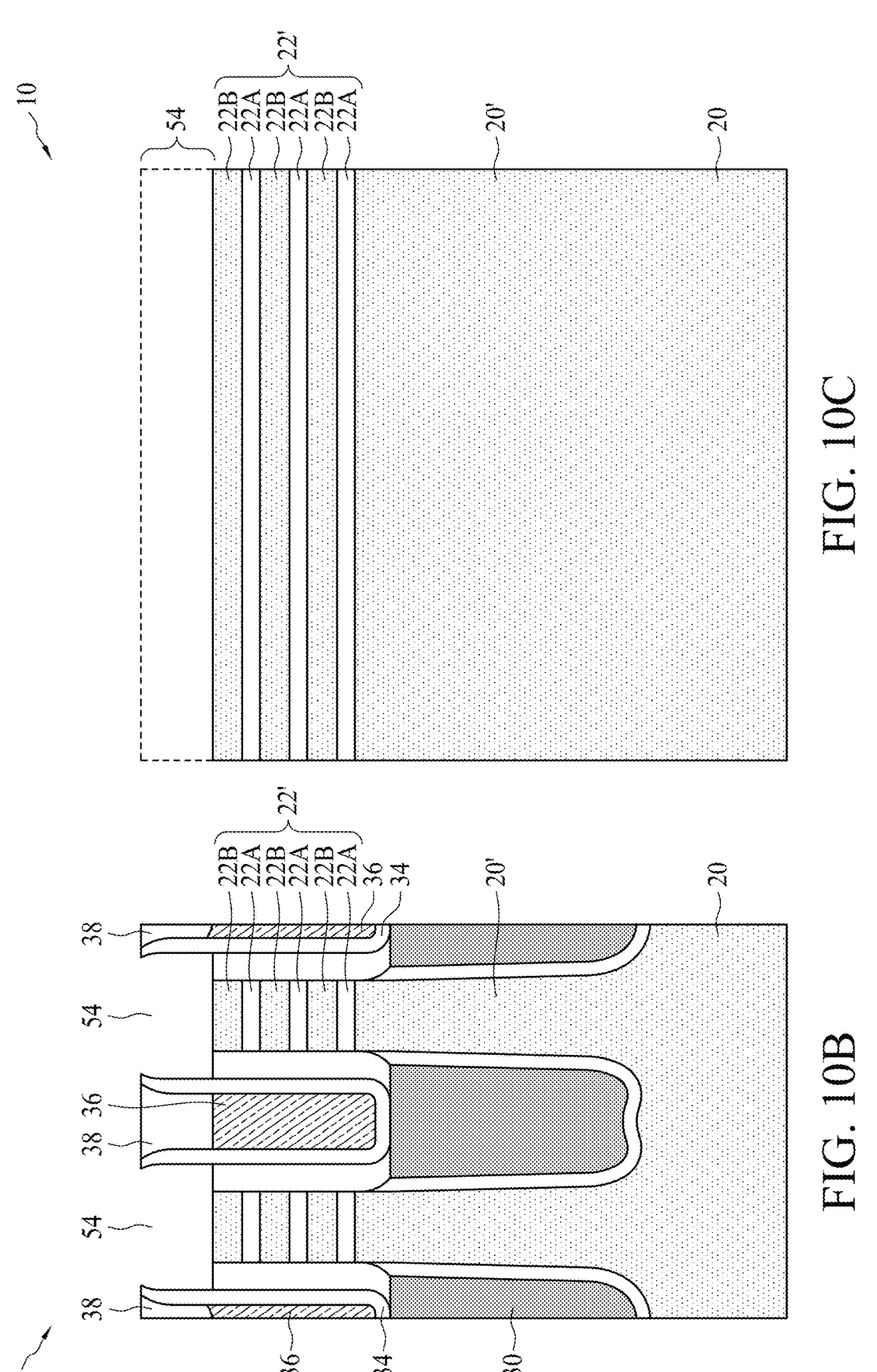

Next, hard masks 24 and pad layers 23 are removed, for example, in dry etching processes and/or wet etching processes. The respective process is illustrated as process 214 in the process flow 200 as shown in FIG. 29. Accordingly, as shown in FIGS. 10A, 10B, and 10C, recesses 54 are formed between high-k dielectric regions 38, which may protrude higher than multilayer stacks 22'.

Figure 11A:
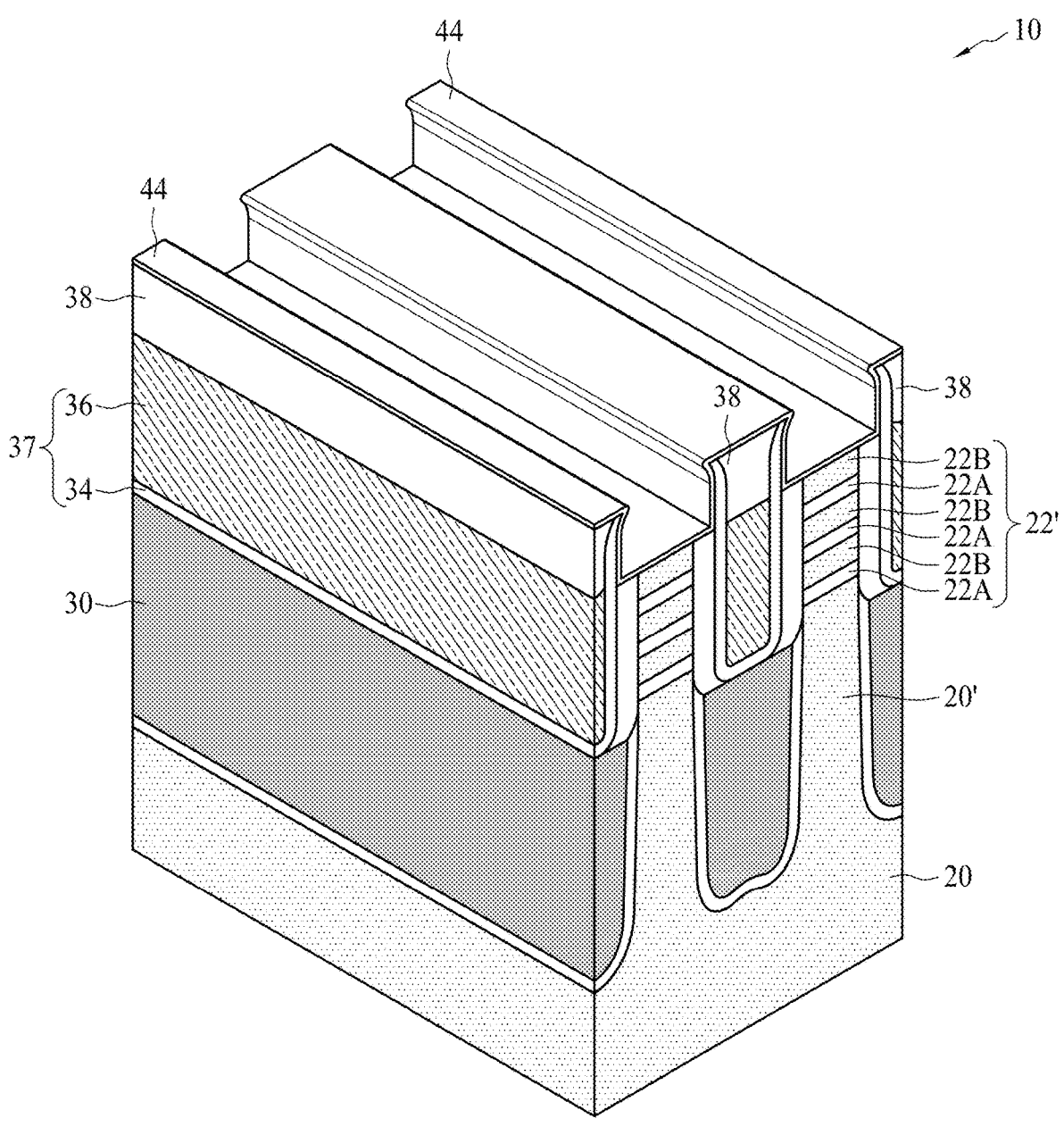
Figure 11B:
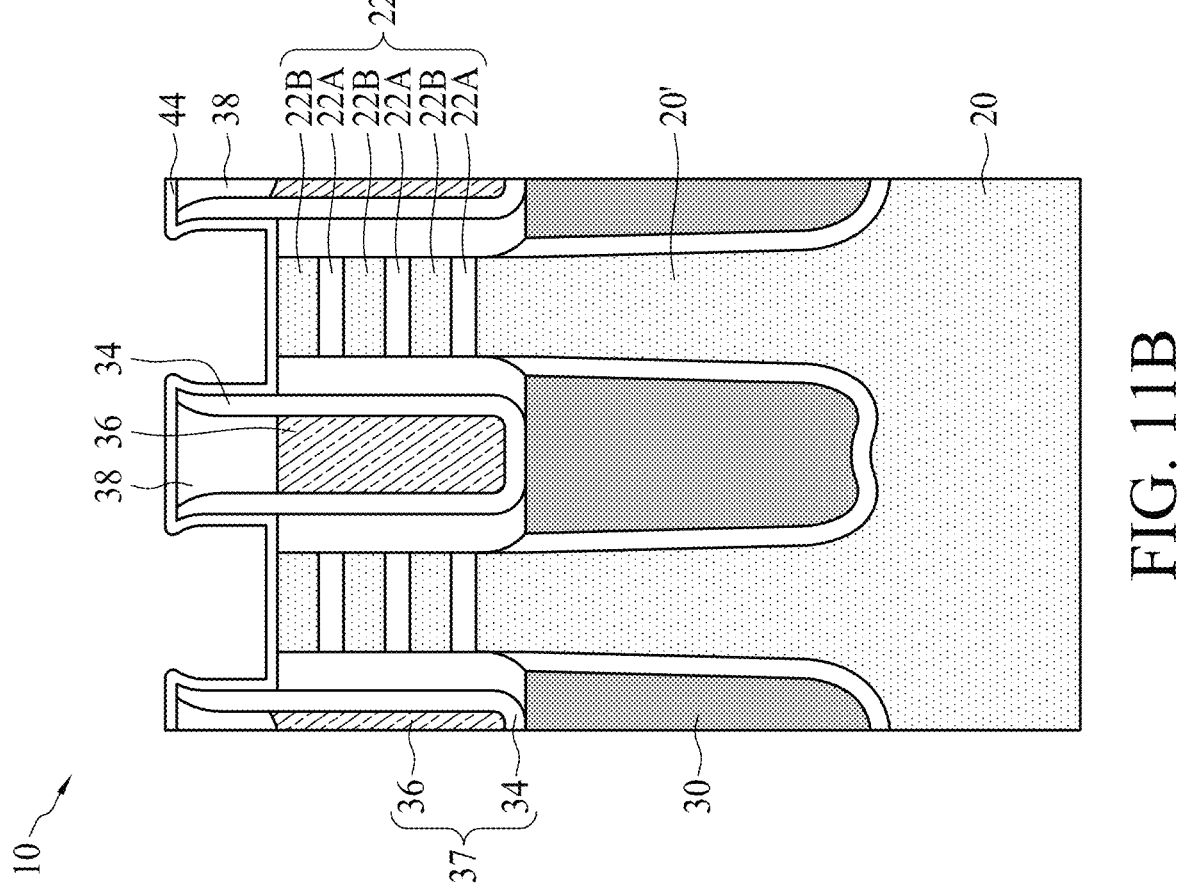

FIGS. 11A and 11B illustrate the formation of dummy gate dielectric layer 44, which is formed as a conformal layer. The respective process is illustrated as process 216 in the process flow 200 as shown in FIG. 29. In accordance with some embodiments, dummy gate dielectric layer 44 is deposited, for example, using a conformal deposition process such as ALD, CVD, or the like. Dummy gate dielectric layer 44 may be formed of or comprise silicon oxide in accordance with some embodiments. Dummy gate dielectric layer 44 extends into recesses 54, and extends on the top surfaces of high-k dielectric regions 38.

Figure 12A:
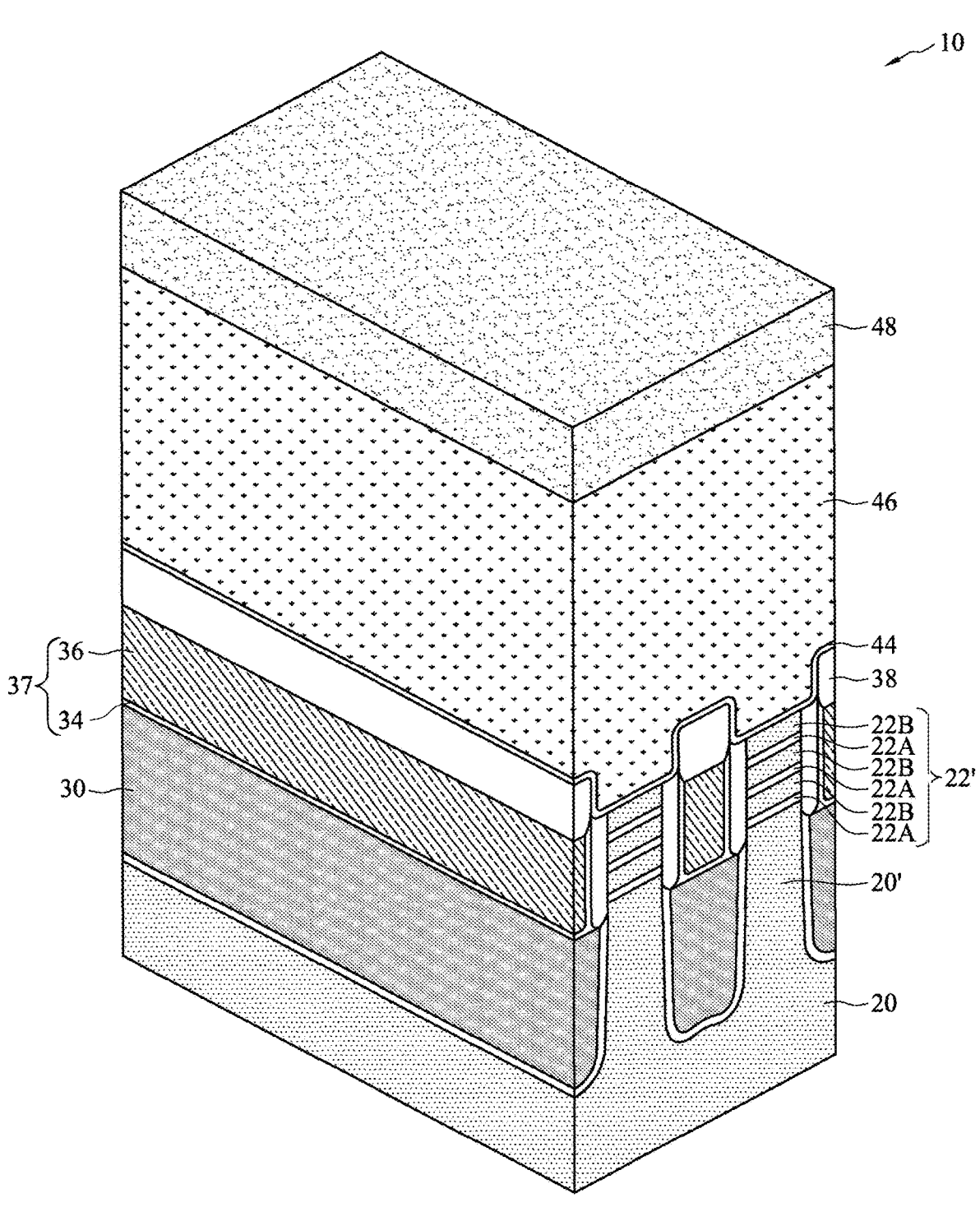
Figure 12C:
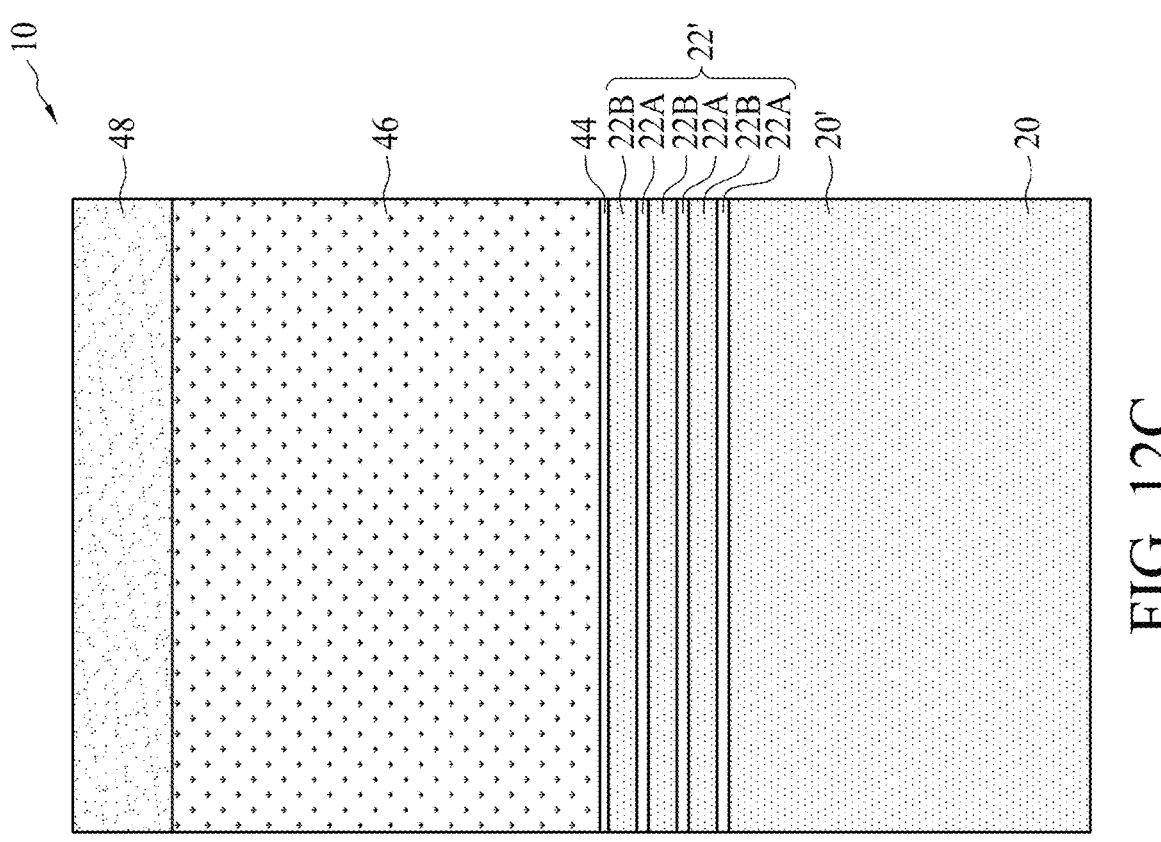
Figure 12B:
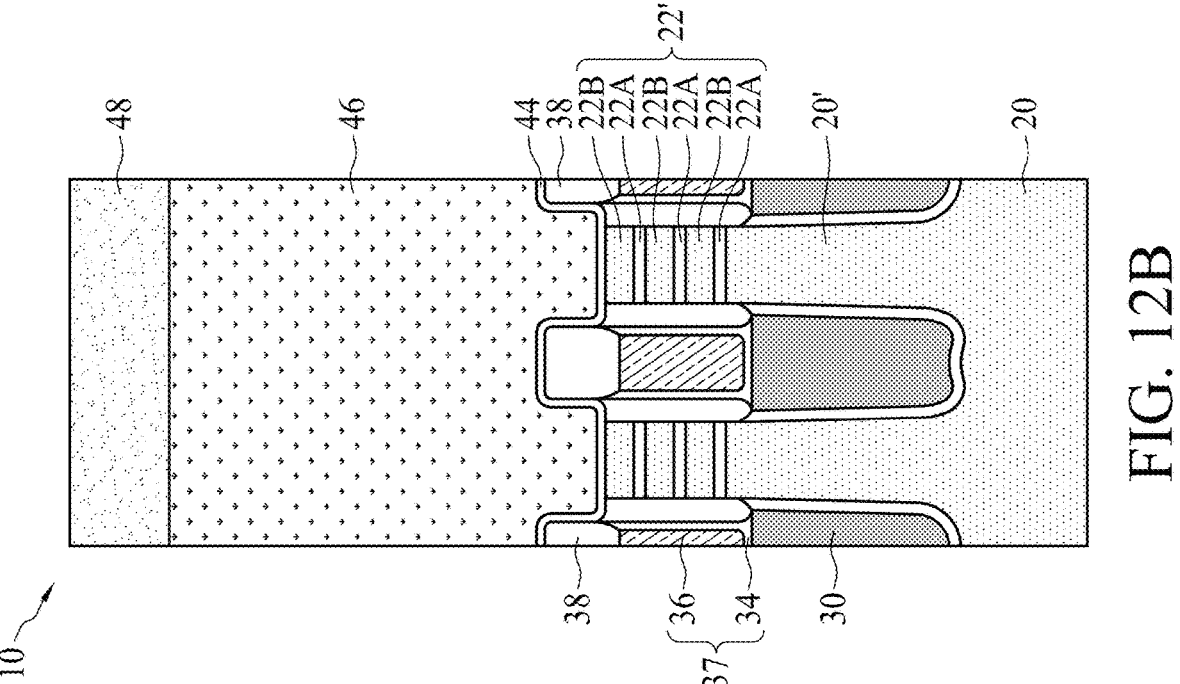

FIGS. 12A, 12B, and 12C illustrate the deposition of dummy gate electrode layer 46. In accordance with some embodiments, dummy gate electrode layer 46 is formed of or comprises polysilicon, amorphous silicon, or the like. The respective process is illustrated as process 218 in the process flow 200 as shown in FIG. 29. Hard mask layers 48 are also formed over dummy gate electrode layer 46. Hard mask layers 48 may be formed of silicon nitride, silicon oxide, silicon carbo-nitride, silicon oxy-carbo-nitride, or the like, or multilayers thereof.

Figure 13A:
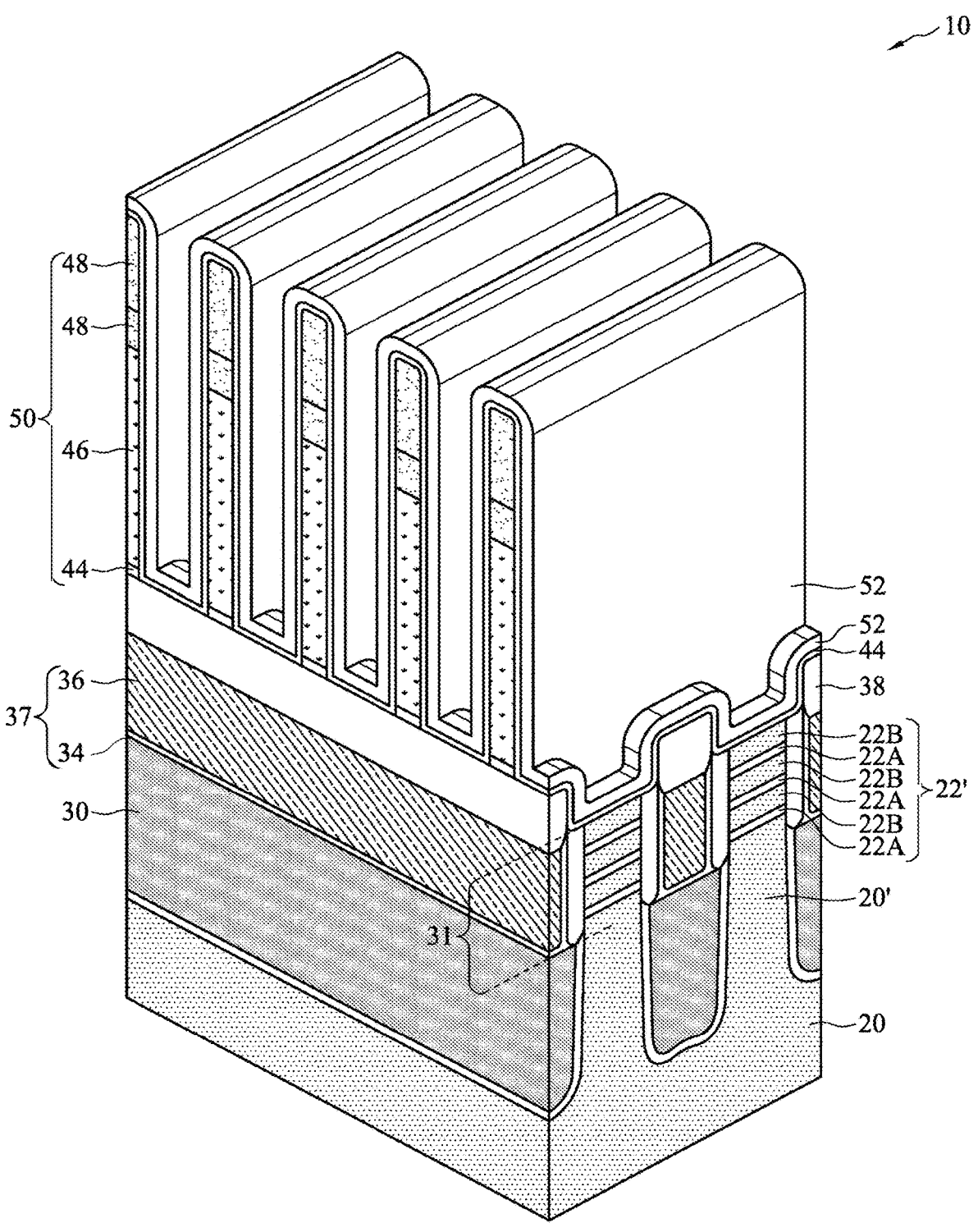
Figure 13C:
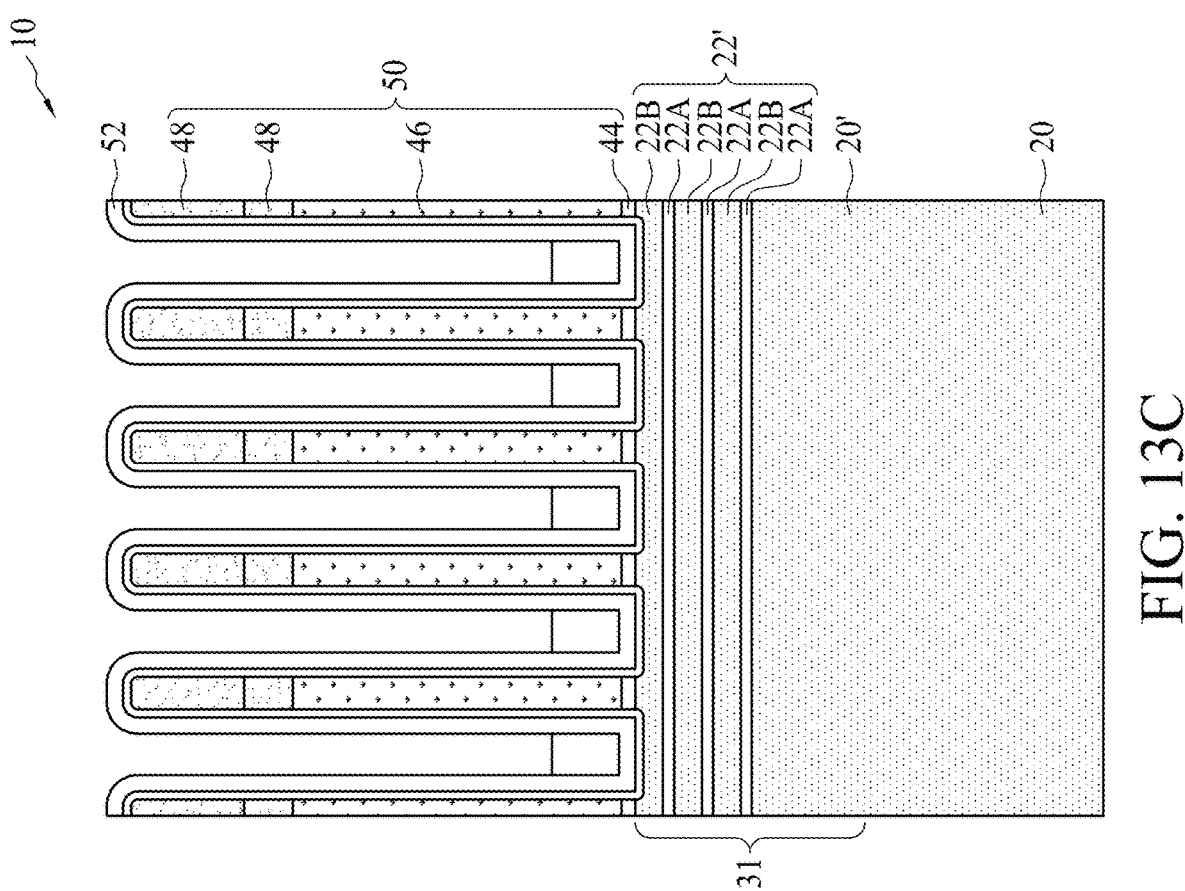
Figure 13B:
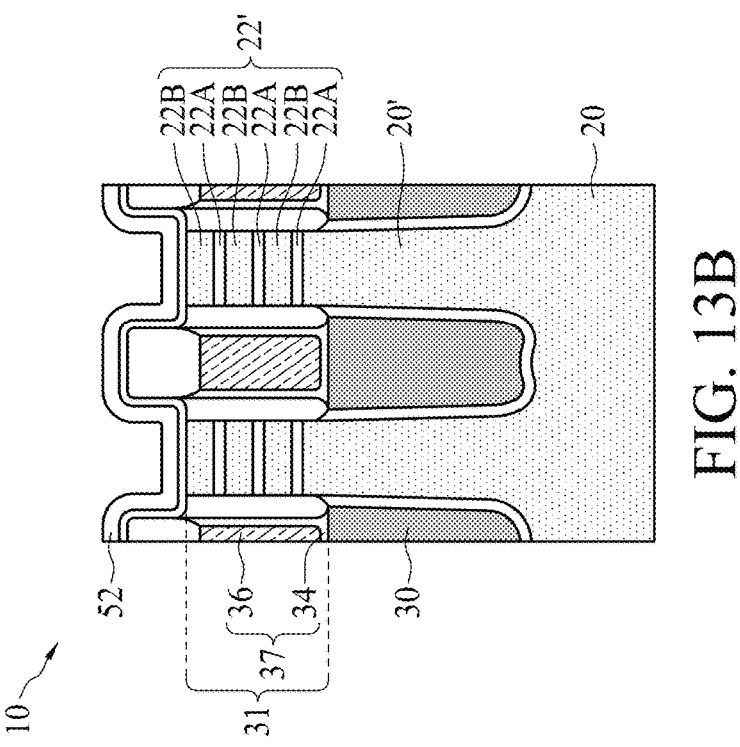

Next, as shown in FIGS. 13A, 13B, and 13C, hard mask layer 48, dummy gate electrode layer 46, and dummy gate dielectric layer 44 are patterned in etching processes, hence forming dummy gate stacks 50. The respective process is illustrated as process 220 in the process flow 200 as shown in FIG. 29. The remaining portions of hard mask layer 48, dummy gate electrode layer 46, and dummy gate dielectric layer 44 are referred to as hard masks 48, dummy gate electrodes 46, and dummy gate dielectrics 44, respectively.

Next, gate spacer layer 52 is deposited, for example, through a conformal deposition process such as ALD, CVD, or the like. In accordance with some embodiments, gate spacer layer 52 is formed of a dielectric material such as silicon nitride (SiN), silicon oxide (SiO$_2$), silicon carbo-nitride (SiCN), silicon oxynitride (SiON), silicon oxy-carbo-nitride (SiOCN), or the like, and may have a single-layer structure or a multilayer structure including a plurality of dielectric layers. After the deposition process, an anisotropic etching process(es) may be performed to etch the horizontal portions of gate spacer layer 52, leaving vertical portions of gate spacer layer 52 unremoved. The remaining portions of the dielectric layer(s) are referred to as gate spacers 52. The respective process is illustrated as process 221 in the process flow 200 as shown in FIG. 29. In subsequent figures, gate stacks 50 are shown, while gate dielectrics 44 and gate electrodes 46 may not (or may) be shown separately.

Figure 14A:
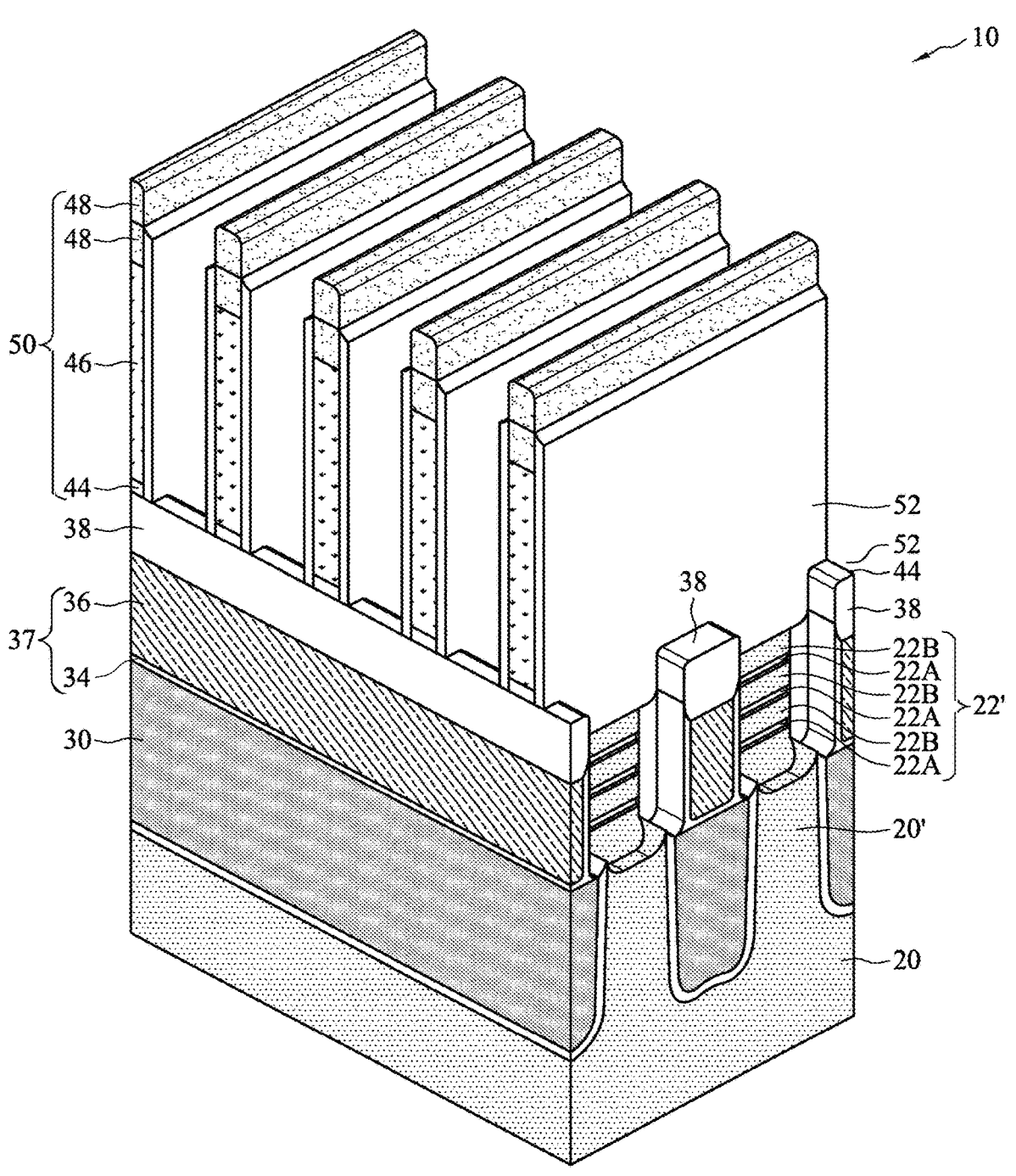
Figure 14C:
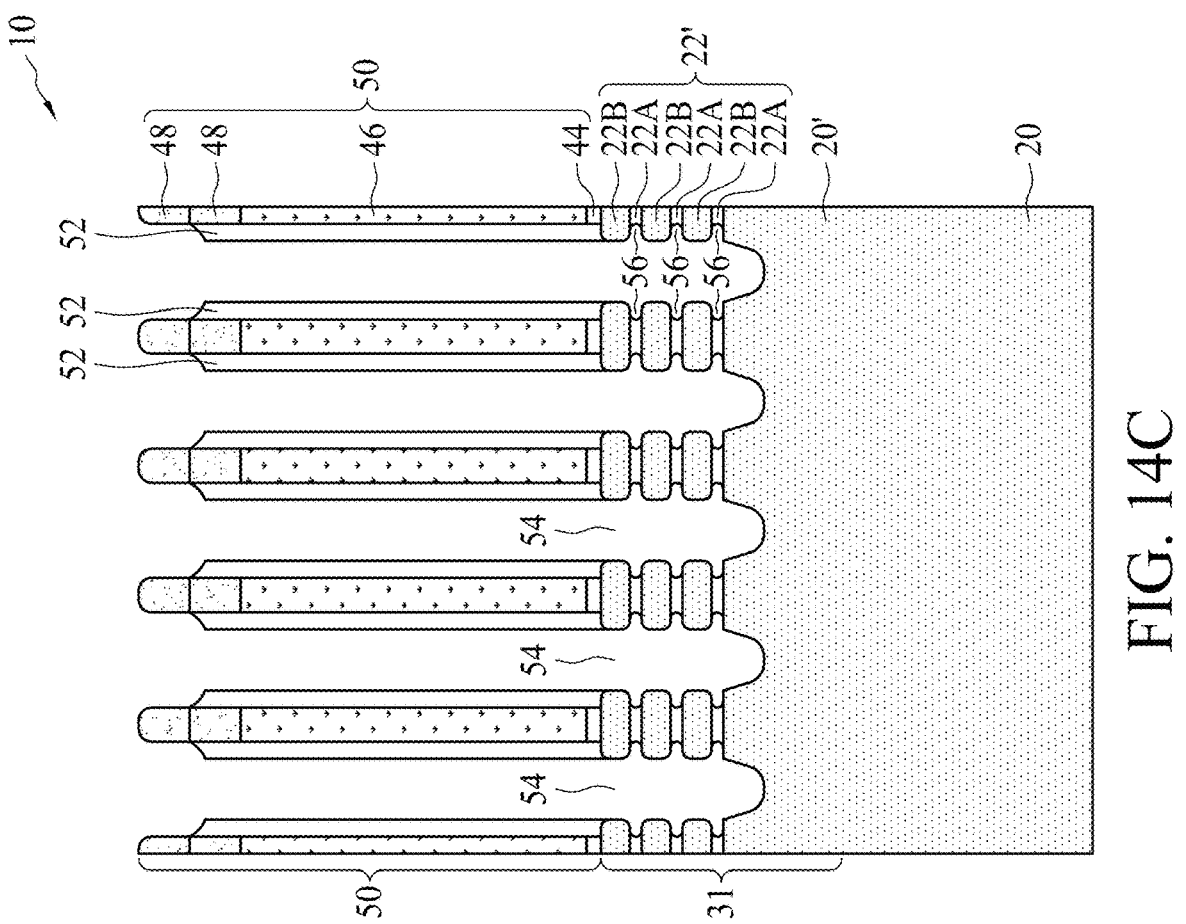
Figure 14B:
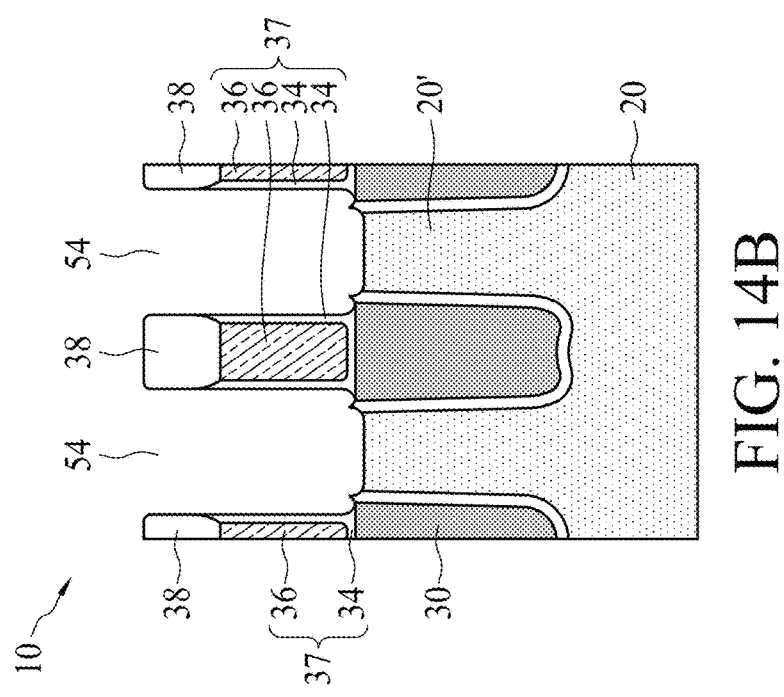

FIGS. 14A, 14B, and 14C illustrate a resulting structure after the formation of gate spacers 52, which are in the plane shown in FIGS. 14A and 14C. Next, the portions of protruding fins 31 (FIGS. 13A, 13B, and 13C) that are not directly underlying dummy gate stacks 50 and gate spacers 52 are recessed through an etching process to form recesses 54, which are between the un-etched portions of protruding fins 31. The respective process is illustrated as process 222 in the process flow 200 as shown in FIG. 29. For example, a dry etch process may be performed using $C_2F_6$, $CF_4$, $SO_2$, the mixture of HBr, Cl$_2$, and O$_2$, the mixture of HBr, Cl$_2$, O$_2$, and $CH_2F_2$, or the like to etch multilayer semiconductor stacks 22' and the underlying substrate strips 20'. The bottoms of recesses 54 are at least level with, or may be lower than (as shown in FIG. 14C), the bottoms of multilayer semiconductor stacks 22'. The etching may be anisotropic, so that the sidewalls of multilayer semiconductor stacks 22' facing recesses 54 are vertical and straight.

After the formation of recesses 54, as also shown in FIG. 14C, sacrificial semiconductor layers 22A are laterally recessed to form lateral recesses 56, which are recessed from the edges of the respective overlying and underlying nanostructures 22B. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). In accordance with alternative embodiments, the lateral recessing of sacrificial semiconductor layers 22A is performed through an isotropic dry etching process or a combination of a dry etching process and a wet etching process.

Figure 15A:
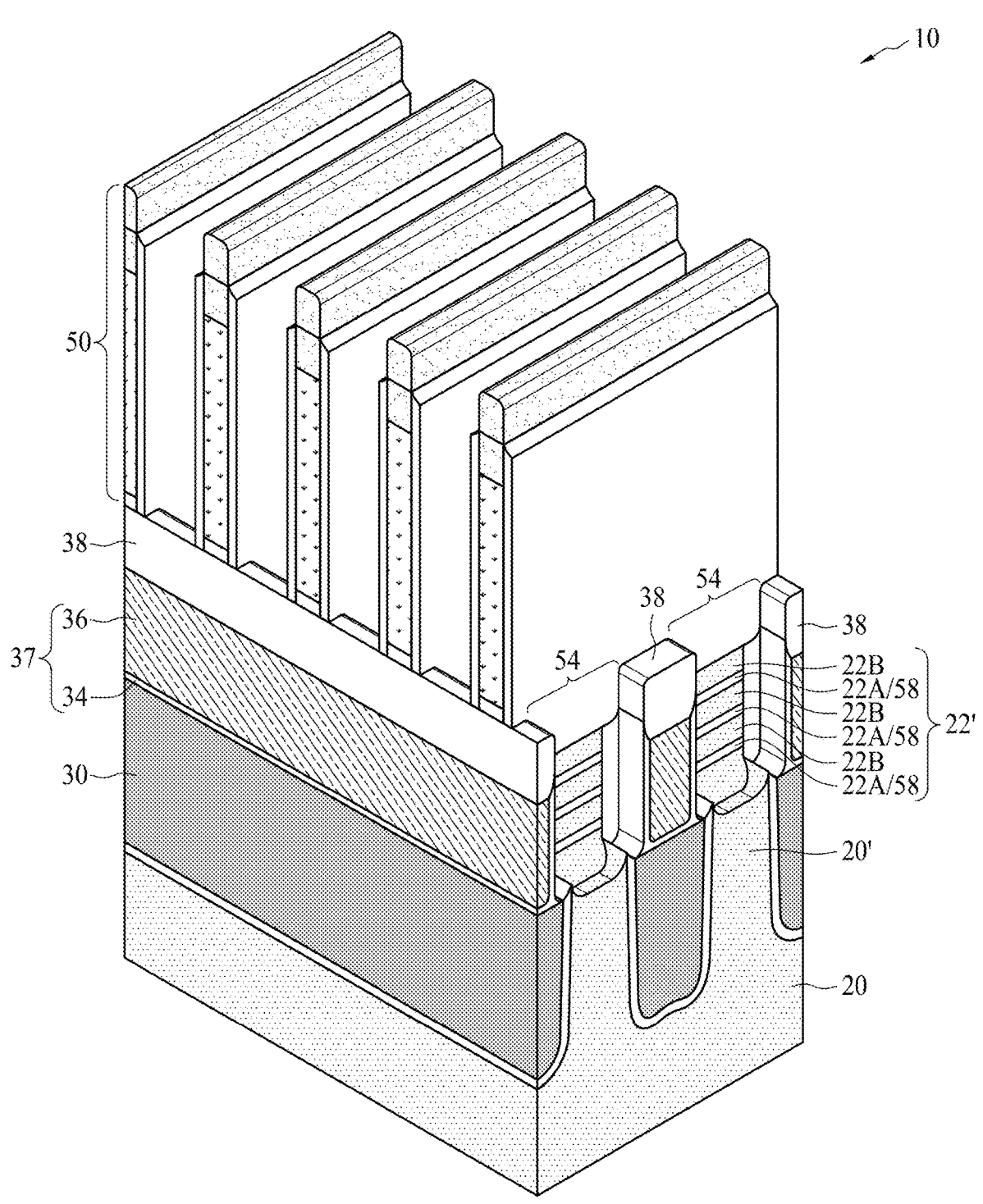
Figure 15C:
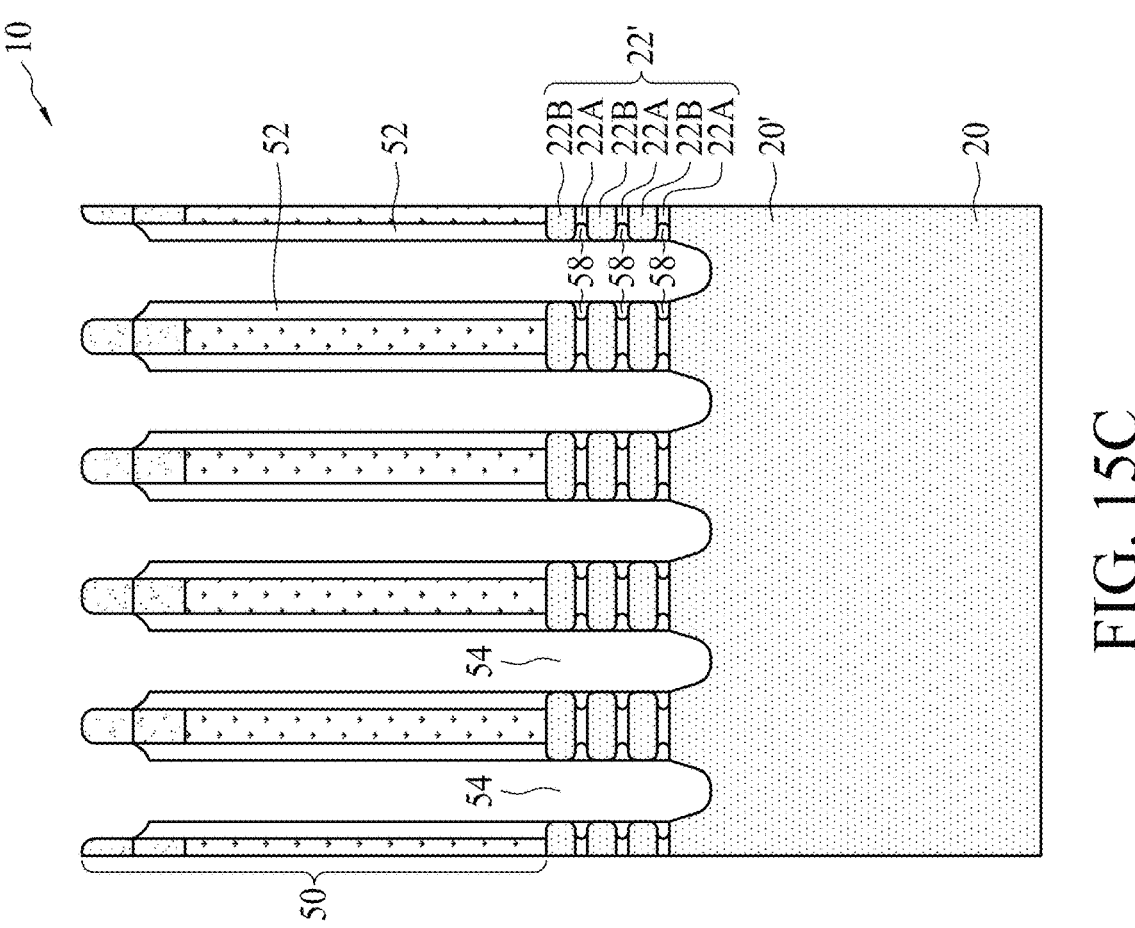
Figure 15B:
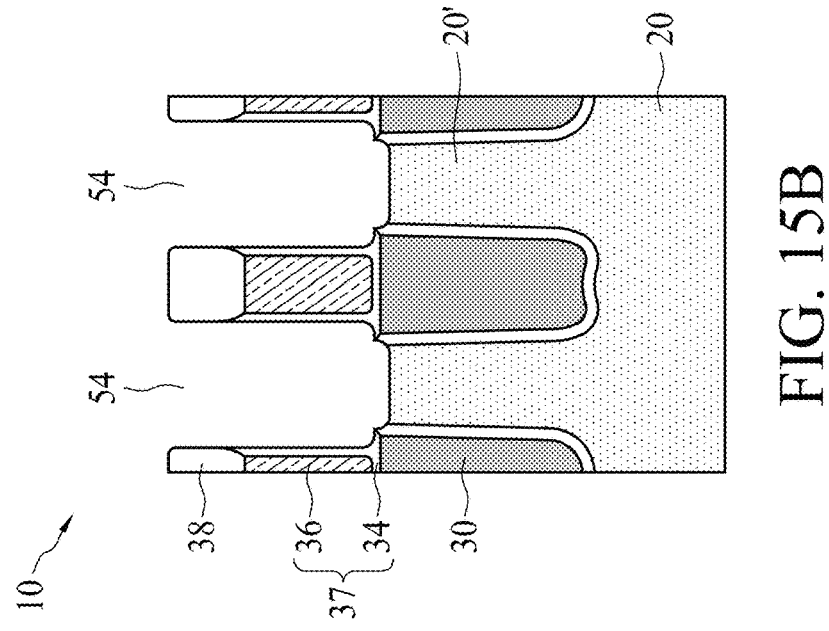

FIGS. 15A, 15B, and 15C illustrate the formation of inner spacers 58. The respective process is illustrated as process 224 in the process flow 200 as shown in FIG. 29. The formation process incudes depositing a spacer layer extending into recesses 56, and performing an etching process to remove the portions of inner spacer layer outside of recesses 56, thus leaving inner spacers 58 in recesses 56. Inner spacers 58 may be formed of or comprise SiOCN, SiON, SiOC, SiCN, or the like. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 16A:
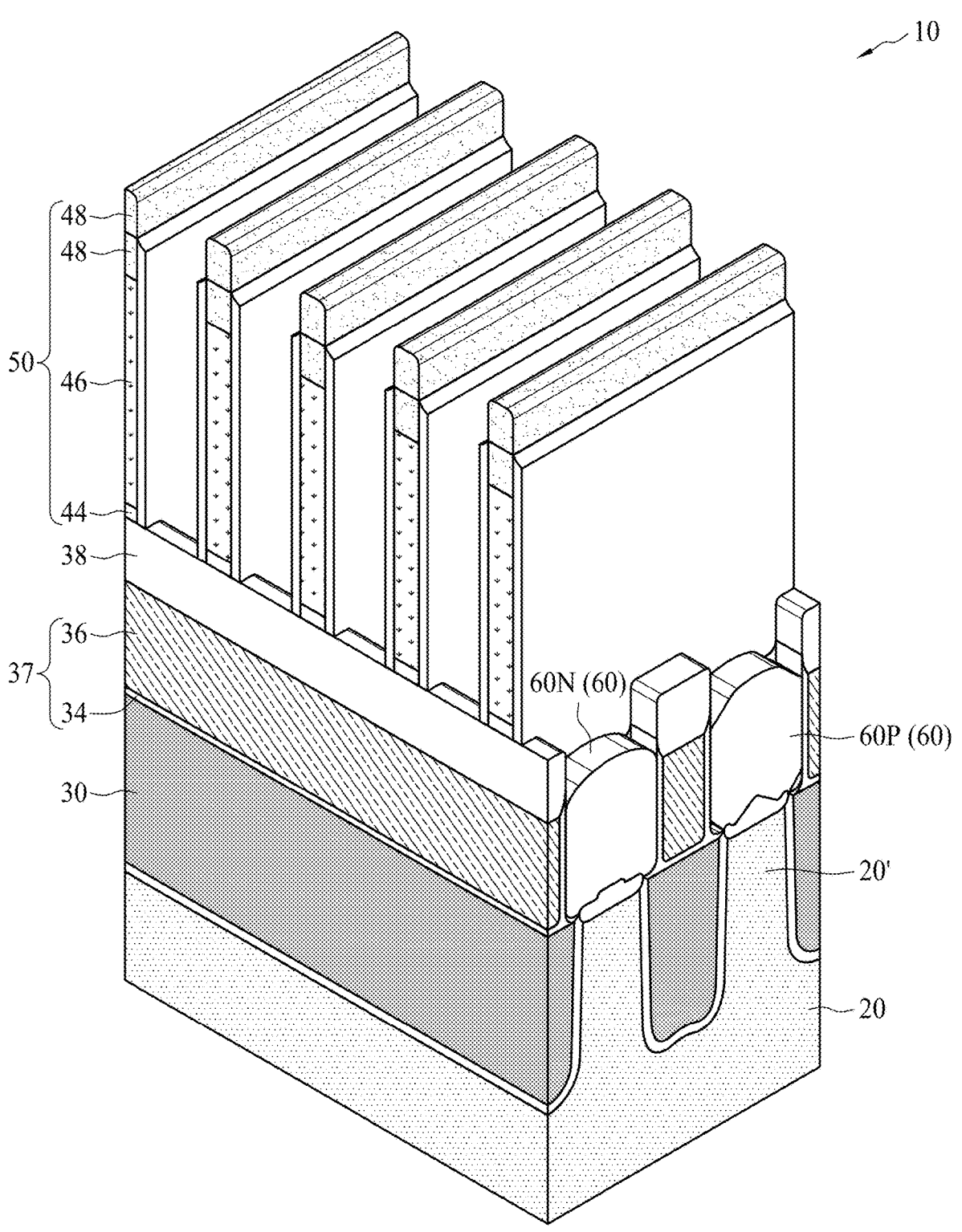
Figure 16C:
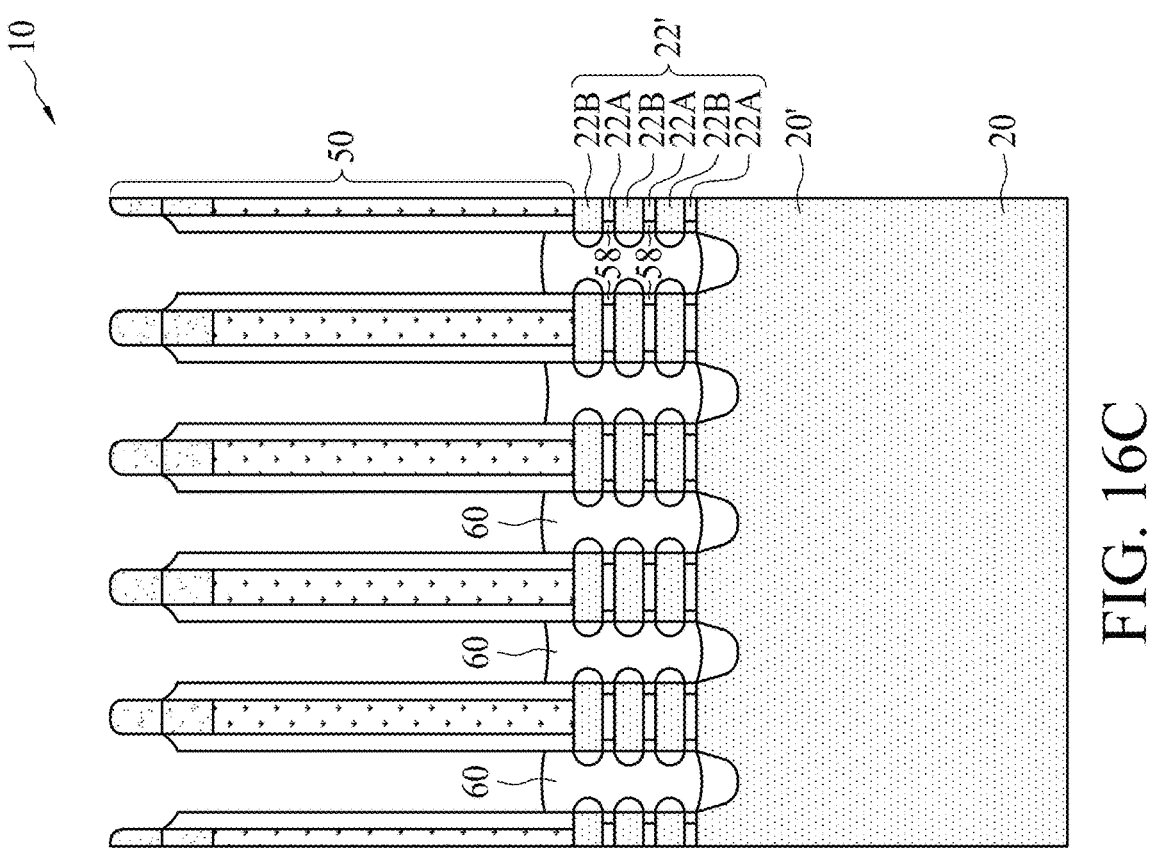
Figure 16B:
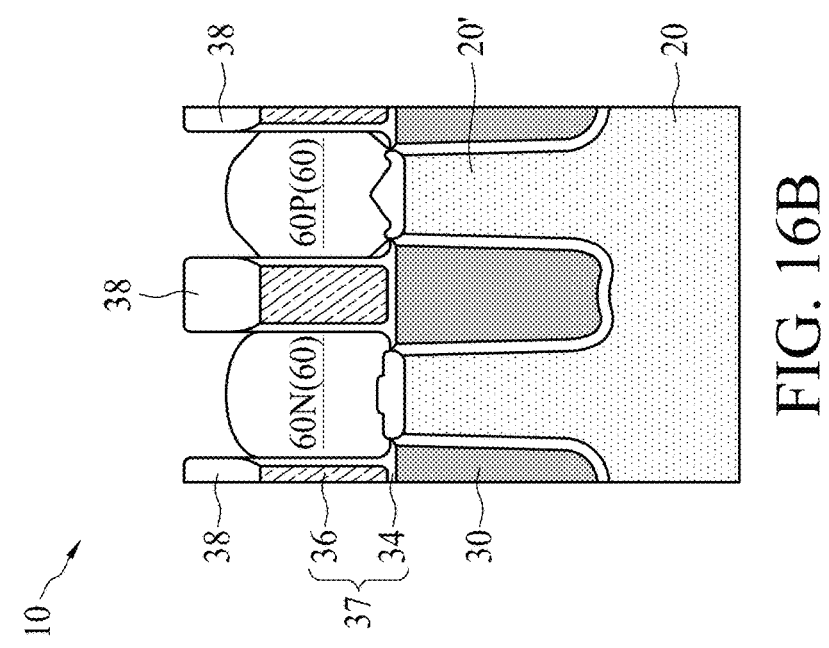

Referring to FIGS. 16A, 16B, and 16C, epitaxial source/drain regions 60 are formed in recesses 54. The respective process is illustrated as process 226 in the process flow 200 as shown in FIG. 29. Source/drain region(s) may refer to a source or a drain, individually or collectively dependent upon the context. In accordance with some embodiments, the source/drain regions 60 may exert stress on the nanostructures 22B, which are used as the channels of the corresponding GAA transistors, thereby improving performance. When the resulting transistors are n-type transistors, epitaxial source/drain regions 60 are formed to be n-type by doping an n-type dopant. For example, the n-type source/drain regions 60 may be formed of or comprise silicon phosphorous (SiP), silicon carbon phosphorous (SiCP), or the like. When the resulting transistors are p-type transistors, epitaxial source/drain regions 60 are formed to be p-type by doping a p-type dopant. For example, the p-type source/drain regions 60 may be formed of or comprise silicon germanium boron (SiGeB), silicon boron (SiB), or the like. FIGS. 16A and 16B schematically illustrate an n-type epitaxial source/drain region 60N and a p-type epitaxial source/drain regions 60P as an example.

Figure 17A:
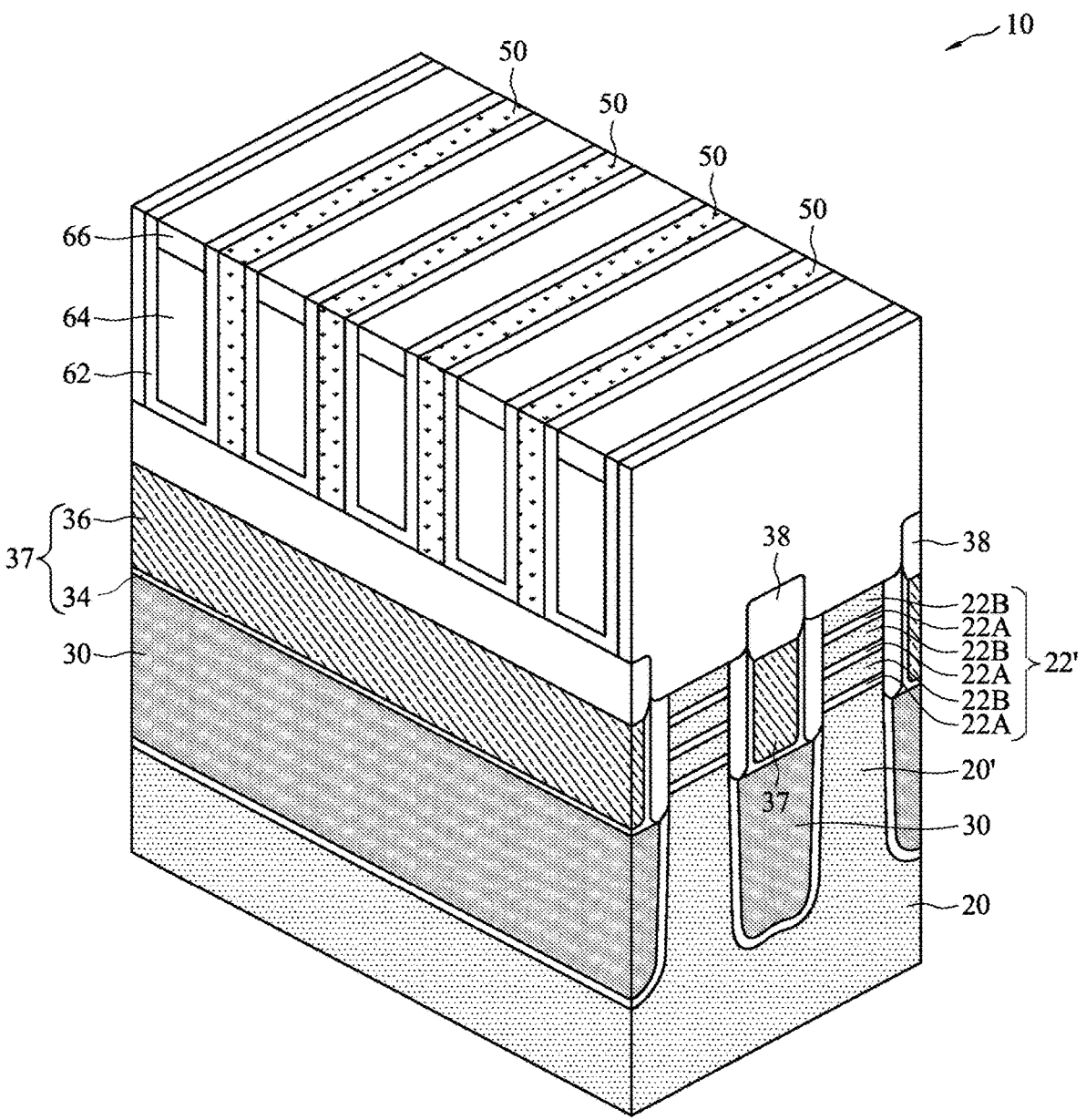
Figure 17C:
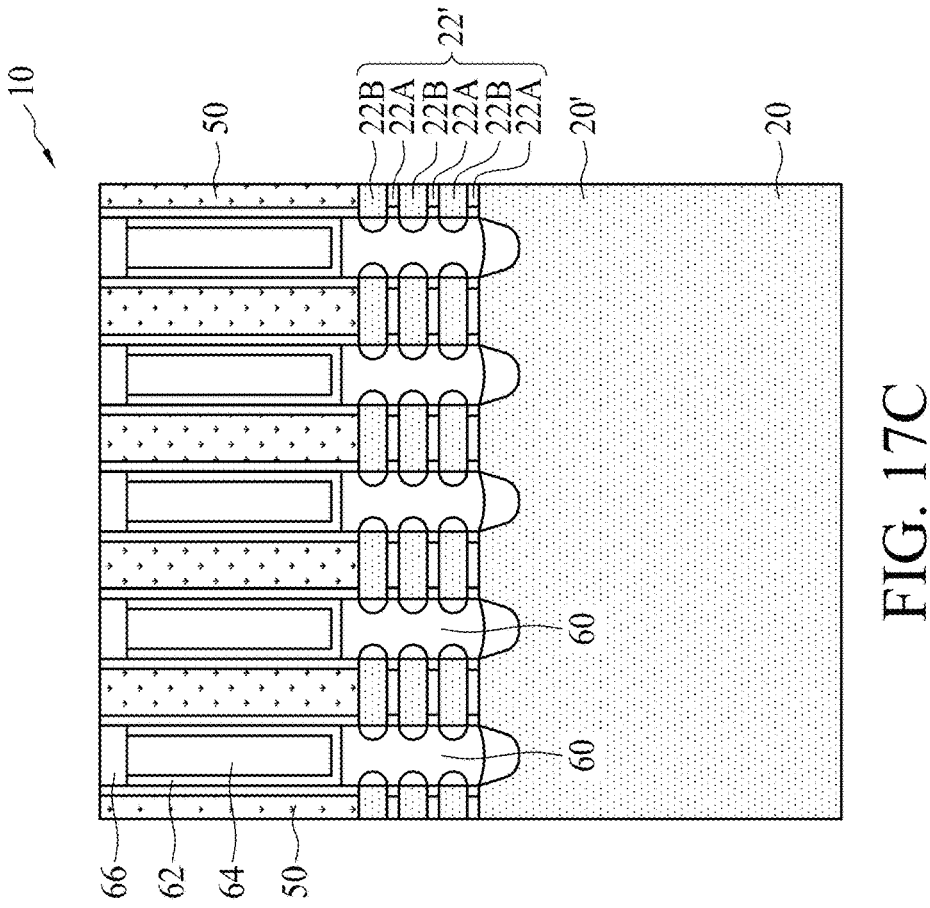
Figure 17B:
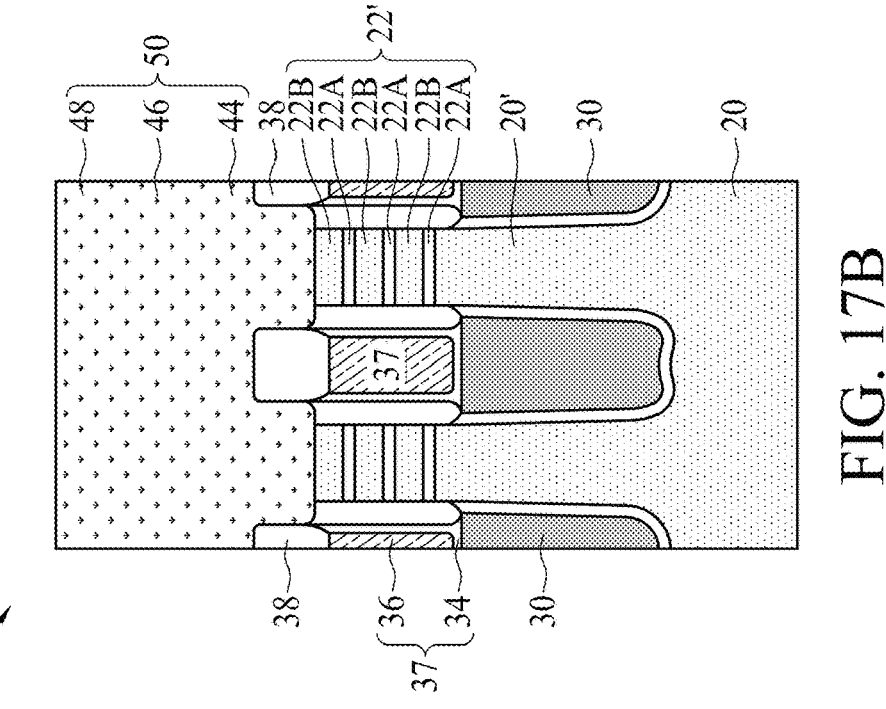

FIGS. 17A, 17B, and 17C illustrate the cross-sectional views of the structure after the formation of Contact Etch Stop Layer (CESL) 62 and Inter-Layer Dielectric (ILD) 64. The respective process is illustrated as process 228 in the process flow 200 as shown in FIG. 29. CESL 62 may be formed of silicon oxide, silicon nitride, silicon carbo-nitride, or the like, and may be formed using CVD, ALD, or the like. ILD 64 may include a dielectric material formed using, for example, FCVD, spin-on coating, CVD, or any other suitable deposition method. ILD 64 may be formed of an oxygen-containing dielectric material, which may include a silicon-oxide, Phospho-Silicate Glass (PSG), Boro-Silicate Glass (BSG), Boron-Doped Phospho-Silicate Glass (BPSG), Undoped Silicate Glass (USG), or the like. The formation of CESL 62 and ILD 64 include depositing a conformal CESL 62, depositing ILD 64, and performing a planarization process. In accordance with some embodiments, hard masks 66 are formed, and may be formed of or comprise silicon nitride, silicon oxynitride, silicon oxycarbide, or the like. The formation process may include recessing ILD 64 to form recesses, depositing the corresponding dielectric material into the recesses, and performing a planarization process.

Figure 18A:
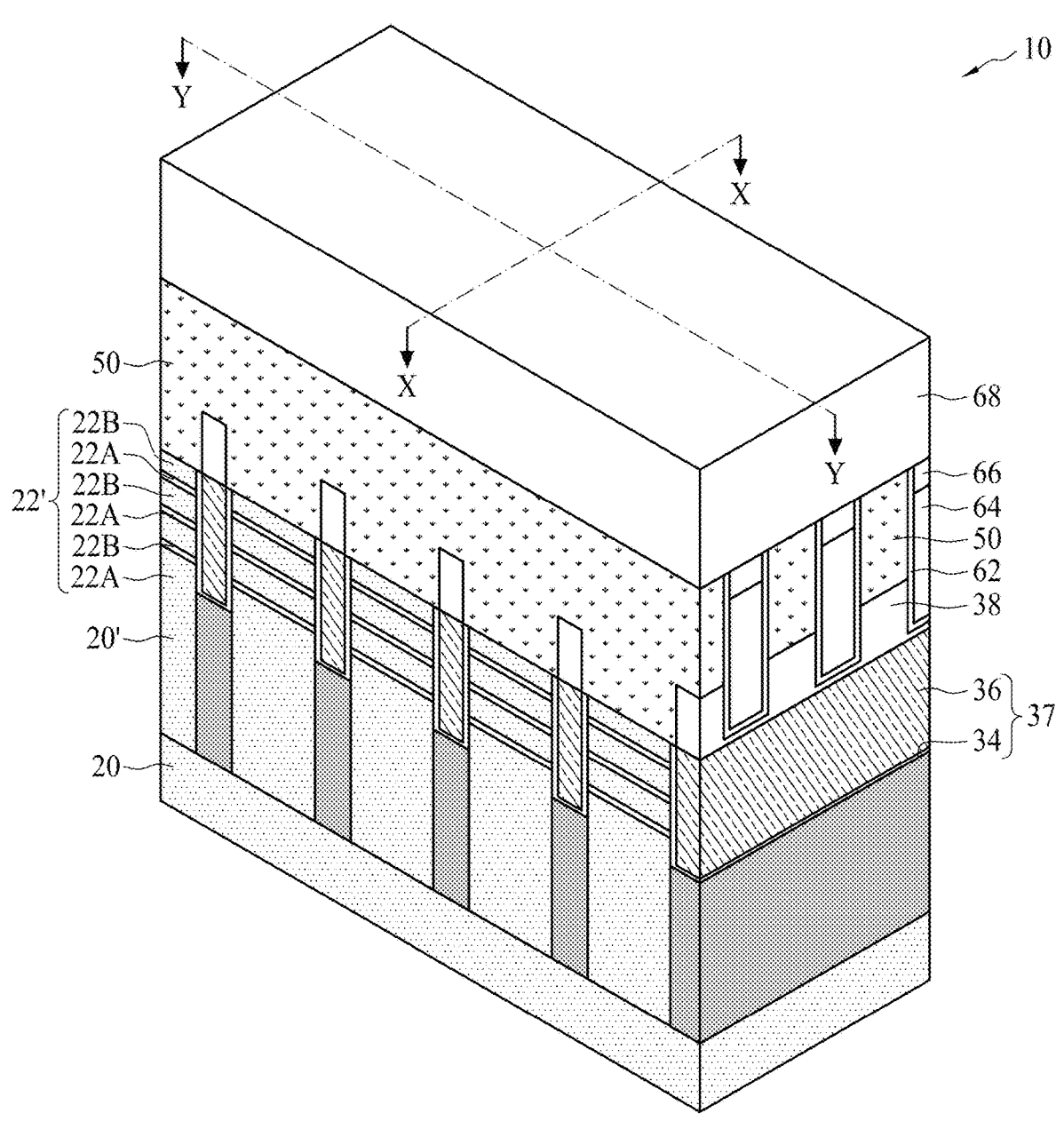
Figures 18B, 18C:
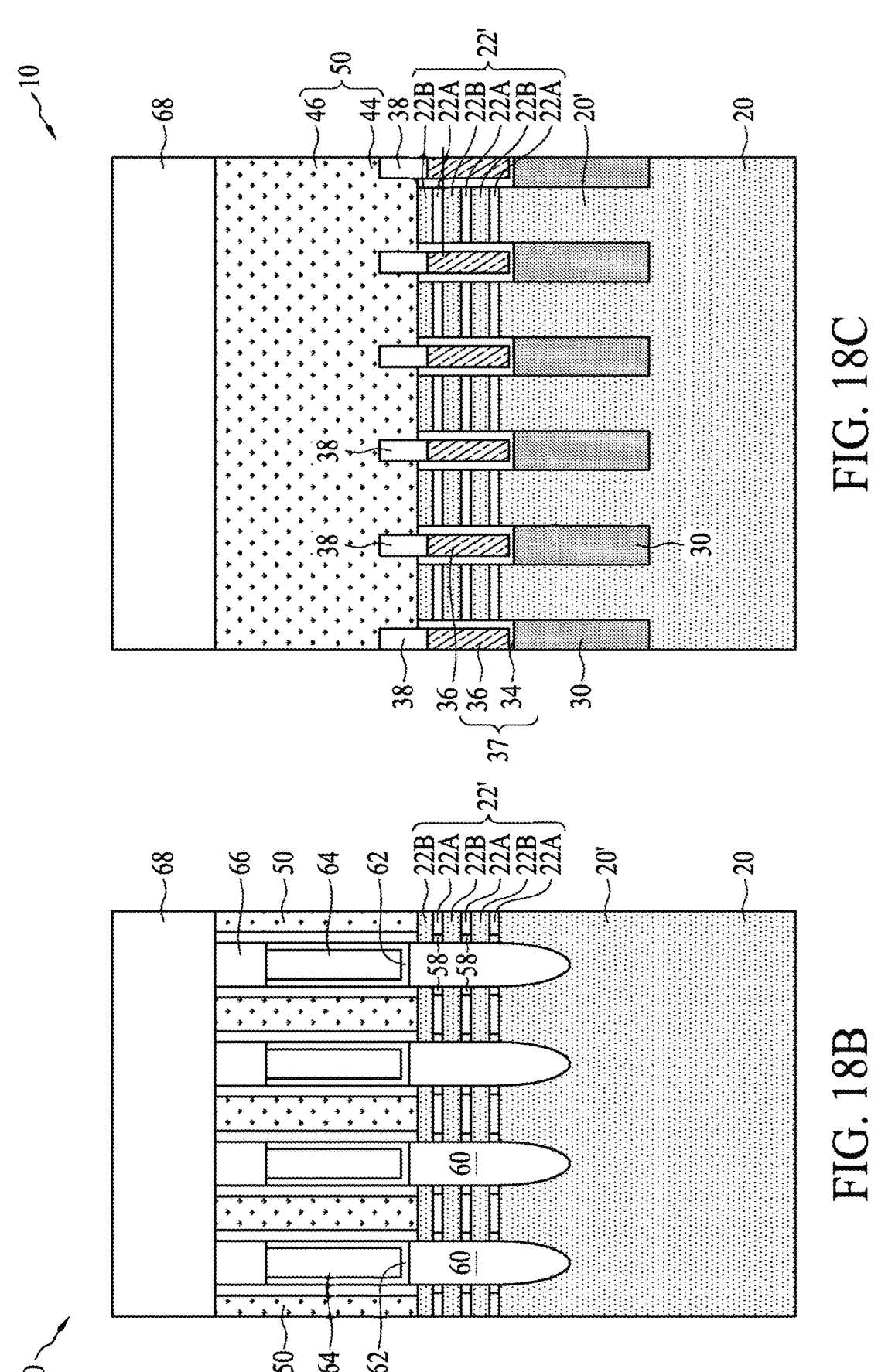

FIGS. 18A, 18B, and 18C through 22A, 22B, and 22C illustrate the formation of fin isolation regions 84 in dummy gate stack 50 and the underlying isolation regions 86 (FIGS. 23A, 23B, and 23C), which regions cut through and electrically isolation neighboring protruding fins. The isolation regions are also referred to as Cut-Poly on Diffusion Edge (CPODE) regions since the formation process involves the cutting of polysilicon dummy gate electrode on the edge of active regions. FIGS. 18A, 18B, and 18C illustrate the deposition of hard mask 68. The respective process is illustrated as process 230 in the process flow 200 as shown in FIG. 29. It is appreciated that FIG. 18A is rotated by around 90 degrees compared to FIG. 17A. Furthermore, FIG. 18B illustrates the plane having epitaxy source/drain regions 60, as compared to FIG. 17B, which shows STI regions 30. FIG. 18C illustrates the plane having STI regions 30, as compared to FIG. 17C, which shows epitaxy source/drain regions 60. In FIGS. 18A, 18B, and 18C, hard masks 48 are not shown separately since they may be formed of the same material as hard mask 68, and are considered as parts of hard mask 68.

Figure 19A:
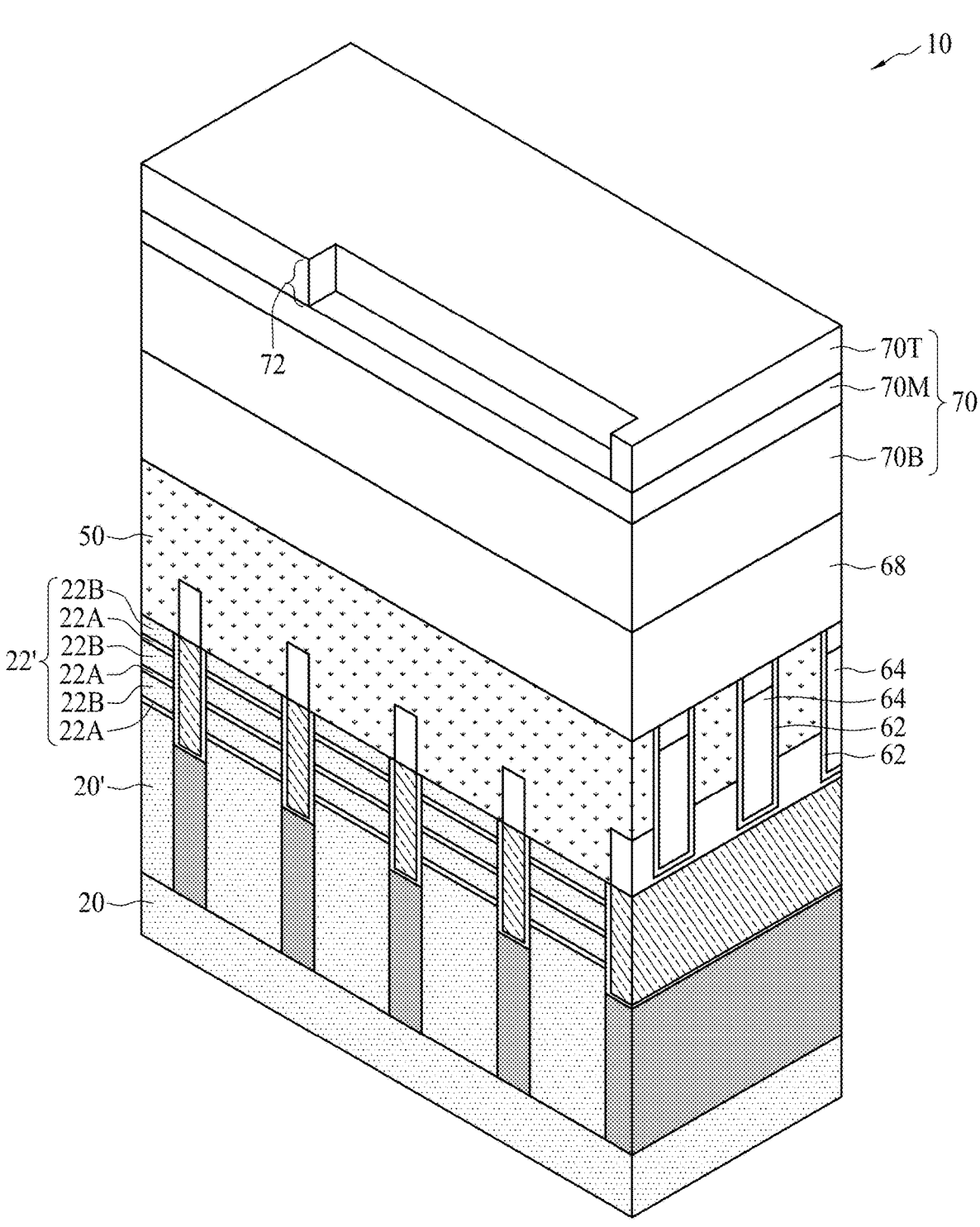
Figure 19C:
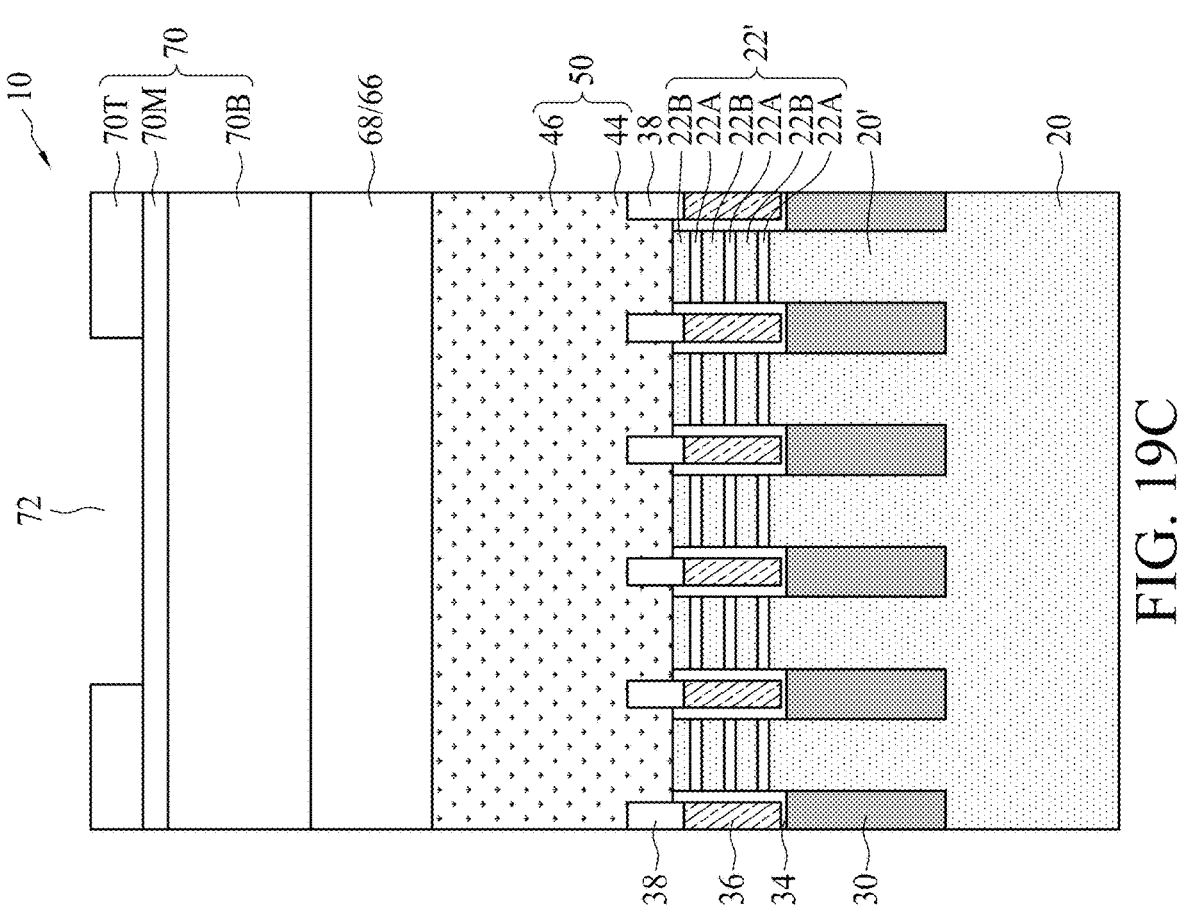
Figure 19B:
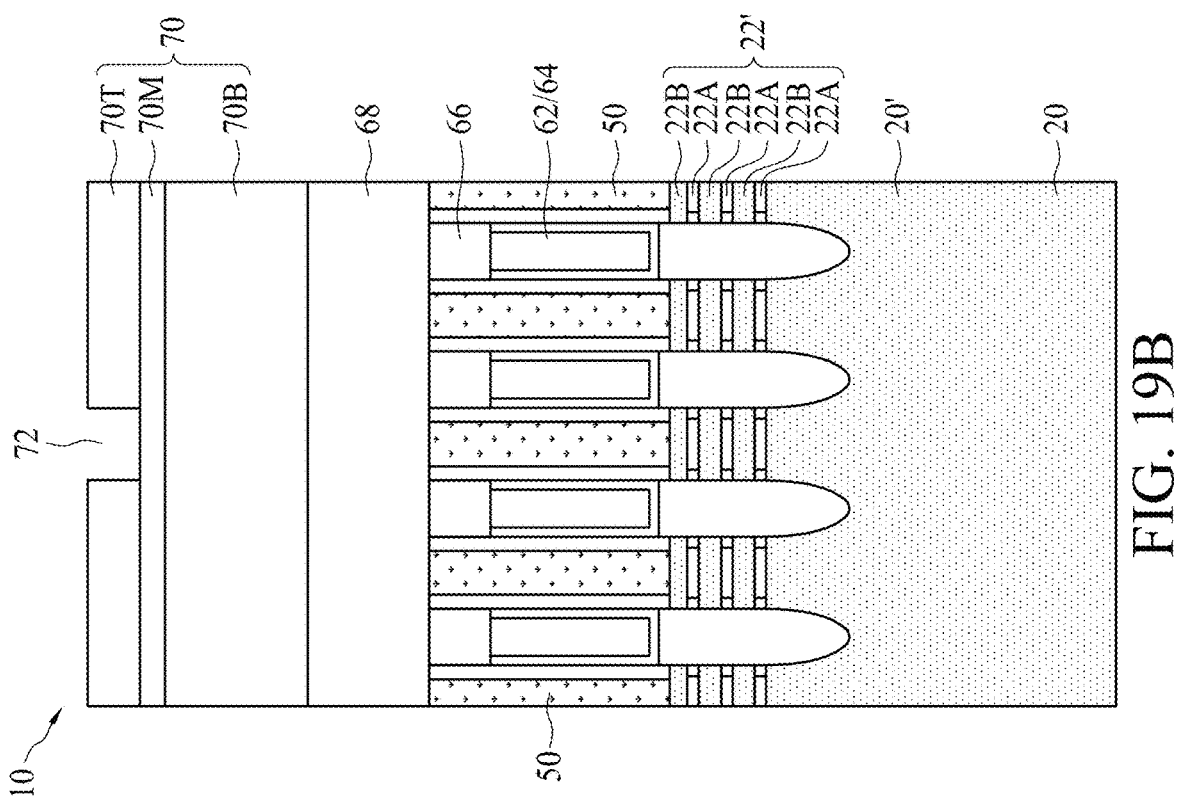

FIGS. 19A, 19B, and 19C illustrate the formation of etching mask 70. The respective process is illustrated as process 232 in the process flow 200 as shown in FIG. 29. In accordance with some embodiments, etching mask 70 is a tri-layer etching mask, which includes bottom layer 70B, middle layer 70M, and top layer 70T. Bottom layer 70B may be formed of a cross-linked photoresist. Middle layer 70M may be formed of an inorganic dielectric material. Top layer 70T is formed of a patterned photoresist, which has trench 72 therein.

In accordance with some embodiments, hard mask 68 is formed of or comprises silicon nitride, silicon oxynitride, or the like. Also, in FIGS. 18A, 18B, and 18C and the subsequent figures, the Figures whose reference numbers include letter A show perspective views. The Figures whose reference numbers include letter B illustrate the cross-sectional views obtained from the plane X-X (FIG. 18A) in the corresponding perspective view. The Figures whose reference numbers include letter C illustrate the cross-sectional views obtained from the plane Y-Y in FIG. 18A) in the corresponding perspective view.

FIGS. 19A, 19B, and 19C illustrate the formation of etching mask 70. The respective process is illustrated as process 232 in the process flow 200 as shown in FIG. 29. In accordance with some embodiments, etching mask 70 is a tri-layer etching mask, which includes bottom layer 70B, middle layer 70M, and top layer 70T. Bottom layer 70B may be formed of a cross-linked photoresist. Middle layer 70B may be formed of an inorganic dielectric material. Top layer 70B is formed of a patterned photoresist, which has trench 72 therein.

Figure 26B:
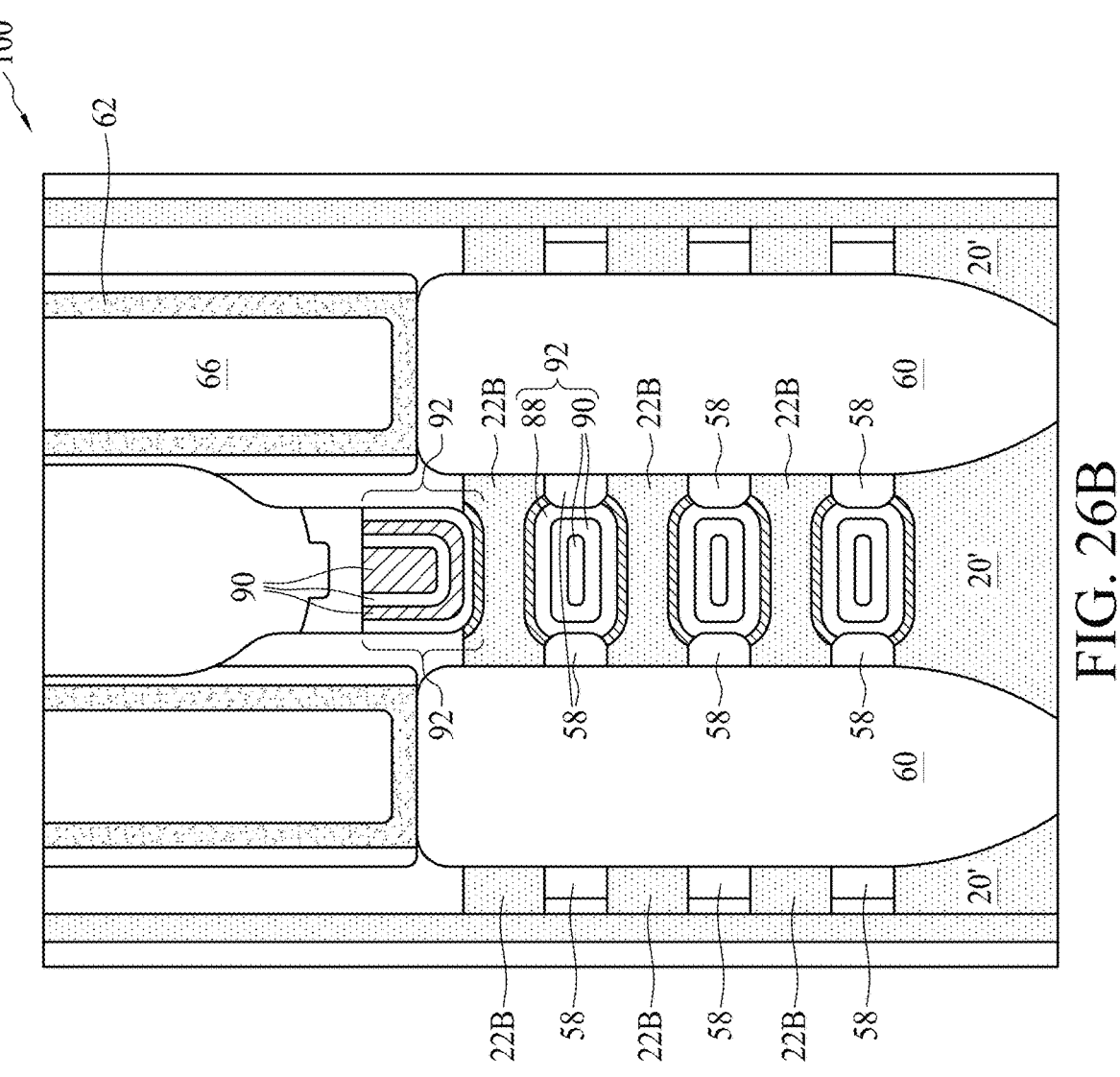
Figure 27:
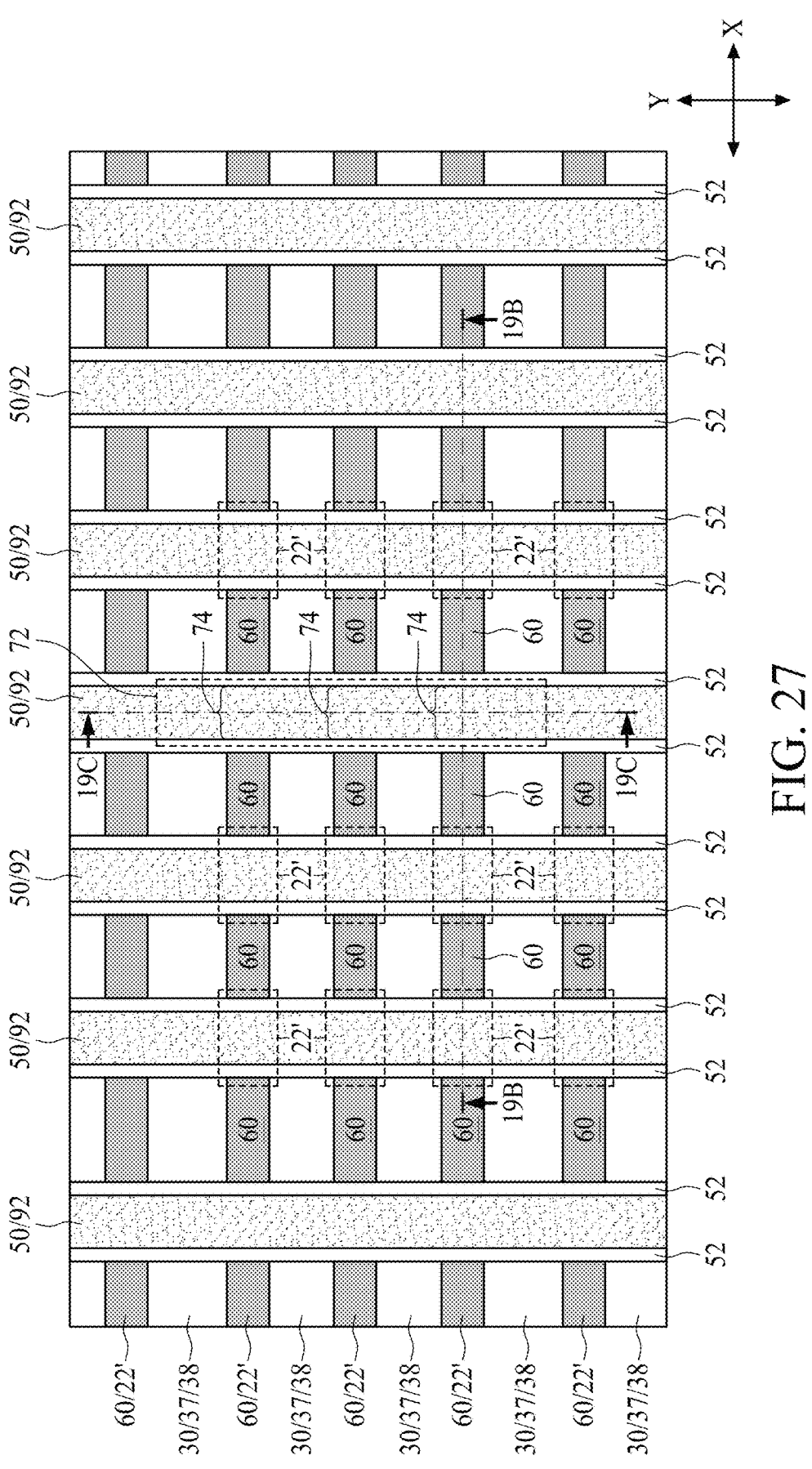
FIGS. 27 and 28 illustrates top views in accordance with some embodiments.

FIG. 27 illustrates a top view of the structure shown in FIGS. 19A, 19B, and 19C. Multilayer stacks 22' and epitaxy source/drain regions 60 are interconnected to form elongated strips having their lengthwise directions in the X-direction (also refer to FIG. 18A, with the vertical plane X-X in the X-direction. Dummy gate stacks 50 have their lengthwise directions in the Y-direction perpendicular to the X-direction. It is appreciated that the formation of CPODE regions may be performed on dummy gate stacks 50, or alternatively, performed on replacement gate stacks. Accordingly, the gate stacks shown in FIG. 27 are denoted as 50/92 to indicate that the gate stacks may be dummy gate stacks 50 or replacement gate stacks 92 (FIG. 26B) when the cutting process is performed. It is appreciated that FIG. 27 illustrates a simplified view of forming a transistor, wherein the actual layout such as the positions of opening 72 may be different than illustrated.

In accordance with some embodiments, etching mask 68 covers the illustrated region in FIG. 19A, except that opening 72 is formed to extend crossing multiple multilayer stacks 22'. The cross-sectional view shown in FIG. 19B may be obtained from the plane containing line 19B-19B in FIG. 27, and the cross-sectional view shown in FIG. 19C may be obtained from the plane containing line 19C-19C in FIG. 27.

Figure 20A:
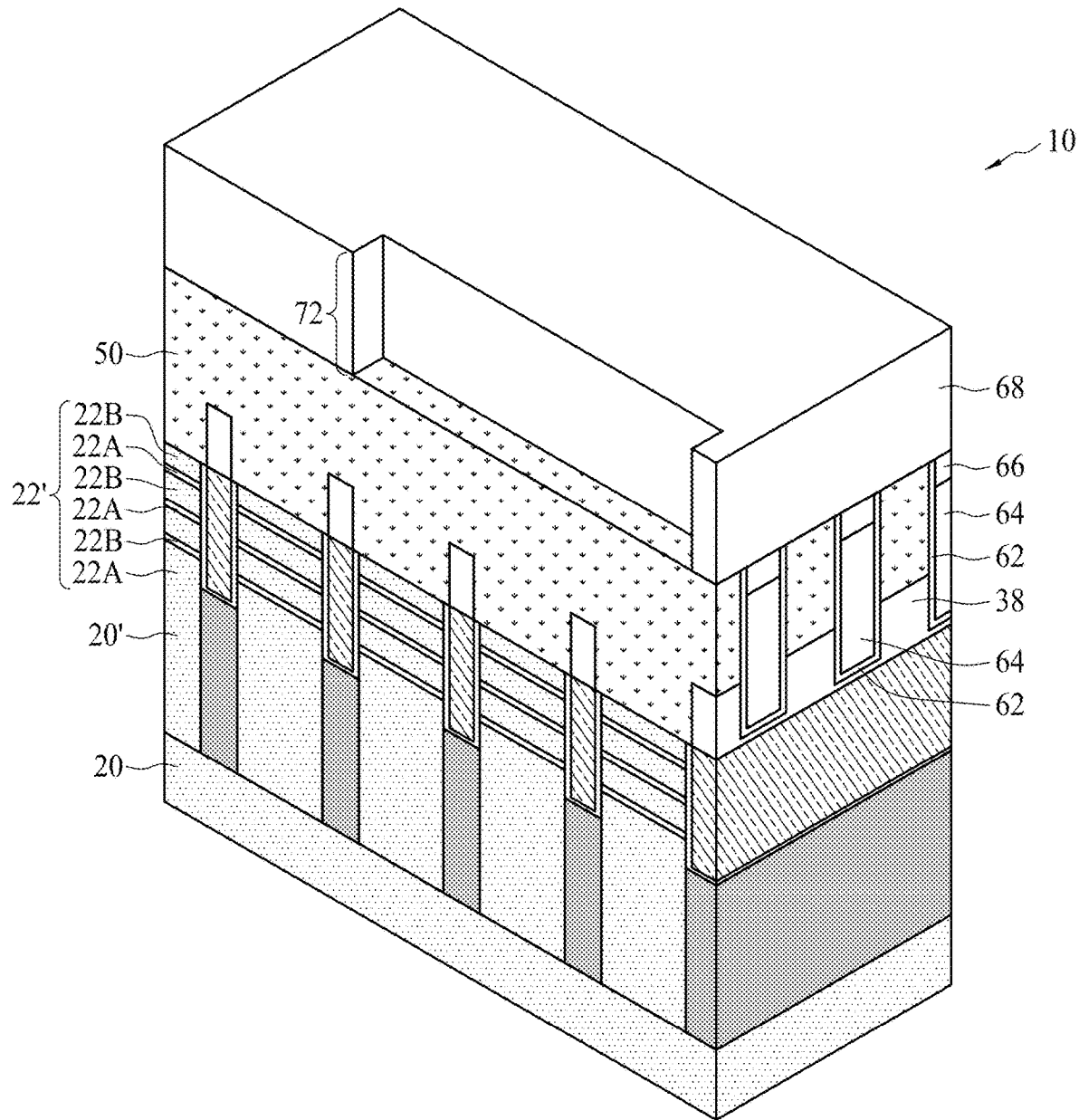
Figures 20B, 20C:
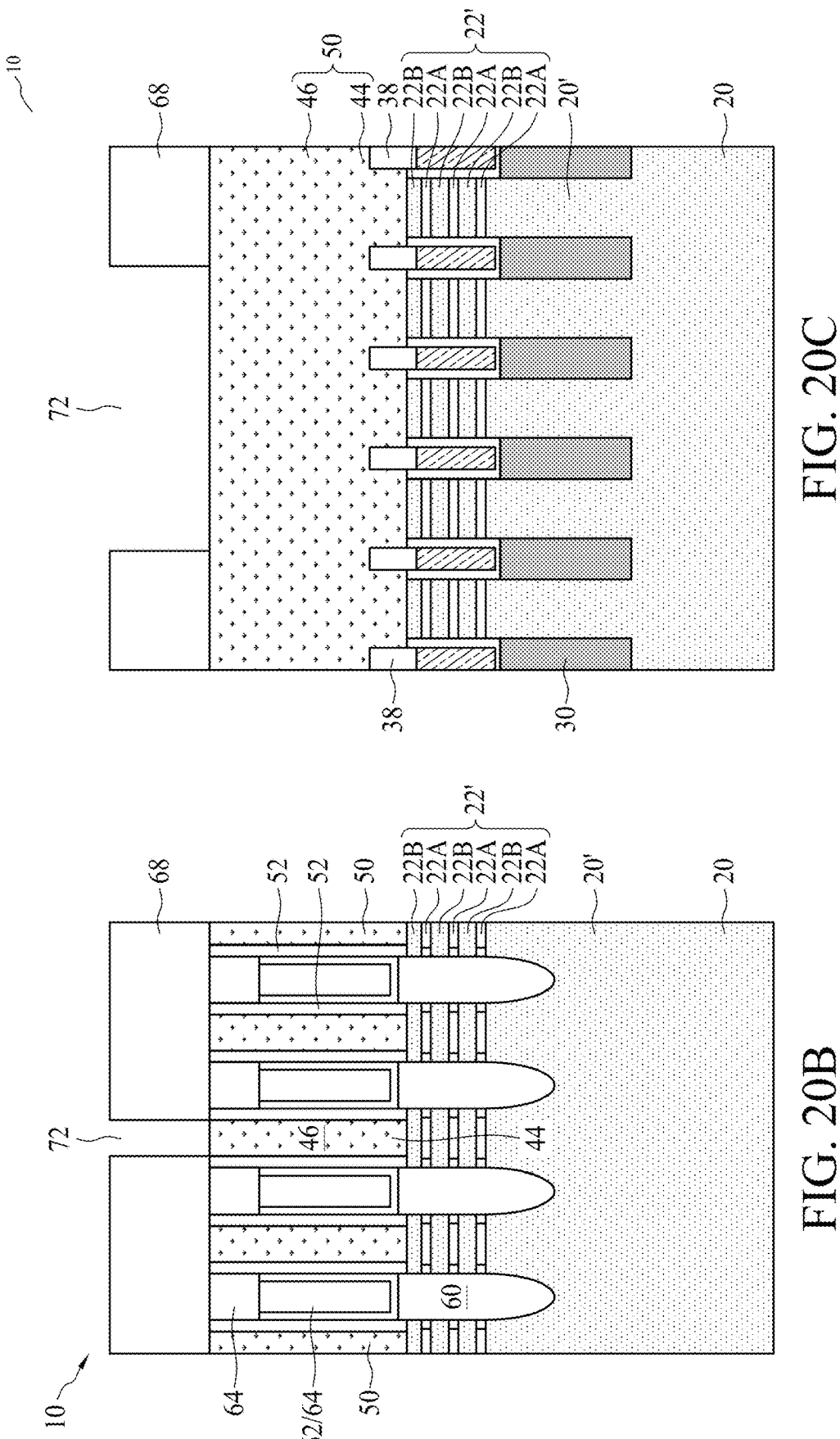

Next, the top layer 70T (FIGS. 19A, 19B, and 19C) is used as an etching mask to etch middle layer 70M and bottom layer 70B. During the etching process, top layer 70T (and possibly middle layer 70M) may be consumed, leaving bottom layer 70B, which includes trench 72 transferred from top layer 70T. The remaining etching mask 70 is then used to etch hard mask 68, so that trench 72 is further transferred into hard mask 68. The respective process is illustrated as process 234 in the process flow 200 as shown in FIG. 29. The remaining etching mask 70 is then removed, and the resulting structure is shown in FIGS. 20A, 20B, and 20C.

Figure 21A:
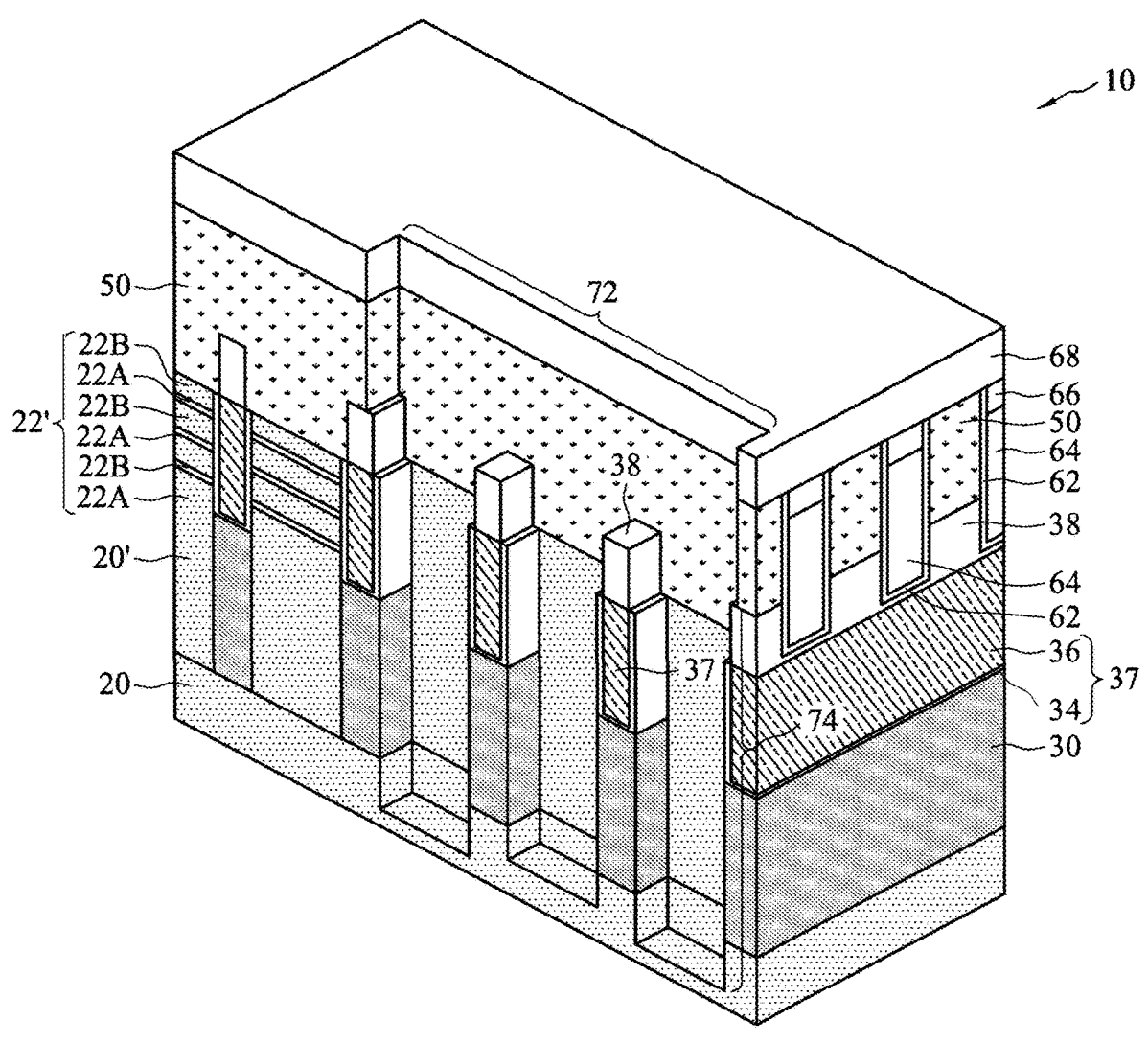
Figures 21B, 21C:
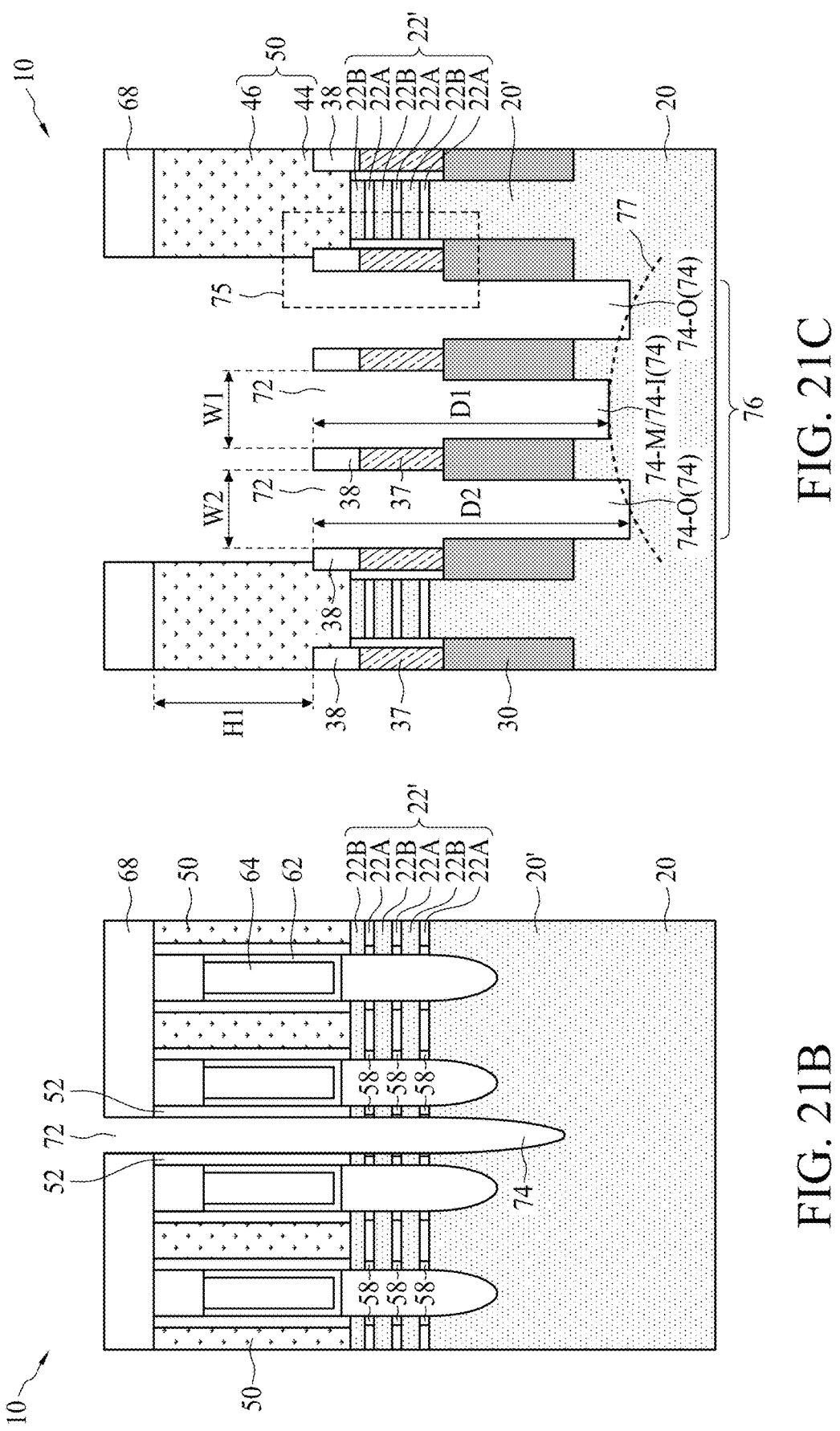

Referring to FIGS. 21A, 21B, and 21C, hard mask 68 is used as an etching mask to etch the underlying structure to form trenches 72 and 74. The respective process is illustrated as process 236 in the process flow 200 as shown in FIG. 29. First, gate stack 50 is etched, so that trench 72 further extends down into gate stack 50. The portion of trench 72 in gate stack 50 is also referred to as a through-gate trench. The formation process is anisotropic, so that gate stack 50 has vertical sidewalls. The etching of gate electrode 46 (FIGS. 20B and 20C), when formed of polysilicon or amorphous silicon, may be performed using fluorine ($F_2$), Chlorine ($Cl_2$), hydrogen chloride (HCl), hydrogen bromide (HBr), Bromine ($Br_2$), $C_2F_6$, $CF_4$, $SO_2$, or combinations thereof.

After the etching of the gate electrode 46, the dummy gate dielectric 44 (FIGS. 20B and 20C) and any native oxide formed on the surfaces of multilayer stacks 22' are removed through an etching process. The corresponding process is also referred to as a dielectric break-through process. In accordance with some embodiments, the etching may be performed using $CF_4$, Ar, and/or the like, and the etching may have a low selectivity. For example, the flow rate of $CF_4$ may be in the range between about 0 sccm and about 200 sccm, with 0 sccm meaning no $CF_4$ is used, and the corresponding process is a sputtering process. The flow rate of argon may be in the range between about 100 sccm and about 1,000 sccm.

After the dielectric-break through process, high-k dielectric regions 38 are revealed. Multilayer stacks 22' are also revealed to trench 72. Next, multilayer stacks 22' are etched. The semiconductor strips 20' and the underlying bulk portion of substrate 20, which bulk portion is underlying STI regions 30, are also etched. In accordance with some embodiments, the etching process is performed by selecting process conditions, so that there is a high etching selectivity between etching semiconductor materials and etching dielectric materials. Accordingly, high-k dielectric regions 38, inner spacers 58 (FIG. 21B), and STI regions 30, etc., which are revealed in the etching process, are not etched. Trenches 74, which are also referred to as through-gate trenches, are thus formed. Trenches 74 are also shown in FIG. 27.

In accordance with some embodiments, the etching of multilayer stacks 22', semiconductor strips 20', and the underlying bulk portion of substrate 20 are performed using HBr, $O_2$, and Ar. In the etching of semiconductor strips 20' and the underlying bulk portion of substrate 20, $CO_2$ may also be added in addition to $O_2$ or replacing $O_2$. The etching processes may also be performed using other etching gases such as $F_2$, $Cl_2$, HCl, HBr, $Br_2$, $C_2F_6$, $CF_4$, $SO_2$, $O_2$, $CH_2F_2$ etc., or combinations thereof. In accordance with some embodiments, the flow rate of HBr may be in the range between about 100 sccm and about 1,000 sccm, the flow rate of $CO_2$ and/or $O_2$ may be in the range between about 0 sccm and about 100 sccm, the flow rate of Ar may be in the range between about 100 sccm and about 1,000 sccm. The etching is performed through plasma etching, for example, using Inductive Coupled Plasma (ICP). The etching is performed with a bias power applied to achieve anisotropic etching.

Figure 25:
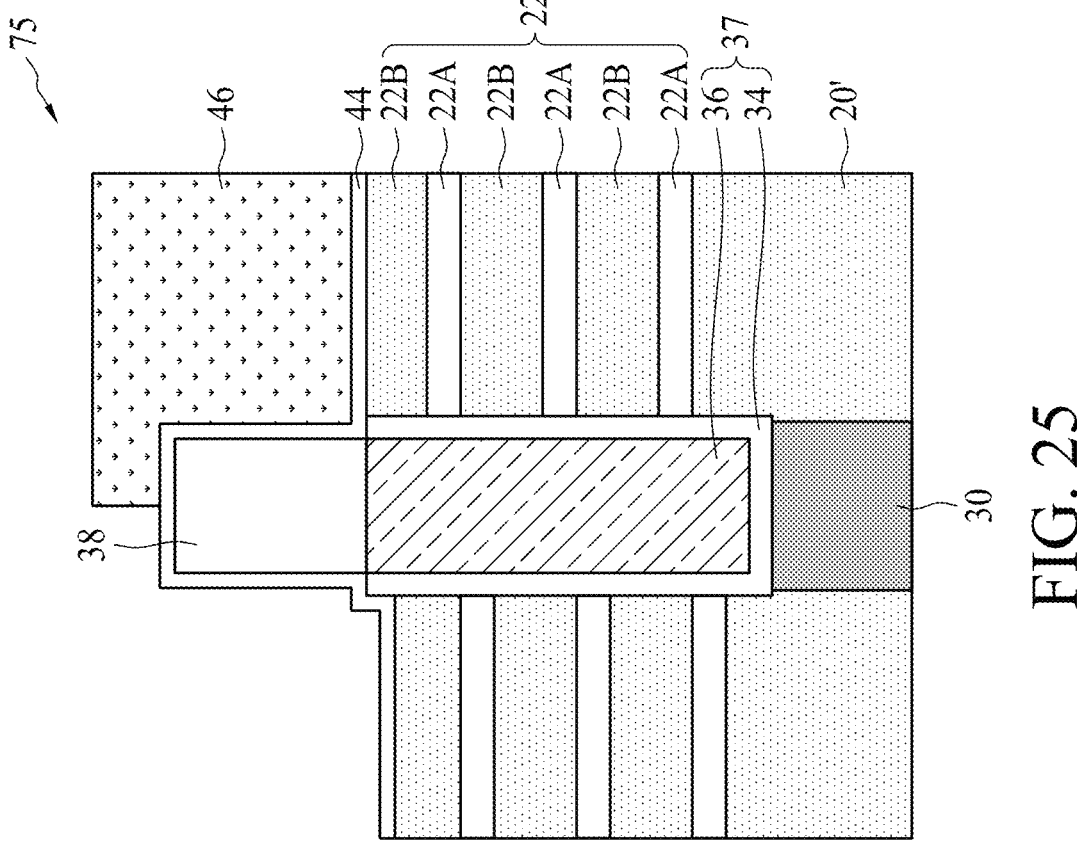
FIG. 25 illustrates a magnified view of a portion of a structure on a side of a trench in accordance with some embodiments.

FIG. 25 illustrates a magnified view of region 75 in FIG. 21C. The magnified view is obtained before the etching of semiconductor strips 20' and the underlying bulk portion of substrate 20.

Referring back to FIGS. 21A, 21B, and 21C, trench 72 is in gate stack 72. Trenches 74 are underlying and joined to trench 72, and are separated from each other by high-k dielectric regions 38, dielectric regions 37, and STI regions 30. Trenches 74 extend to levels lower than the bottom surface of STI regions 30, so that the isolation regions formed therein may block the leakage current in the bulk portion of semiconductor substrate 20. Trenches 74 collectively form a trench group 76, which includes two outmost trenches 74-O on the outmost sides of trench group 74, and at least one or more inner trench(es) 74-I between the outmost trenches 74-O. The trenches 74 in the same trench group 76 may (or may not) have substantially uniform pitch (for example, with variation smaller than about 20 percent).

Figure 24:
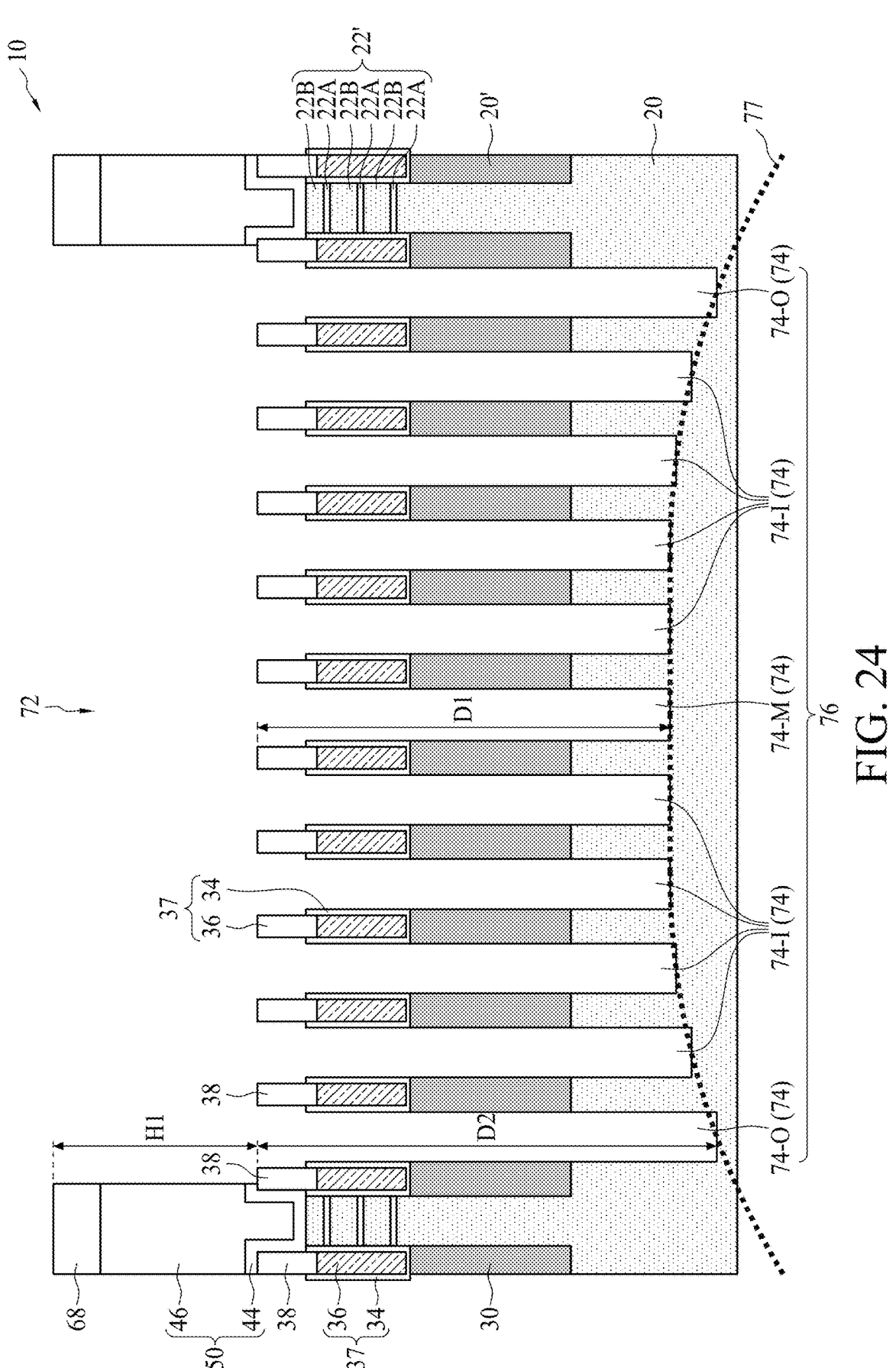
FIG. 24 illustrates a profile of a plurality of trenches in a trench group in accordance with some embodiments.

Inner trench(es) 74-I also include one middle trench or two middle trenches 74M, with the trenches on the opposite sides of the middle trench(es) having the same count. For example, when the total count of trenches 74 in the same trench group 76 is an odd number, there is one middle trench. Otherwise, when the total count of trenches 74 in the same trench group 76 is an even number, there are two middle trenches. Throughout the description, when the term "middle trench" is referred to, it refers to one or two trenches in the middle, depending on whether the total count of trenches is an odd number or an even number. A trench group 76 may have any trench number (total count) greater than two or three. FIG. 21C illustrates a trench group 76 having three trenches 74, and FIG. 24 illustrates an example trench group 76 having 11 trenches 74. The outmost trenches 74-O, inner trenches 74-I, and middle trenches 74M are marked. In the example shown in FIG. 21C, the single inner trench 74-I in the middle of trench group 76 is also the middle trench 74-M.

Referring back to FIG. 21C (and also shown in FIG. 24), the middle trench 74-M has depth D1, and the outmost trenches 74-O have depth D2 greater than depth D1. In accordance with some embodiments, the depth ratio D2/D1 is greater than 1, and may be in the range between about 1 and about 2. The depth ratio D2/D1 may also be in the range between about 1.2 and about 2, or between about 1.5 and about 2. Furthermore, the middle trench 74-M has width W1, and the outmost trenches 74-O have width W2 greater than width W1. The widths W1 and W2 may be measured, for example, at the middle height of dielectric regions 37 or STI regions 30. In accordance with some embodiments, the width ratio W2/W1 is greater than 1, and may be in the range between about 1 and about 1.5. The width ratio W2/W1 may also be in the range between about 1.1 and about 1.5, or between about 1.2 and about 1.5.

In accordance with some embodiments, from an outmost trench 74-O to the middle trench 74-M, the trench depths may be increasingly smaller. Alternatively stated, the outer trenches are increasingly deeper than the respective inner trenches. In accordance with some embodiments, the bottoms of trenches 74 may fit a curve 77, which has a highest point in the middle, and lowest points at the opposite ends. For example, curves 77 are shown in FIGS. 21C and 24 as some examples. It is appreciated that due to process variations, the depths may have variations. The general trend of the depths, however, still holds. The widths of the trenches may also hold the same trend, with the outer trenches 74 having increasingly greater widths than the respective inner trenches 74.

The above-discussed profiles of trenches 74 may be achieved by adjusting process parameters such as the total height H1 of gate stack 50 and hard mask 68, the etching process conditions for forming trenches 74, and the like. In order to achieve deeper outer trenches than inner trenches, charging effect may be utilized and maximized by adjusting process parameters and process conditions, as will be discussed in detail in subsequent paragraphs. In the etching process, plasma is generated. It is appreciated that the etching rate (the reduction in thickness per unit time) is related to the concentration of the plasma (ions of etching gases), and the higher the concentration is, the higher etching rate is achieved. In the etching, hard mask 68 and dummy gate electrode 46 have charges such as electrons accumulated on their surfaces. On the sidewalls of hard mask 68 and dummy gate electrode 46, the accumulated charges attract plasma, causing the concentration of the plasma in outer trenches to be higher than the concentration of the plasma in the respective inner trenches, with the concentration of the plasma in the outmost trenches 74-O to be highest, and the concentration of the plasma in the middle trenches 74-M to be the lowest. The charging effect thus has the effect of increasing the etching rate of outmost trenches 74-O more than the respective inner trench 74-I.

Furthermore, the total height H1 (of hard mask 68 and dummy gate 50) affects the charging effect. When height H1 is higher, the sidewall surfaces of gate stack 50 and hard mask 68 have larger areas to attract more charges, which in turn attracts more plasma for etching to form outer trenches. It has been found that when the height H1 is small, such as smaller than about 50 nm, the outer trenches 74 may be shallower than the respective inner trenches 74 (with depth ratio D2/D1 being smaller than 1). With the increase in the height H1, the outer trenches 74 are increasingly deeper (and wider) than the respective inner trenches. When height H1 is increased to a threshold value, the outer trenches 74 may have the same depth as the respective inner trenches 74, with depth ratio D2/D1 being equal to 1. When the height H1 is further increased to be greater than the threshold value, the outer trenches 74 are deeper than the respective inner trenches 74, with depth ratio D2/D1 being greater than 1, and may be in the range as discussed above.

Since depth ratio D2/D1 is affected by multiple factors, the threshold value of height H1 determining when depth ratio D2/D1 starts to be greater than 1 is also affected by multiple factors. In accordance with some embodiments, the threshold value of height H1 may fall in the range between about 130 nm and about 160 nm, depending on other factors including the combination of the process parameters and process conditions of the etching process.

There are also other factors affecting the charging effect. For example, the frequency of the ICP etcher for generating plasma affects the ability for generating plasma, and higher frequency results in the plasma concentration to be higher, and the concentration difference between outmost trenches and the middle trench to be higher. Accordingly, higher frequencies equal to or higher than 13.56 MHz, or equal to or higher than 27 MHz may be adopted. In accordance with some embodiments, during the etching process, the process chamber may be operated at a pressure in a range between about 3 mTorr and about 150 mTorr, and a temperature in a range between about 20° C. and about 140° C. The RF power generator may be operated to provide source power in a range between about 100 W and about 1,500 W, and the output of the RF power generator is controlled by a pulse signal having a duty cycle in a range between about 20% and 100%. An RF bias power for generating anisotropic effect may be in a range between about 10 W and about 600 W.

Since the etching of gate stack 50 has smaller (if any) effect on depth ratio D2/D1, in accordance with some embodiments, the etching of gate stack 50 may be performed in a first etcher using a lower frequency (such as 13.56 MHz or lower), while the etching of multilayer stacks 22', semiconductor strips 20', and bulk semiconductor substrate 20 may be performed in a second etcher using a higher frequency (such as 27 MHz). This may provide the flexibility in the manufacturing process, and may possible reduce the unnecessary damage to devices caused by high-frequency plasma. In accordance with alternative embodiments, the first etcher and the second etcher have the same frequency, and may be the same etcher or different etchers.

In the etching process for forming trenches 72 and 74, especially for forming trenches 74, there are other factors affecting depth ratio D2/D1. For example, the middle trench 74-M has a greater opening than the outmost trenches 74-O. This is because the middle trench 74-M does not have nearby high sidewalls of gate stacks 50 and hard mask 68. As a comparison, the outmost trench 74-O is blocked from one side by gate stack 50 and hard mask 68, and the opening to plasma is small. The difference in the opening sizes results an opposite trend than the charging effect. Accordingly, the difference in the opening sizes has the opening-size effect of increasing the etching rate of inner trench 74-I to be more than the respective the outmost trenches 74-O.

The final relative etching rates for forming trenches 74 are determined by multiple effects including the charging effect, and the opening-size effect. Process parameters and process conditions are thus adjusted to ensure that the charging effect overcomes the opening-size effect. For example, as discussed above, the height H1 and the frequency of the ICP may be increased to increase the depth ratio D2/D1 to the desirable range.

It is, however, difficult to provide a universal fixed height H1 and a fixed frequency to achieve the desirable depth ratio D2/D1. For example, with the proceeding of the etching process, the height H1 reduces gradually due to the consumption of the hard mask 68. The hard mask 68 may be reduced from 80 nm to 35 nm in some experiments. The widths of trenches 74, the pitches of trenches 74, the structure of the wafer such as whether high-k dielectric regions 38 are formed or not, and the like, all affect the depth ratio D2/D1, and it is the combination of these factors affecting the trench profiles. In accordance with some embodiments, experiments may be performed, and the structure of the wafer is determined. Sample wafers may then be formed, with the sample wafers having different heights H1 and/or different frequencies in different combinations. Accordingly, the different sample wafers will have different trench profiles and different ratios D2/D1, and the wafer having the desirable trench profile and desirable ratio D2/D1 may be selected, and the corresponding process parameter (such as height H1 and the structures) and process conditions (such as the frequency of the etchers) are used for the mass production of wafers.

Figure 22A:
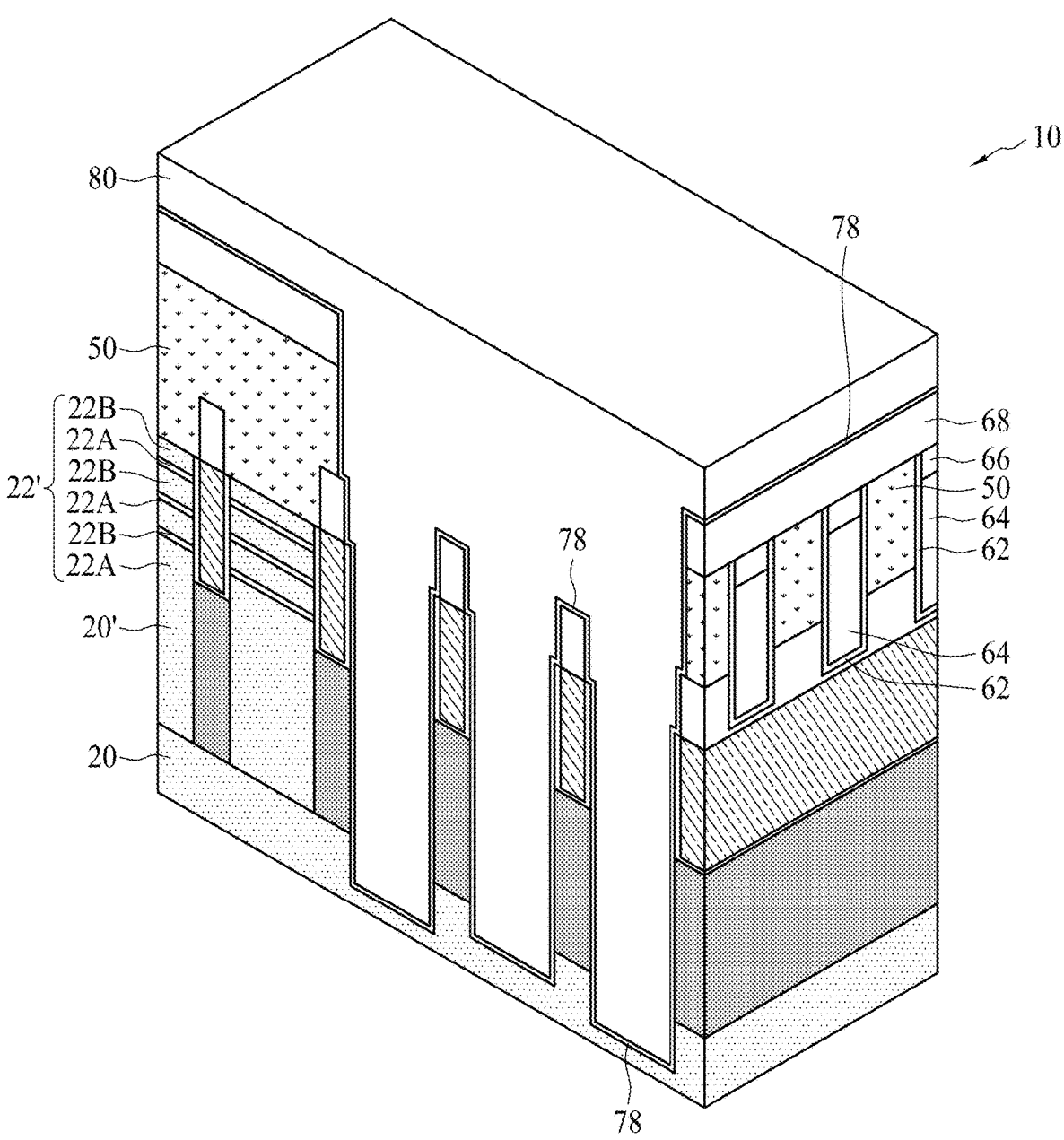
Figures 22B, 22C:
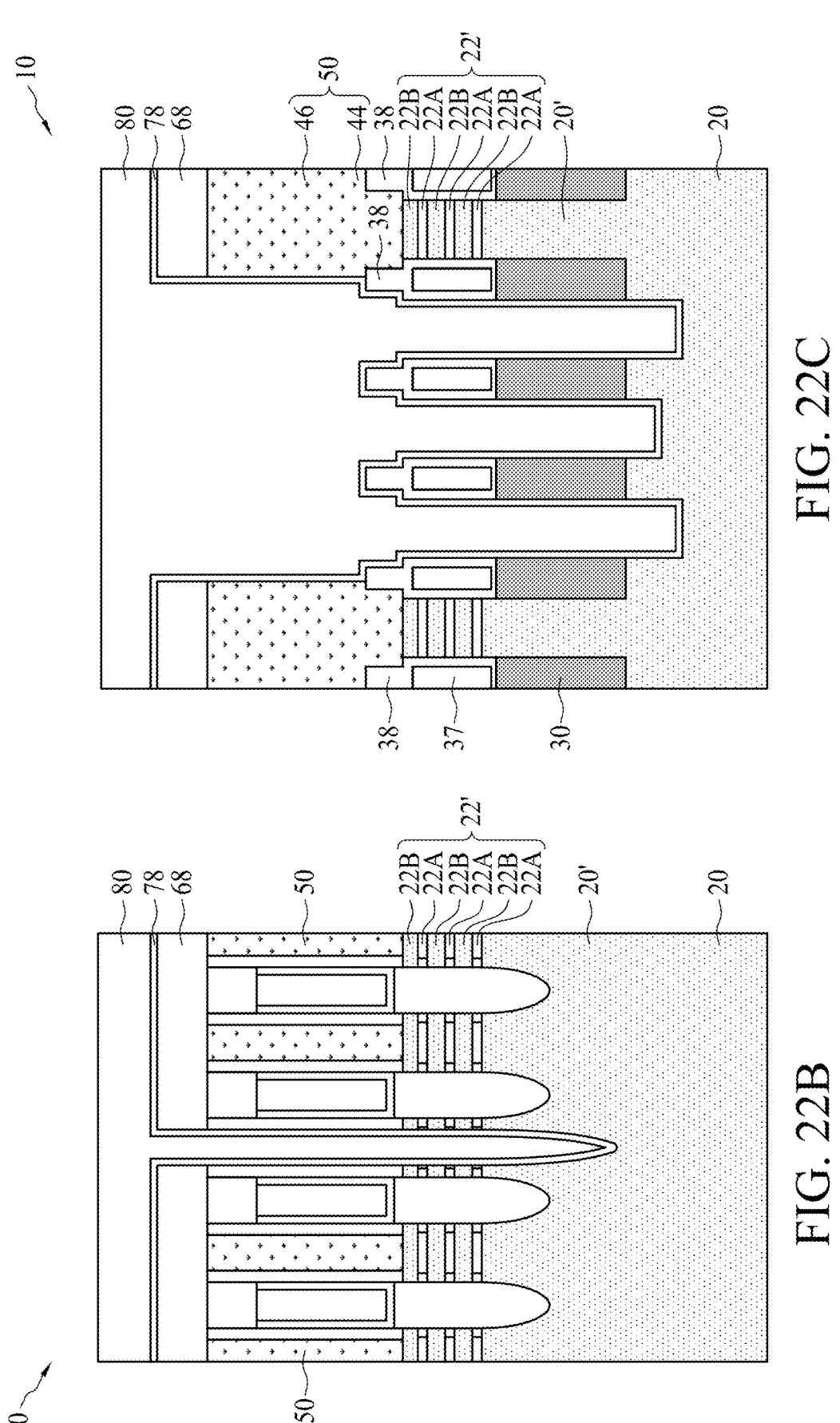

FIGS. 22A, 22B, and 22C illustrate the deposition process to fill trenches 74 and 72 with dielectric layers. In accordance with some embodiments, the deposited dielectric layers include dielectric liner 78 and dielectric layer 80. Dielectric liner 78 may be formed of or comprise silicon oxide. Dielectric layer 80 may be formed of or comprise silicon nitride. Other materials such as SiC, SiON, SiCN, SiOCN, or the like may also be used to form the dielectric layers.

Figure 23A:
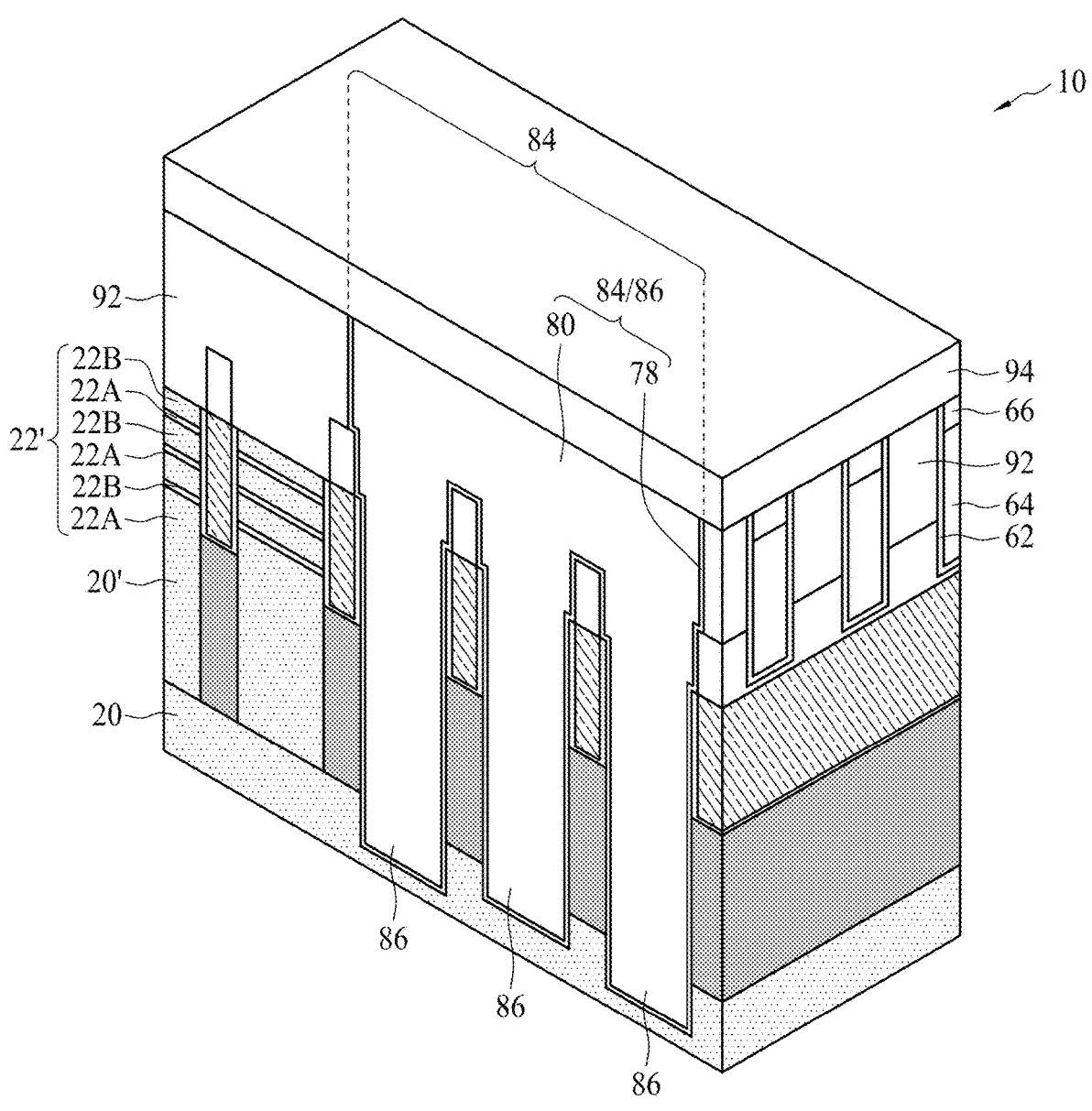
Figures 23B, 23C:
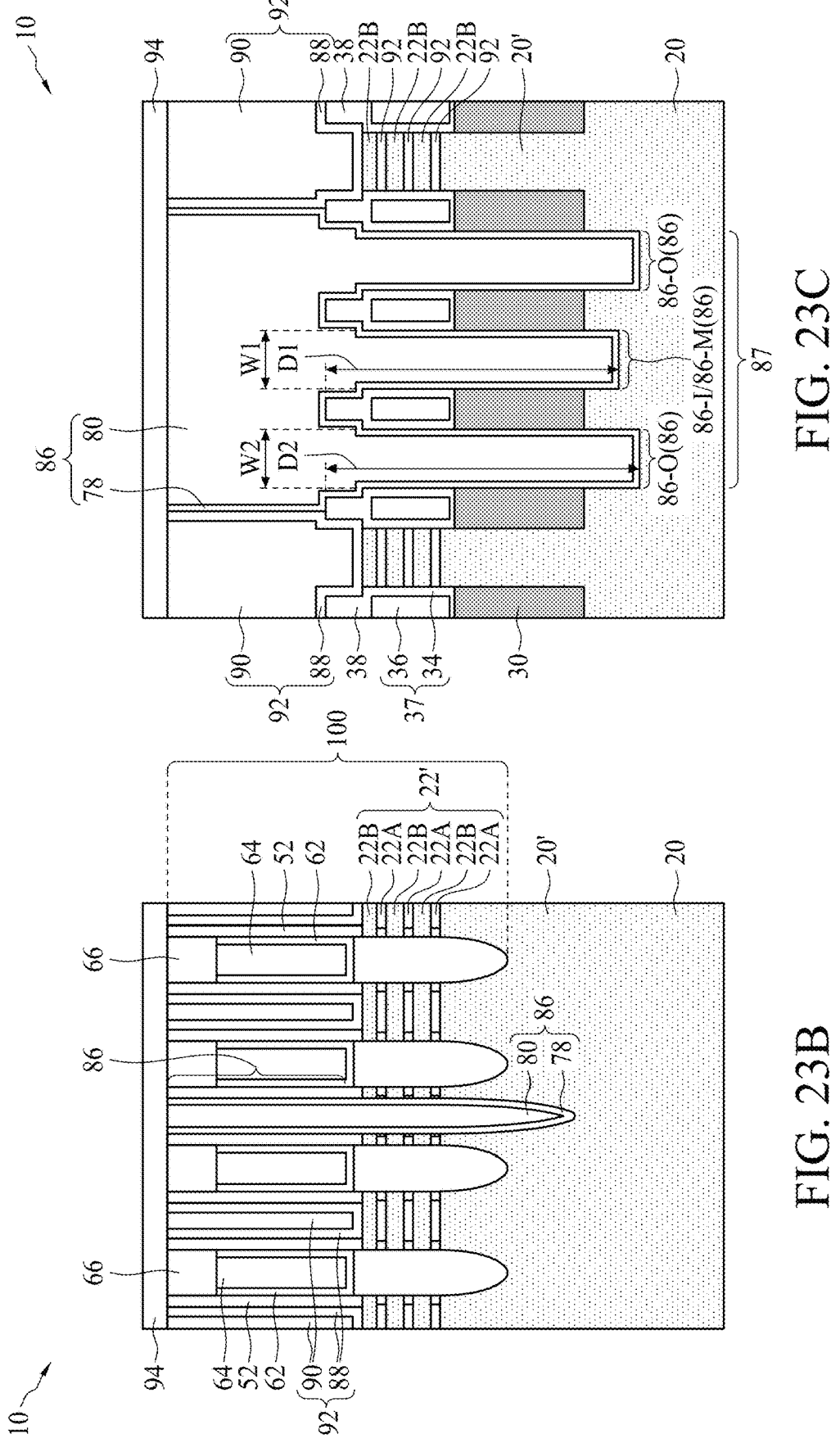

In subsequent processes, the excess portions of dielectric liner 78 and dielectric layer 80 over gate stack 50 are removed, for example, through a planarization process such as a mechanical polishing process or a CMP process. The remaining portions of dielectric liner 78 and dielectric layer 80 include isolation region 84, which is in gate stack 50, and isolation regions 86 underlying and joined to isolation region 84. Isolation regions 86 collectively form isolation region group 87. The respective process is illustrated as process 238 in the process flow 200 as shown in FIG. 29. The resulting structure is shown in FIGS. 23A, 23B, and 23C. Similar to trenches 74, isolation regions 86 also include outmost isolation regions 86-O and inner isolation regions 86-I, wherein inner isolation regions 86-I further include middle isolation regions 86-M in the middle. Since isolation regions 86 fills the trenches 74, isolation regions 86 have the same profiles as trenches 74. For example, the depths (including depth D1 and D2), widths (including widths W1 and W2), etc., are the same as that of trenches 74.

As shown in FIG. 23C, forming outmost isolation regions 86-O to be deeper than inner isolation regions 86-I may significantly reduce the leakage current from the neighboring transistors into the bulk portion of semiconductor substrate 20. Also, the leakage current between the transistors on the opposite sides of the isolation region group may also be significantly reduced.

As also shown in FIG. 23B, gate stacks 50 (FIG. 22B), which are dummy gate stacks, are then replaced with replacement gate stacks 92, which include gate dielectrics 88 and gate electrodes 90. The respective process is illustrated as process 240 in the process flow 200 as shown in FIG. 29. The replacement process may include etching dummy gate stack 50 and sacrificially layers 22A to form gaps, and forming replacement gate stack 92 in the gaps. Gate dielectrics 88 may include high-k dielectric materials such as hafnium oxide, lanthanum oxide, or the like. Gate electrodes 90 may include metal gate electrodes. A dielectric layer 94, which may include an etch stop layer, is formed over and contacting gate stacks 88 and isolation regions 86. Nanostructures 22B act as the channel regions of the resulting GAA transistor 100.

Figure 26A:
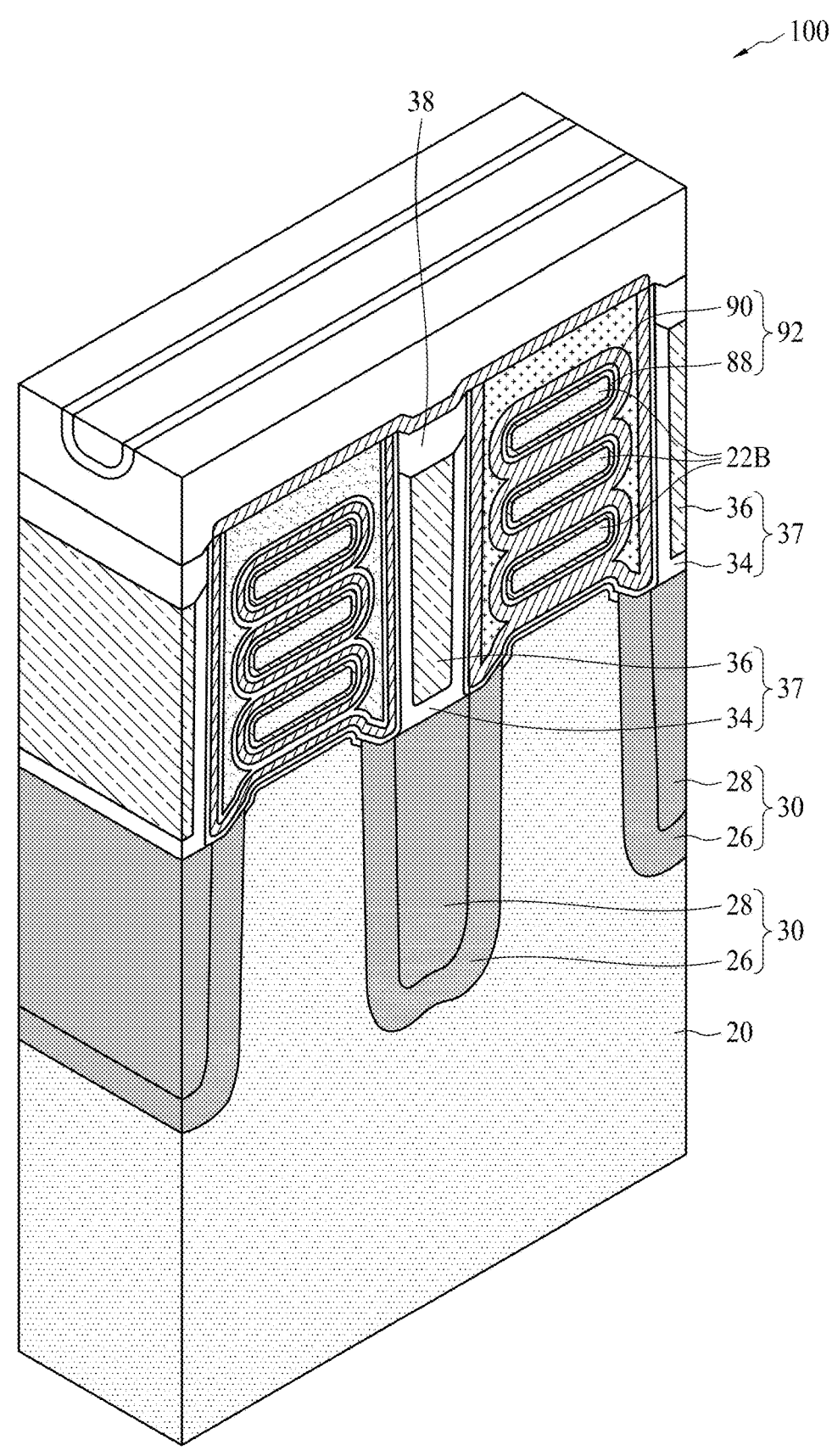
FIGS. 26A, 26B, and 26C illustrate a perspective view and cross-sectional views of a GAA transistor in accordance with some embodiments.
Figure 26C:
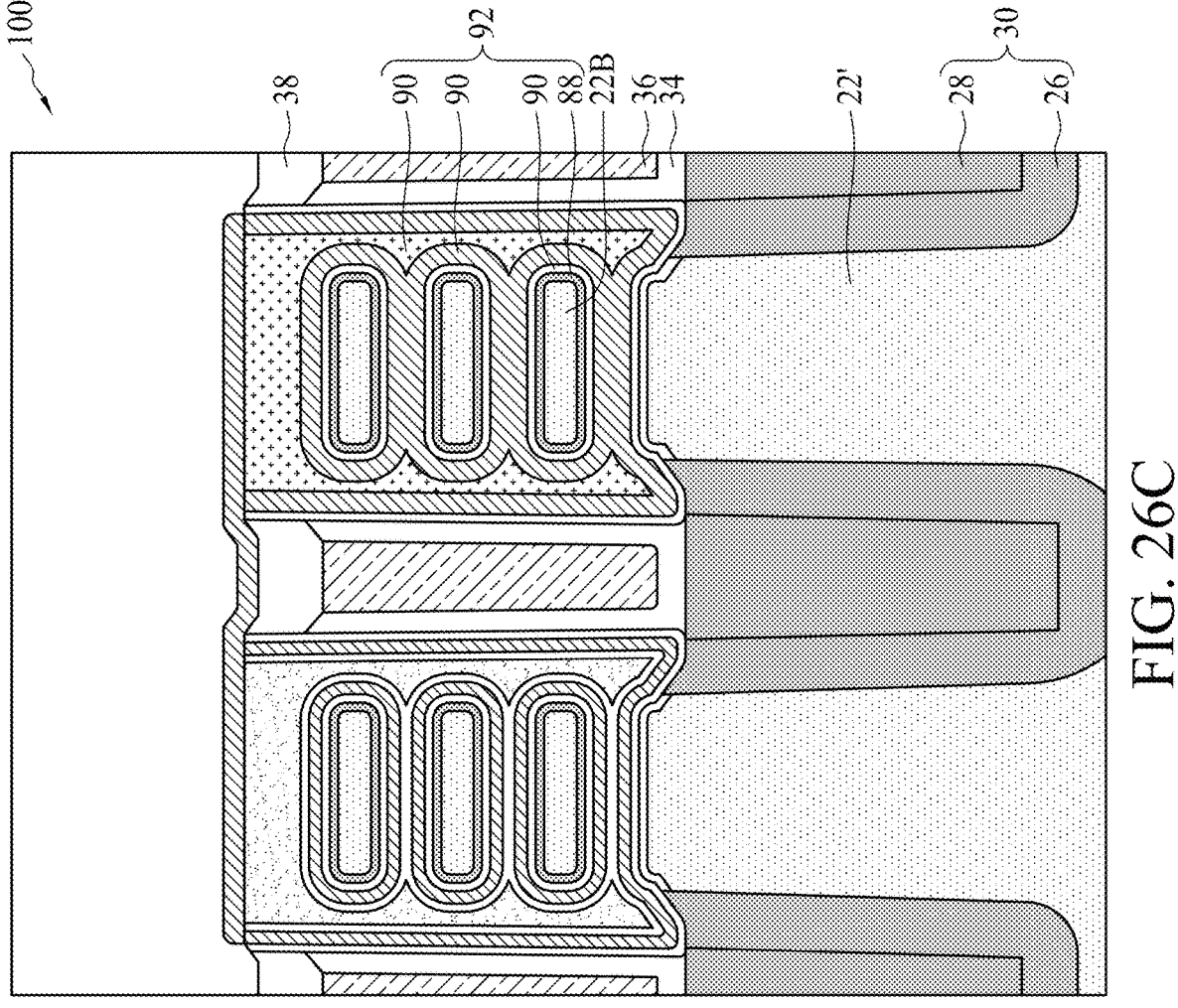

FIGS. 26A, 26B, and 26C illustrate the resulting GAA transistor 100, with some features of the transistor 100 being marked. Isolation regions 86 are not shown, and may be on both of the left side and right side of transistor 100 as shown in FIG. 26C. For example, isolation regions 86 may be on the immediate right side of the rightmost STI region 30 and the immediate left side of the leftmost STI region 30, with the rightmost STI region 30 and the leftmost STI region 30 being shown partially.

Figure 28:
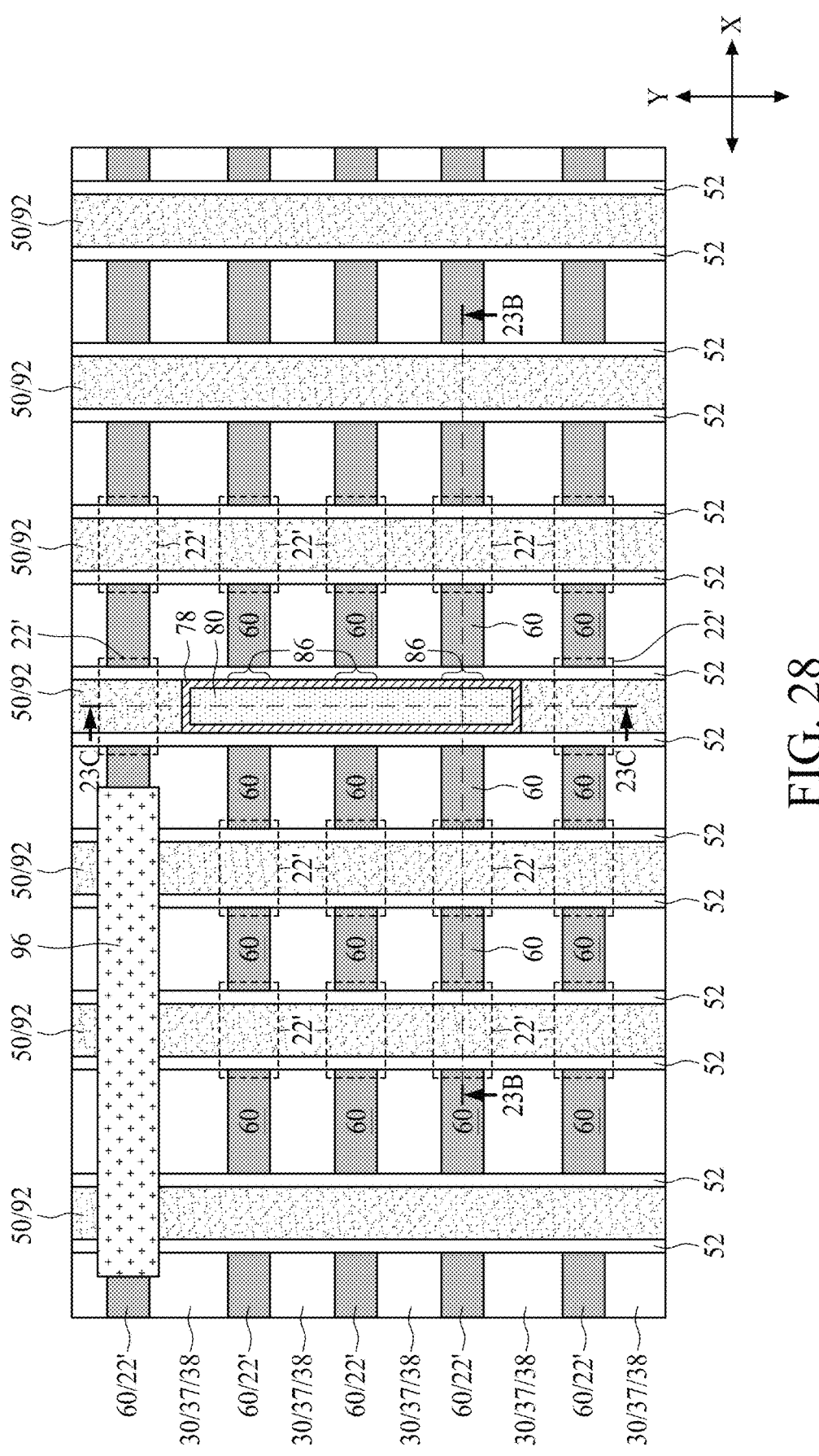

FIG. 28 illustrates a top view the structure shown in FIGS. 23A, 23B, and 23C, wherein the cross-sectional view shown in FIG. 23B is obtained from the plane 23B-23B in FIG. 28, and the cross-sectional view shown in FIG. 23C is obtained from the plane 23C-23C in FIG. 28. In FIG. 28, an example gate isolation region 96 (which may be referred to as a Cut-Metal-Gate (CMG) region) is also shown in accordance with some embodiments. The formation process of gate isolation region 96 may include performing an etching process to form a recess, which separate an otherwise long gate stack 50/92 into shorter portions, and filling the corresponding recesses with dielectric materials such as silicon oxide, silicon nitride, or multilayers thereof.

The embodiments of the present disclosure have some advantageous features. By forming outmost isolation regions in an isolation region group to extend deeper into the underlying bulk portion of semiconductor substrate than inner isolation regions, the leakage current is better blocked by the deeper outmost isolation regions.

In accordance with some embodiments, a method comprises forming a plurality of semiconductor structures over a semiconductor substrate; forming a dummy gate stack on top surfaces and sidewalls of the plurality of semiconductor structures; forming gate spacers on sidewalls of the dummy gate stack; etching a first portion of the dummy gate stack to form a through-gate trench in the dummy gate stack, wherein the dummy gate stack comprises a second portion and a third portion on opposing sides of the first portion; and through the through-gate trench, etching the plurality of semiconductor structures to form a trench group underlying and connected to the through-gate trench, wherein the trench group comprises two outmost trenches, and at least one inner trench between the two outmost trenches, and wherein the two outmost trenches are deeper than the at least one inner trench.

In an embodiment, the two outmost trenches and the at least one inner trench are formed by same etching processes. In an embodiment, the method further comprises forming a plurality of shallow trench isolation regions extending into the semiconductor substrate, wherein the plurality of semiconductor structures are separated from each other by the plurality of shallow trench isolation regions. In an embodiment, the method further comprises forming a plurality of high-k dielectric regions overlapping the plurality of shallow trench isolation regions, wherein the plurality of high-k dielectric regions remain after the trench group is formed. In an embodiment, the etching the plurality of semiconductor structures comprises generating plasma from etching gases, and wherein the plasma is generated using an RF source having a frequency equal to about 27 MHz.

In an embodiment, bottoms of trenches in the trench group fit a curve, with two ends of the curve being lowest, and from the two outmost trenches to a middle trench in middle of the two outmost trenches, bottoms of the trenches increase in height gradually. In an embodiment, the two outmost trenches have a first depth measured from a bottom of the through-gate trench, and a middle trench in middle of the two outmost trenches has a second depth measured from the bottom of the through-gate trench, and wherein a depth ratio of the first depth to the second depth is greater than about 1.2. In an embodiment, the depth ratio is in a range between about 1.2 and about 2.

In an embodiment, each of the plurality of semiconductor structures comprises a plurality of sacrificial layers formed of a first material, and a plurality of nanostructures formed of a second material different from the first material, and wherein the plurality of sacrificial layers and the plurality of nanostructures are allocated alternatingly. In an embodiment, the method further comprises forming an additional dummy gate stack on the top surfaces and the sidewalls of the plurality of semiconductor structures; and forming a replacement gate stack to replace the additional dummy gate stack and portions of the plurality of sacrificial layers directly underlying the additional dummy gate stack.

In accordance with some embodiments, a structure comprises a semiconductor substrate; a plurality of dielectric strips over a bulk portion of the semiconductor substrate; a plurality of semiconductor structures protruding higher than the bulk portion of the semiconductor substrate, wherein the plurality of semiconductor structures are separated from each other by the plurality of dielectric strips; a gate stack on top surfaces and sidewalls of the plurality of semiconductor structures; and an isolation region having a first lengthwise direction parallel to a second lengthwise direction of the gate stack, wherein the isolation region comprises a through-gate isolation region in the gate stack; and a plurality of isolation regions underlying and joined to the through-gate isolation region, wherein the plurality of isolation regions comprise two outmost isolation regions, and at least one isolation region between the two outmost isolation regions, and wherein the two outmost isolation regions are deeper than the at least one isolation region.

In an embodiment, the plurality of dielectric strips comprise a plurality of shallow trench isolation regions extending into the semiconductor substrate. In an embodiment, the plurality of dielectric strips further comprise a plurality of high-k dielectric regions overlapping the plurality of shallow trench isolation regions. In an embodiment, bottoms of the plurality of isolation regions fit a curve, with two ends of the curve being lowest, and from the two outmost isolation regions to a middle isolation region in middle of the two outmost isolation regions, bottoms of the isolation regions increase in height gradually.

In an embodiment, the two outmost isolation regions have a first depth measured from a bottom of the through-gate isolation region, and a middle isolation region in middle of the two outmost isolation regions has a second depth measured from the bottom of the through-gate isolation region, and wherein a depth ratio of the first depth to the second depth is greater than about 1.2. In an embodiment, each of the plurality of semiconductor structures comprises a plurality of nanostructures vertically stacked and separated from each other, and wherein the gate stack extends between the plurality of nano structures.

In accordance with some embodiments, a structure comprises a bulk semiconductor substrate; a plurality of nanostructures over the bulk semiconductor substrate; a gate stack comprising an upper portion overlapping the plurality of nanostructures, and lower portions extending between the plurality of nanostructures; and an isolation structure comprising a first edge contacting a second edge of the gate stack, wherein the isolation structure comprises an upper isolation region; and a plurality of lower isolation regions underlying and joined to the upper isolation region, wherein the plurality of lower isolation regions comprise a first outmost isolation region; and a plurality of inner isolation regions spaced apart from the plurality of nanostructures by the first outmost isolation region, wherein the first outmost isolation region has a height greater than heights of the plurality of inner isolation regions.

In an embodiment, the plurality of lower isolation regions have a uniform pitch. In an embodiment, the lower isolation regions further comprise a second outmost isolation region, with the plurality of inner isolation regions being between the first outmost isolation region and the second outmost isolation region, and wherein both of the first outmost isolation region and the second outmost isolation region extend into the bulk semiconductor substrate deeper than the plurality of inner isolation regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a plurality of semiconductor structures over a semiconductor substrate;
   forming a dummy gate stack on top surfaces and sidewalls of the plurality of semiconductor structures;
   forming gate spacers on sidewalls of the dummy gate stack;
   etching a first portion of the dummy gate stack to form a through-gate trench in the dummy gate stack, wherein the dummy gate stack comprises a second portion and a third portion on opposing sides of the first portion; and
   through the through-gate trench, etching the plurality of semiconductor structures to form a trench group underlying and connected to the through-gate trench, wherein the trench group comprises two outmost trenches, and at least one inner trench between the two outmost trenches, and wherein the two outmost trenches are deeper than the at least one inner trench.

2. The method of claim 1, wherein the two outmost trenches and the at least one inner trench are formed by same etching processes.

3. The method of claim 1 further comprising forming a plurality of shallow trench isolation regions extending into the semiconductor substrate, wherein the plurality of semiconductor structures are separated from each other by the plurality of shallow trench isolation regions.

4. The method of claim 3 further comprising forming a plurality of high-k dielectric regions overlapping the plurality of shallow trench isolation regions, wherein the plurality of high-k dielectric regions remain after the trench group is formed.

5. The method of claim 1 further comprising forming a patterned hard mask over the dummy gate stack, wherein the dummy gate stack is etched using the patterned hard mask as an etching mask, and wherein a height measured from a top surface of the patterned hard mask to a bottom surface of the dummy gate stack is greater than about 130 nm.

6. The method of claim 1, wherein the etching the plurality of semiconductor structures comprises generating plasma from etching gases, and wherein the plasma is generated using a Radio-Frequency (RF) source having a frequency equal to about 27 MHz.

7. The method of claim 1, wherein bottoms of trenches in the trench group fit a curve, with two ends of the curve being lowest, and from the two outmost trenches to a middle trench in middle of the two outmost trenches, bottoms of the trenches increase in height gradually.

8. The method of claim 1, wherein the two outmost trenches have a first depth measured from a bottom of the through-gate trench, and a middle trench in middle of the two outmost trenches has a second depth measured from the bottom of the through-gate trench, and wherein a depth ratio of the first depth to the second depth is greater than about 1.2.

9. The method of claim 8, wherein the depth ratio is in a range between about 1.2 and about 2.

10. The method of claim 1, wherein each of the plurality of semiconductor structures comprises a plurality of sacrificial layers formed of a first material, and a plurality of nanostructures formed of a second material different from the first material, and wherein the plurality of sacrificial layers and the plurality of nanostructures are allocated alternatingly.

11. The method of claim 10 further comprising:

forming an additional dummy gate stack on the top surfaces and the sidewalls of the plurality of semiconductor structures; and forming a replacement gate stack to replace the additional dummy gate stack and portions of the plurality of sacrificial layers directly underlying the additional dummy gate stack.

12. A method comprising:

forming a plurality of dielectric strips over a bulk portion of a semiconductor substrate;

forming a plurality of semiconductor structures protruding higher than the bulk portion of the semiconductor substrate, wherein the plurality of semiconductor structures are separated from each other by the plurality of dielectric strips;

forming a gate stack on top surfaces and sidewalls of the plurality of semiconductor structures; and performing a deposition process and a planarization process to form an isolation region having a first lengthwise direction parallel to a second lengthwise direction of the gate stack, wherein the isolation region comprises:

a through-gate isolation region in the gate stack; and a plurality of isolation regions underlying and joined to the through-gate isolation region, wherein the plurality of isolation regions are laterally spaced apart from each other by shallow trench isolation regions, wherein the plurality of isolation regions comprise two outmost isolation regions, and at least one isolation region between the two outmost isolation regions, and wherein the two outmost isolation regions are deeper than the at least one isolation region.

13. The method of claim 12, wherein the plurality of dielectric strips comprise a plurality of shallow trench isolation regions extending into the semiconductor substrate.

14. The method of claim 13, wherein the plurality of dielectric strips further comprise a plurality of high-k dielectric regions overlapping the plurality of shallow trench isolation regions.

15. The method of claim 12, wherein bottoms of the plurality of isolation regions fit a curve, with two ends of the curve being lowest, and from the two outmost isolation regions to a middle isolation region in middle of the two outmost isolation regions, bottoms of the isolation regions increase in height gradually.

16. The method of claim 12, wherein the two outmost isolation regions have a first depth measured from a bottom of the through-gate isolation region, and a middle isolation region in middle of the two outmost isolation regions has a second depth measured from the bottom of the through-gate isolation region, and wherein a depth ratio of the first depth to the second depth is greater than about 1.2.

17. The method of claim 12, wherein each of the plurality of semiconductor structures comprises a plurality of nanostructures vertically stacked and separated from each other, and wherein the gate stack extends between the plurality of nanostructures.

18. A method comprising:

forming a plurality of nanostructures over a bulk semiconductor substrate;

forming a gate stack comprising an upper portion overlapping the plurality of nanostructures, and lower portions extending between the plurality of nanostructures; and forming an isolation structure comprising a first edge contacting a second edge of the gate stack, wherein the isolation structure comprises:

an upper isolation region; and a plurality of lower isolation regions underlying and joined to the upper isolation region, wherein the plurality of lower isolation regions comprise:

a first outmost isolation region;

a second outmost isolation region; and a plurality of inner isolation regions between the first outmost isolation region and the second outmost isolation region, wherein the plurality of inner isolation regions are spaced apart from the plurality of nanostructures by the first outmost isolation region, and wherein the first outmost isolation region has a height greater than heights of the plurality of inner isolation regions, and wherein both of the first outmost isolation region and the second outmost isolation region extend into the bulk semiconductor substrate deeper than the plurality of inner isolation regions.

19. The method of claim 18, wherein the plurality of lower isolation regions have a uniform pitch.

20. The method of claim 18, wherein the first outmost isolation region is laterally spaced apart from a nearest one of the plurality of inner isolation regions by a shallow trench isolation region.

* * * * *